(12) United States Patent
Hou et al.

(10) Patent No.: US 7,970,565 B2
(45) Date of Patent: Jun. 28, 2011

(54) MEASURING DEVICE, TEST DEVICE, ELECTRONIC DEVICE, PROGRAM, AND RECORDING MEDIUM

(75) Inventors: Harry Hou, Santa Clara, CA (US); Takahiro Yamaguchi, Tokyo (JP)

(73) Assignee: Advantest Corporation, Tokyo (JP)

( * ) Notice: Subject to any disclaimer, the term of this patent is extended or adjusted under 35 U.S.C. 154(b) by 419 days.

(21) Appl. No.: 12/198,096

(22) Filed: Aug. 25, 2008

(65) Prior Publication Data

US 2009/0234604 A1    Sep. 17, 2009

Related U.S. Application Data

(63) Continuation of application No. PCT/JP2007/053682, filed on Feb. 27, 2007, which is a continuation-in-part of application No. 11/623,101, filed on Jan. 15, 2007, now Pat. No. 7,856,330, which is a continuation-in-part of application No. 11/550,811, filed on Oct. 19, 2006, now Pat. No. 7,421,355, which is a continuation-in-part of application No. 11/362,536, filed on Feb. 27, 2006, now Pat. No. 7,398,169.

(51) Int. Cl.
*G06F 19/00* (2011.01)

(52) U.S. Cl. ........... 702/69; 702/66; 702/71; 702/82; 324/121 R; 324/532; 324/750.01

(58) Field of Classification Search .......... 324/532, 324/736, 158.1, 121 R, 750.01; 702/69–71, 702/66, 82
See application file for complete search history.

(56) References Cited

U.S. PATENT DOCUMENTS

2005/0069031 A1    3/2005    Sunter et al.
2005/0243950 A1    11/2005    Laquai et al.

FOREIGN PATENT DOCUMENTS

| JP | 10-288653 | 10/1998 |
| JP | 2004-93345 | 3/2004 |
| JP | 2004-125552 | 4/2004 |

OTHER PUBLICATIONS

Article titled "Jitter Measurements for CLK Generators or Synthesizers"(online), Maxim Integrated Products, Sep. 26, 2003.

*Primary Examiner* — Drew A Dunn
*Assistant Examiner* — Hien X Vo
(74) *Attorney, Agent, or Firm* — Jianq Chyun IP Office

(57) ABSTRACT

A measurement apparatus that measures a signal under measurement, including a strobe timing generator that sequentially generates strobes arranged at substantially even time intervals, a level comparing section that detects a signal level of the signal under measurement at a timing of each sequentially provided strobe, a capture memory that stores therein a data sequence of the signal levels sequentially detected by the level comparing section, a frequency domain converting section that converts the data sequence into a spectrum in the frequency domain, and a jitter calculating section that calculates jitter of the signal under measurement based on a value obtained by integrating levels of frequency components in a predetermined frequency range of the spectrum.

18 Claims, 50 Drawing Sheets

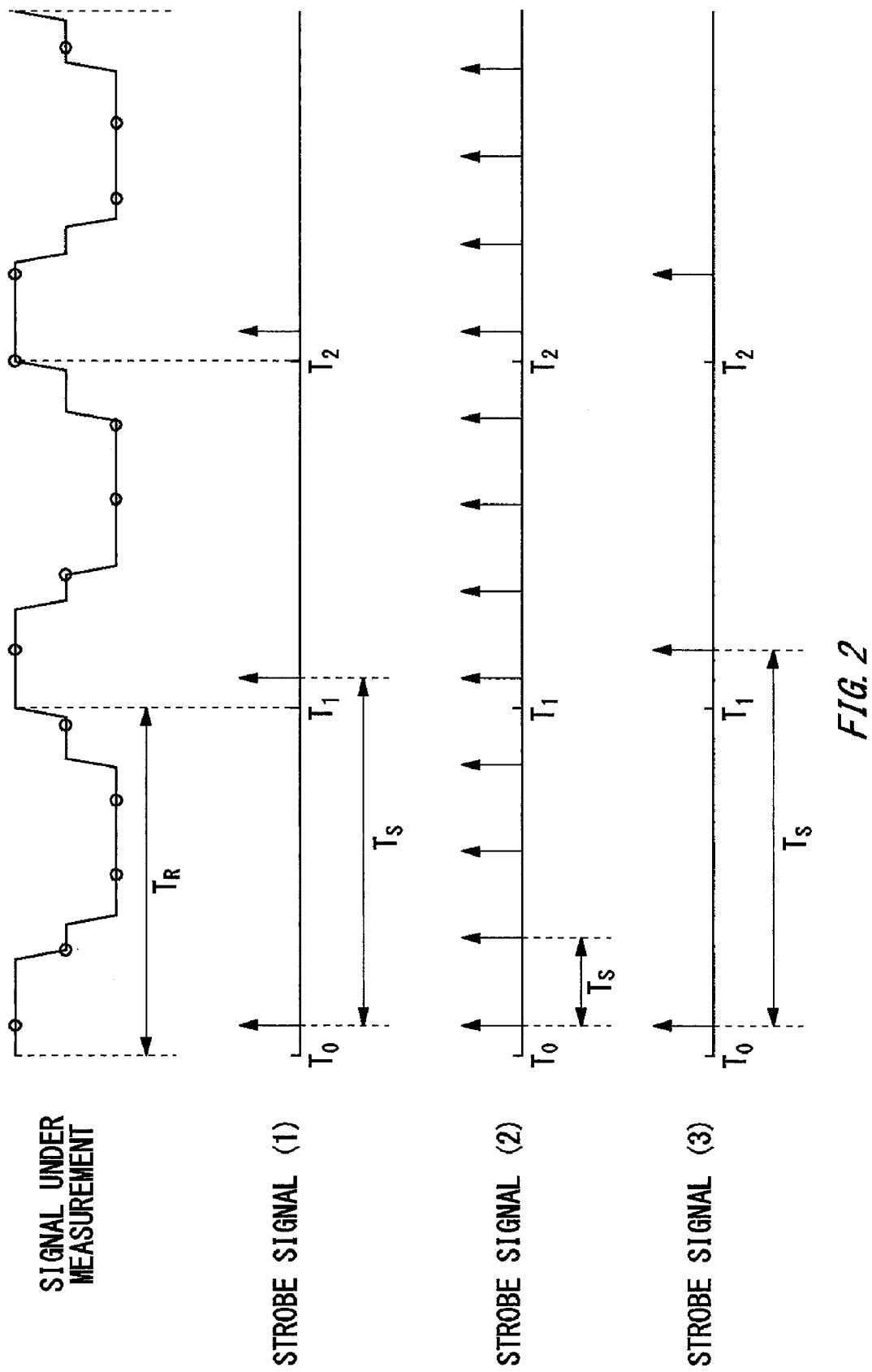

| Rate | Spectrum Analyzer | MEASUREMENT APPARATUS 10 | Oscilloscope | <f_J [MHz] |
|---|---|---|---|---|
| 1.5 Gbps | 1.46 ps$_{RMS}$ | 1.54 ps$_{RMS}$ | | 5.0 |
| | | 4.33 ps$_{RMS}$ | | |
| | | 4.45 ps$_{RMS}$ | 4.32 ps$_{RMS}$ | 2.5 |

FIG. 20

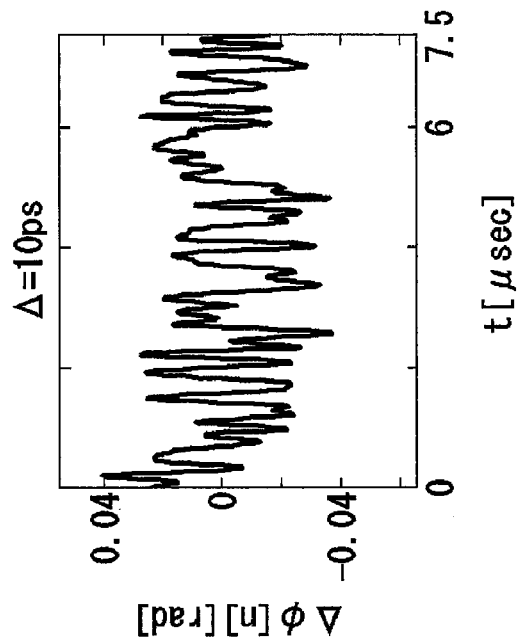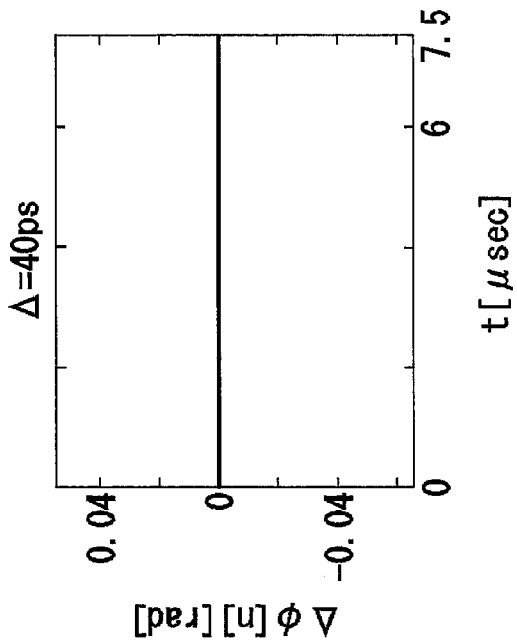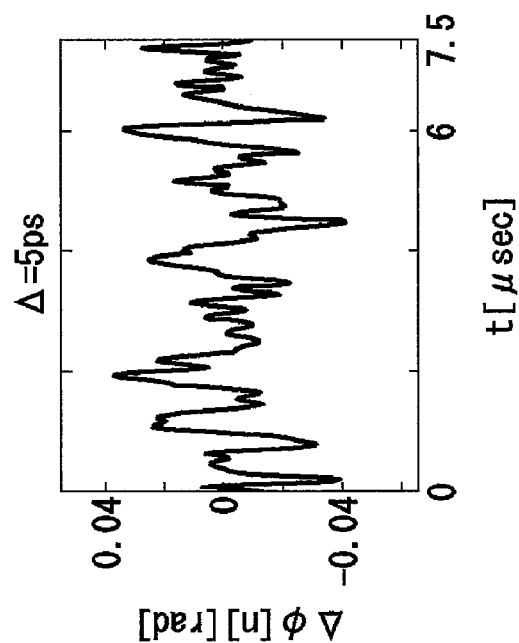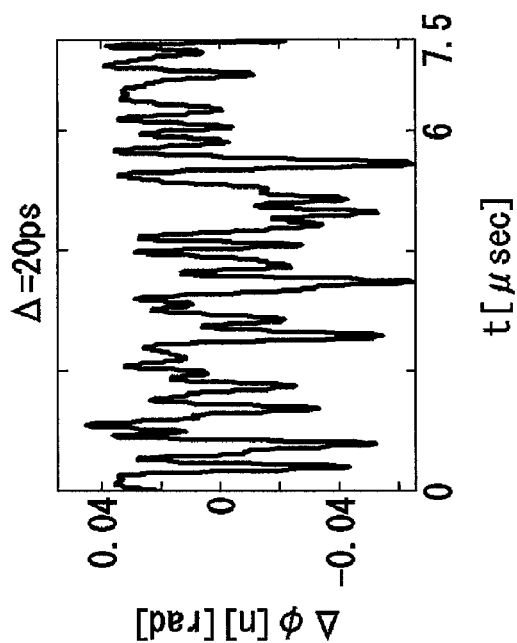
FIG. 30

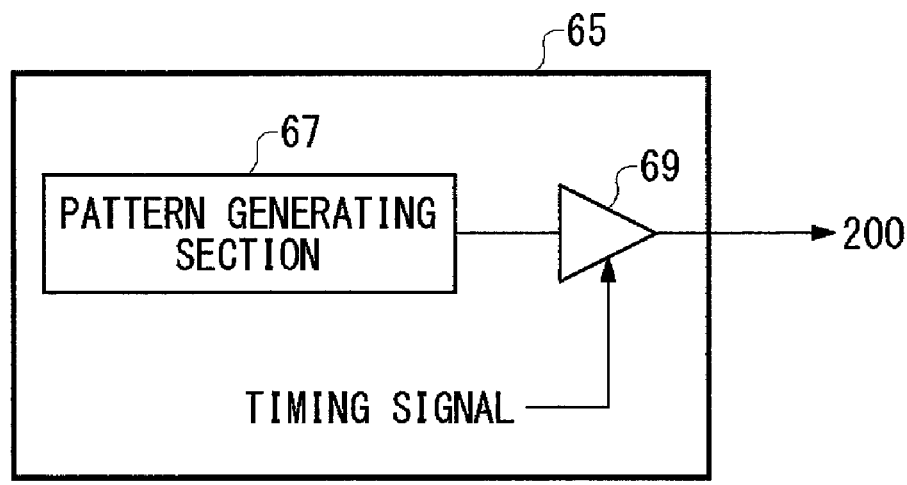
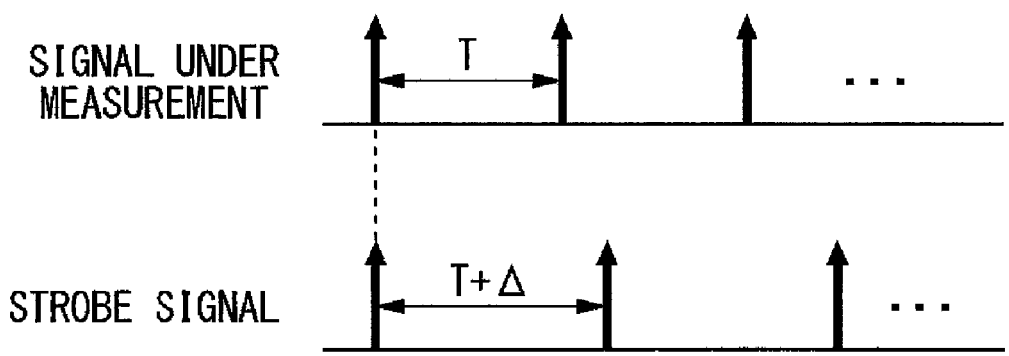
FIG. 35

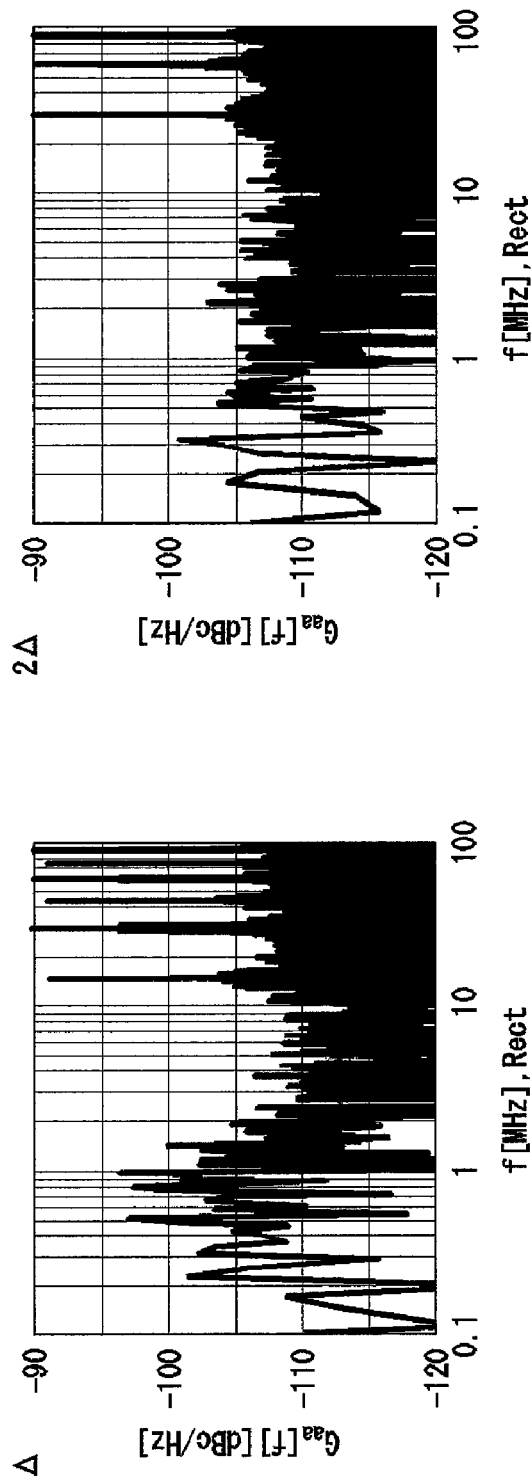
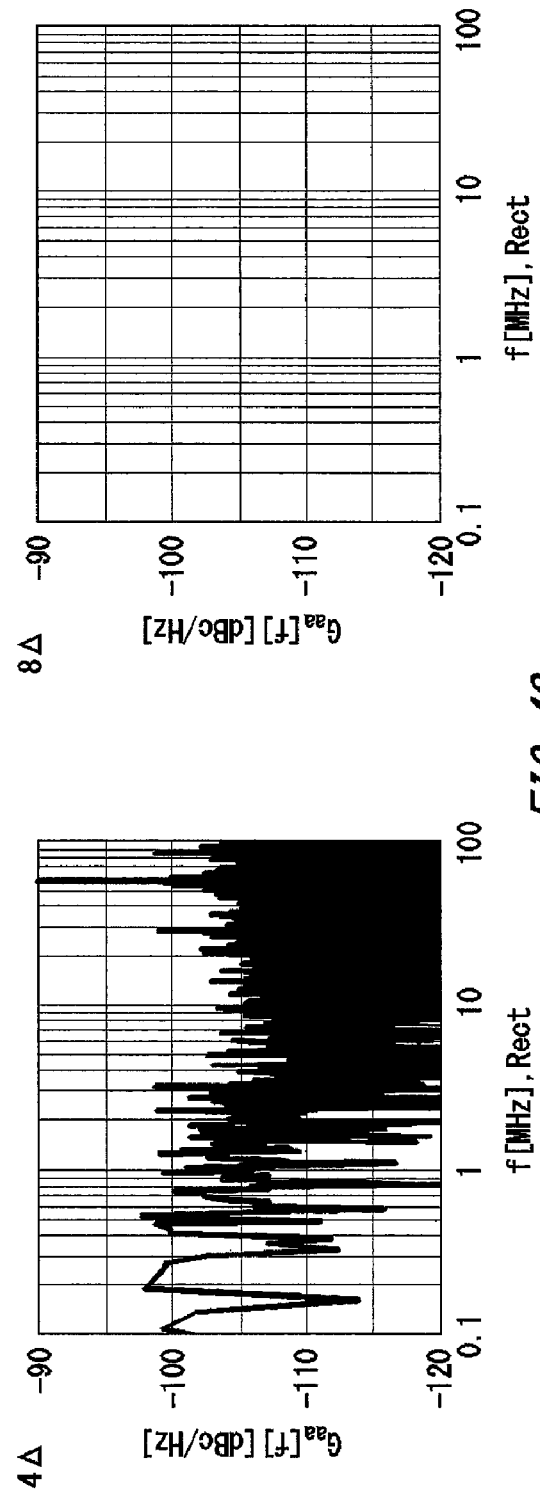
FIG. 48

US 7,970,565 B2

MEASURING DEVICE, TEST DEVICE, ELECTRONIC DEVICE, PROGRAM, AND RECORDING MEDIUM

This is a continuation application of PCT/JP2007/053682 filed on Feb. 27, 2007 which is a continuation in-part application of Ser. No. 11/623,101 filed on Jan. 15, 2007, and which also claims priority from Non-provisional application Ser. Nos. 11/362,536 filed on Feb. 27, 2006, and 11/550,811 filed on Oct. 19, 2006, the contents of which are incorporated herein by reference.

BACKGROUND

1. Technical Field

The present invention relates to a measurement apparatus that measures a signal under measurement, a test apparatus that tests a device under test, an electronic device, a program used by the measurement apparatus, and a recording medium storing thereon the program. More specifically, the present invention relates to a measurement apparatus that measures jitter in a signal under measurement output by a device under test.

2. Related Art

A known test of an electronic device involves measuring jitter in a signal under measurement output by the electronic device such as a semiconductor circuit. For example, jitter of such a signal under measurement is measured by a time interval analyzer, an oscilloscope, or the like by inputting the signal under measurement thereto. The time interval analyzer or the like allows such jitter to be calculated by measuring phase errors of edges of the signal under measurement.

Another known method for testing the electronic device is a function test for judging whether or not a pattern of a signal under measurement output by an electronic device matches a pattern of expected logic values. In this test, a test apparatus detects or converts a data pattern of the signal under measurement by comparing a voltage value of the signal under measurement output by the electronic device with a reference voltage when a predetermined test pattern is applied to the electronic device. The test apparatus then judges whether or not the data pattern matches the expected pattern.

It is therefore necessary to prepare the apparatus for measuring jitter and the apparatus for testing function in order to carry out the jitter test in addition to function tests as described above. Therefore, it has been costly to carry out the jitter test.

The apparatus for testing function compares the voltage value of the signal under measurement with the reference voltage at a preset timing. Therefore, it can detect the edges of the signal under measurement by shifting the strobe timing. The apparatus for testing function gives timing information each time the logic value of the signal under measurement transitions. It is then possible to measure the jitter by utilizing this capability, i.e., by using the apparatus for performing function testing.

However, the conventional apparatus for function testing is what sets sampling timing in a test rate synchronized with a period of the signal under measurement. Therefore, it is necessary to set a phase of the sampling timing for each test rate in order to gradually shift the relative phase of the sampling timing with respect to the signal under measurement within each test rate.

Thus it takes undesirably long test time to perform the jitter test by stepping the strobe timings. Furthermore, the measurement accuracy is unsuitable for the test because the timing is shifted according to the relative phase. It is therefore the objective of an aspect of the invention to determine a sampling timing that enables efficient and accurate measurement of jitter of the signal under measurement when an apparatus for function testing is used to sample the signal under measurement.

Since no method for determining this sampling timing is known, it is impossible to determine how measurement data should be processed to efficiently and accurately measure a characteristic of the signal under measurement, such as jitter, when measurement data is acquired that includes information concerning the jitter of the signal under measurement.

A case in which the length of the acquired data is not an integer multiple of a period of the signal under measurement is also considered. Furthermore, when a Fourier transform is performed to process the measurement data in the frequency domain, performing the Fourier transform by multiplying the measurement data by a window function is considered. However, since this amplitude of this measurement data is modulated by the window function, an error arises when extracting the jitter from the measurement data.

For coherent sampling, a reference signal is usually supplied to the device under test to cause the device under test to output a logic sequence being coherent with the applied reference signal. Therefore, the signal integrity of the logic sequence or signal output by the device under test is mainly determined by the limited signal integrity of the reference signal which the test apparatus generates, so that the performance limits of the device under test cannot be fully tested.

An aspect of the present invention aims to determine how to efficiently and accurately obtain a characteristic of the signal under measurement, such as jitter, from the measurement data of the signal under measurement. A further aim is to provide an apparatus that can perform non-coherent sampling to supply the device under test with a reference signal having high signal quality from an external oscillator, thereby testing the performance limits of the device under test.

When using an oscilloscope to measure the jitter, an amplitude noise component is included in the input signal under measurement, along with a timing noise component. This amplitude noise component makes it difficult to accurately measure only the timing noise of the signal under measurement. An aspect of the present invention makes clear that the timing noise of the signal under measurement can be accurately measured by using a voltage comparator disposed in an apparatus performing the functional test to remove the effect of the amplitude noise component from the signal under measurement. It is further shown that the state of the signal under measurement can be sampled using the voltage comparator, where "the state" refers to whether the logic value of the signal under measurement is the expected logic value.

It is also shown that a variety of measurements can be performed by using an apparatus for testing functionality provided with a plurality of measurement pins. For example, deterministic skew or random skew between a plurality of signals under measurement can be measured accurately and efficiently.

US Patent Application Publication No. 2005/0069031 (referred to hereinafter as "Patent Document 1") discloses a technique for calculating the probability density function of jitter in the signal under measurement by means of undersampling.

However, the invention disclosed in Patent Document 1 aims to detect jitter for only one edge type, as described in paragraph 0131 as "jitter for only one EDGE type is measured and the other edge is ignored." Accordingly, it has a disadvantage that jitter for the other edge type cannot be measured. Additionally, since a method of measuring a cumulative density function is employed, it is necessary to perform pattern matching and also necessary to implement a state machine. For example, in order to detect a "01" bit pattern (a leading edge), it is necessary to implement the state machine capable of comparing two bit patterns. Moreover, the invention disclosed in Patent Document 1 cannot measure jitter in the time domain or the frequency domain.

For example, in order to measure jitter for the leading edge, it is necessary to check bits adjacent to each other to detect the "01" pattern as described in paragraph 0131 of Patent Document 1. First, a beat frequency signal Q is fed into a shift register having a 2J-bit width in a general purpose circuit shown in FIG. 9 of Patent Document 1 in accordance with sampling frequency fs. At this time, when the bit pattern is "01", "1" is fed into the shift register as described in paragraph 0076 of Patent Document 1.

Next, a state machine 110 shown in FIG. 9 and FIG. 8B of Patent Document 1 uses a counter 132 to continuously count the number of bits having the value "1" (corresponding to "01") which are continuously inputted (=state 2). When a predetermined number of "1" bits are continuously inputted, the carry Cout of the counter 132 is output to a counter 134 and a middle of a rising edge state 3 is recognized. Furthermore, when the counter 134 outputs the carry Cout to a counter 136, the discrete value of the counter 136 at a bin position in a cumulative density function CDF is increased. When the value of the counter 132 is equal to the value of the counter 136, the discrete value of a counter 138 at the bin position in the cumulative density function CDF is increased by 1. In this way, the cumulative density function CDF is measured as described in paragraph 0102 of Patent Document 1.

As described above, the invention disclosed in the Patent Document 1 is not suitable for a test apparatus that tests an electronic device. This is because a method capable of measuring jitter without limiting the edge type is desired for a test apparatus. For example, jitter appears as a plurality of impulses being adjacent to each other in FIG. 34C of the present specification.

Moreover, it is desired that jitter can be measured in both the time domain and frequency domain in addition to the probability density function (PDF). Finally, in order to perform a jitter test without changing the configuration of the current test apparatus, it is necessary to measure by comparing 1 bit of the sample values with 1 bit of the expected value without using pattern matching, which requires the state machine as mentioned above.

Moreover, paragraph 0129 explains that the jitter can be analyzed using a memory and a computer for the test apparatus. However, Patent Document 1 does not disclose how to analyze the jitter.

In US Patent Application Publication No. 2005/0243950 (referred to hereinafter as "Patent Document 2"), a method is disclosed for analyzing the spectrum of an error signal using critical sampling in a bit error rate measurement system. As shown in FIG. 2 of Patent Document 2, for each bit time interval a single sample point is sampled. That is, two points per period are sampled, so that the sampling is referred to as the critical sampling.

Patent Document 2 emphasizes providing the method for measuring the jitter spectrum. However, it has an essential drawback that in order to obtain the jitter value from the measurement value, it always requires the calibration measurement of a clock signal being modulated by the calibration signal, because of critical sampling. It is therefore impossible to measure the signal level accurately using critical sampling. Since jitter value can be viewed as the noise component in the signal-to-noise ratio, it is extremely important to measure the signal level to define and measure the signal-to-noise ratio required for jitter measurements.

It should be noted that an error signal is the result of comparing the expected data with the input logic data. Therefore, in order to efficiently observe the error signal by the technique disclosed in Patent Document 2, the time offset of a sampling timing has to be adjusted such that the bit-value transitions can be critically sampled at the adjusted timing point.

Conventional measuring methods, however, do not judge whether the detected transition point is a rising edge or a falling edge. Therefore, there are problematic cases where a falling edge of the signal under measurement is mistakenly detected as a rising edge during a test in which the rising edge is supposed to be detected to calculate the jitter amount of the detected edge.

Along with the increasing speed of devices in recent years, the pulse widths of signals under measurement have been becoming smaller. Therefore, even if a plurality of strobes are generated in the vicinity of the rising edge to detect the rising edge, the falling edge is also undesirably detected by the plurality of strobes. This causes a problem that two transition points are detected in the same period of the signal under measurement.

As described above, it is difficult for conventional measuring methods to detect whether a target edge is a rising edge or a falling edge. The inability to distinguish the edge type causes an error in the measured value of the jitter, so that the device under test cannot be accurately tested.

SUMMARY

Therefore, it is an object of an aspect of the innovations herein to provide a measurement apparatus, a test apparatus, an electronic device, a program, and a recording medium, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary measurement apparatus may include a measurement apparatus that measures a signal under measurement, including a strobe timing generator that sequentially generates strobes arranged at substantially even time intervals, a level comparing section that detects a signal level of the signal under measurement at a timing of each sequentially provided strobe, a capture memory that stores therein a data sequence of the signal levels sequentially detected by the level comparing section, a frequency domain converting section that converts the data sequence into a spectrum in the frequency domain, and a jitter calculating section that calculates jitter of the signal under measurement based on a value obtained by integrating levels of frequency components in a predetermined frequency range of the spectrum.

According to a second aspect related to the innovations herein, one exemplary measurement apparatus may include a measurement apparatus that measures a signal under measurement, including a strobe timing generator that sequentially generates strobes arranged at substantially even time intervals, a level comparing section that detects a signal level of the signal under measurement at a timing of each sequentially provided strobe, a logic comparing section that outputs a data sequence of comparison results indicating whether each signal level detected by the level comparing section matches an expected value, a capture memory that stores therein the data sequence output by the logic comparing section, a frequency domain converting section that converts the data sequence into a spectrum in the frequency domain, and a jitter calculating section that calculates jitter of the signal under measurement based on a value obtained by integrating levels of frequency components in a predetermined frequency range of the spectrum.

According to a third aspect related to the innovations herein, one exemplary measurement apparatus may include a measurement apparatus that measures a signal under measurement, including a strobe timing generator that sequentially generates strobes arranged at substantially even time intervals, a level comparing section that detects a signal level of the signal under measurement at a timing at which each strobe is sequentially provided, a capture memory that sequentially stores therein the signal levels sequentially detected by the level comparing section, a logic comparing section that outputs a data sequence of comparison results indicating whether each signal level stored in the capture memory matches an expected value a frequency domain converting section that converts the data sequence into a spectrum in the frequency domain, and a jitter calculating section that calculates jitter of the signal under measurement based on a value obtained by integrating levels of frequency components in a predetermined frequency range of the spectrum.

According to a fourth aspect related to the innovations herein, one exemplary test apparatus may include a test apparatus that tests a device under test, including the measurement apparatus according to any one of the first through third aspects that measures a signal under measurement output by the device under test, and a judging section that judges pass/fail of the device under test based on a measurement result of the measurement apparatus.

According to a fifth aspect related to the innovations herein, one exemplary electronic device may include an electronic device that outputs a signal under measurement, including an electronic device that generates the signal under measurement, and the measurement apparatus according to any one of the first through third aspects that measures the signal under measurement.

According to a sixth aspect related to the innovations herein, one exemplary program may include a program used by the measurement apparatus according to any one of the first through third aspects, which causes a computing apparatus provided to the measurement apparatus to function as the frequency domain converting section and the jitter calculating section.

According to a seventh aspect related to the innovations herein, one exemplary recording medium may include a recording medium storing thereon a program used by the measurement apparatus according to any one of the first through third aspects, wherein the program causes a computing apparatus provided to the measurement apparatus to function as the frequency domain converting section and the jitter calculating section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 2 is a chart showing exemplary strobes generated by the strobe timing generator 30.

FIG. 20 shows examples of jitter values measured by the measurement apparatus 10 described in FIGS. 1 to 19.

FIG. 30 shows an example of instantaneous phase noise $\Delta\phi(t)$ calculated when the difference between the period of the signal under measurement and the period of the strobe signal (hereinafter referred to as "period resolution") is changed.

FIG. 35 shows an exemplary configuration of the pattern generator 65 included in the test apparatus 100 shown in FIG. 27.

FIG. 48 shows an example of the spectrum of the signal under measurement measured using the measurement apparatus 10 including the code control section 610 shown in FIG. 43.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
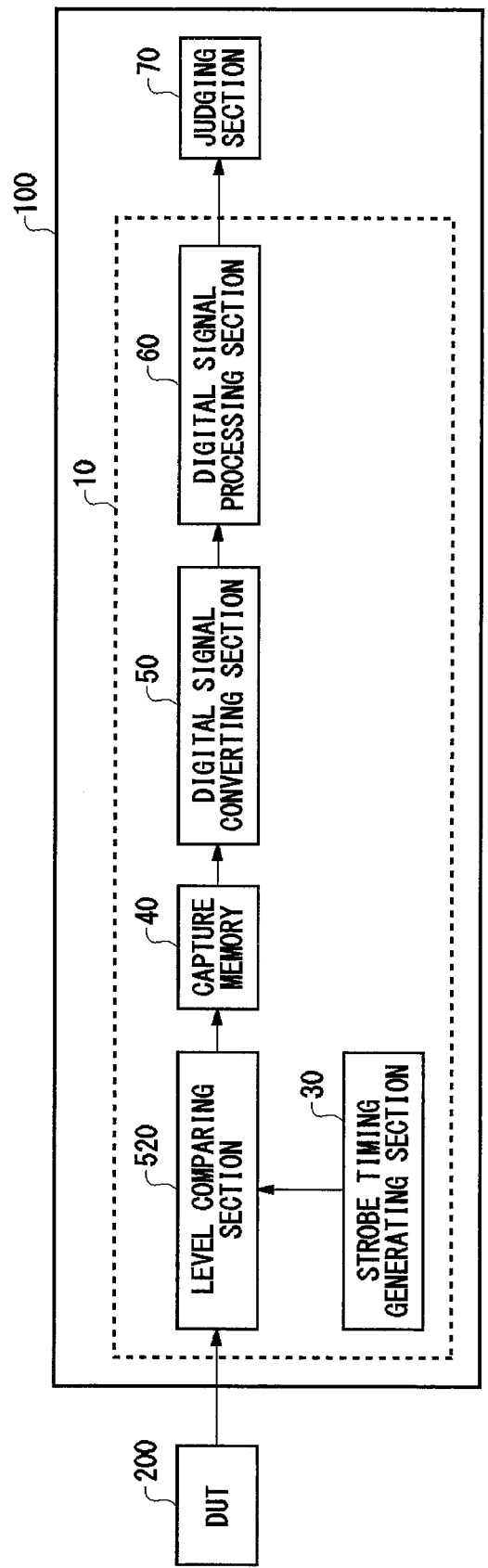
FIG. 1 is a diagram showing one exemplary configuration of a test apparatus 100 according to an embodiment of the invention.

FIG. 1 is a diagram showing one exemplary configuration of a test apparatus 100 according to an embodiment of the invention. The test apparatus 100 is an apparatus for testing a device under test 200 such as a semiconductor circuit, and includes a measurement apparatus 10 and a judging section 70. The measurement apparatus 10 measures jitter of a signal under measurement output by the device under test 200. Here, the signal under measurement is a signal having a predetermined period. The signal under measurement may be a clock signal or a data signal. The measurement apparatus 10 may also measure timing jitter of the signal under measurement.

The judging section 70 judges whether the device under test 200 is defect-free based on the jitter of the signal under measurement measured by the measurement apparatus 10. For example, the judging section 70 judges whether the device under test 200 is defect-free based on whether an amount of timing jitter of the signal under measurement is greater than a preset threshold value. This threshold value may be defined by required specifications of the device under test 200.

The measurement apparatus 10 has a level comparing section 520, a strobe timing generator 30, a capture memory 40, a digital signal converting section 50 and a digital signal processing section 60. The level comparing section 520 detects the level of the signal under measurement at timings corresponding to strobes supplied sequentially thereto. For example, the level comparing section 520 sequentially compares the level of the signal under measurement at each strobe timing to a reference voltage value supplied thereto, and outputs a data sequence indicating the result of these comparisons.

The strobe timing generator 30 sequentially generates the strobes at substantially equal time intervals. The strobe timing generator 30 may sequentially generate the strobes in synchronization with the period of the signal under measurement.

The strobe timing generator 30 may sequentially generate the strobes independently from the period of the signal under measurement. The strobe timing generator 30 may also sequentially generate the strobes in synchronization with a period different from the period of the signal under measurement.

The capture memory 40 stores the data sequence of the comparison result output by the level comparing section 520. For example, the capture memory 40 aligns the comparison results output at each strobe timing by the level comparing section 520 according to the phase of the corresponding strobe, and stores the comparison results in this alignment.

The digital signal processing section 60 calculates the jitter of the signal under measurement based on the data sequence of the comparison results stored in the capture memory 40. The calculation performed by the digital signal processing section 60 is described in detail hereinafter, in association with FIG. 5 onward.

It is preferable to input data corresponding to the signal processing method of the digital signal processing section 60 to the digital signal processing section 60. When the digital signal processing section 60 calculates the jitter of the signal under measurement based on zero-crossing points or the like of the signal under measurement, for example, it is preferable to input a signal in which the absolute value of the amplitude is equal to a discrete value in a range smaller than n, where n is a real number.

The measurement apparatus 10 of the present embodiment may convert the comparison results stored in the capture memory 40 into a discrete signal to be input to the digital signal processing section 60. For example, the digital signal converting section 50 generates the discrete signal in which each voltage value of the signal under measurement is converted into a digital value, based on the comparison result stored in the capture memory 40, such that the absolute value of each digital value is in a range smaller than n, where n is a real number. For example, the digital signal converting section 50 converts the comparison results into digital values approximately from −1 to 1.

The following describes an example in which the level comparing section 520 compares the voltage values of the signal under measurement at each strobe timing to one single reference voltage, and outputs logic value H or logic value L as the comparison result. In this example, the digital signal converting section 50 outputs a discrete signal in which logic H is converted into a digital value of 1 and logic L is converted into a digital value of −1. When the level comparing section 520 outputs the comparison results having three possible values, the digital signal converting section 50 converts the respective comparison results into digital values 1, 0, and −1 corresponding to the logic values of the comparison results. This signal conversion simplifies signal processing in the digital signal processing section 60.

FIG. 2 is a chart showing exemplary strobes generated by the strobe timing generator 30. In this example, the period of the signal under measurement is set as T. The strobe timing generator 30 sequentially generates the strobes at substantially equal time intervals synchronously or asynchronously with the period T of the signal under measurement, as described above.

Generally, the test apparatus 100 operates per cycle (T0, T1, T2, . . . ) corresponding to an operation period, i.e. a test rate, synchronized with the cycle T of the signal under measurement. The strobe timing generator 30 may generate one strobe or a plurality of strobes per cycle corresponding to the test rate, as shown by the strobe signals (1) and (2) in FIG. 2.

The strobe timing generator 30 may generate the strobes asynchronously from the test rate as shown by the strobe signal (3) in FIG. 2. At this time, the number of strobes generated during each cycle is determined by the period and the test rate with which the strobe timing generator 30 generates the strobes. For example, the strobe timing generator 30 may be an oscillation circuit that operates independently from the operation period of the test apparatus 100.

The period T of the signal under measurement may or may not coincide with the test rate of the test apparatus 100. It is preferable for the period T of the signal under measurement to coincide with the test rate when the test apparatus 100 also performs a functional test described later.

By setting the intervals TS of the strobes generated by the strobe timing generator 30 as shown by (3) in FIG. 2, it is possible to sequentially generate strobes having phases that are gradually shifted to deviate from the phase of the signal under measurement. Also, as the strobes arranged at substantially equal time intervals, the strobe timing generator 30 may generate any one of (1) a strobe signal having one strobe per test rate, (2) a strobe signal having a plurality of strobes per test rate and (3) a strobe signal having strobes arranged independently from the test rate. Although the test rate of the test apparatus 100 is equal to the period T of the signal under measurement in the above example, the test rate of the invention is not necessarily equal to the period T of the signal under measurement when a function test is not performed, and can be set independently from the period T.

Figure 3A:
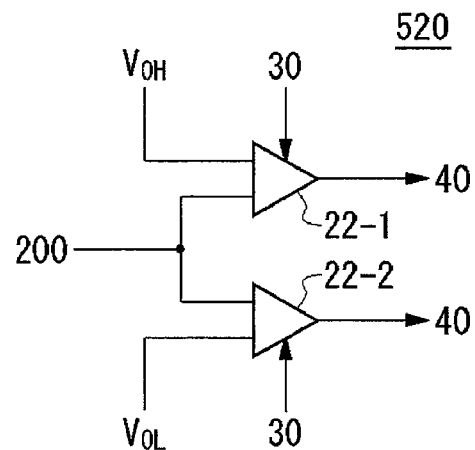
FIG. 3A shows an exemplary configuration of the level comparing section 520.
Figure 3B:
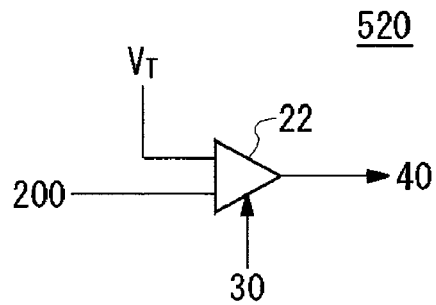
FIG. 3B shows an exemplary configuration of the level comparing section 520.
Figure 3C:
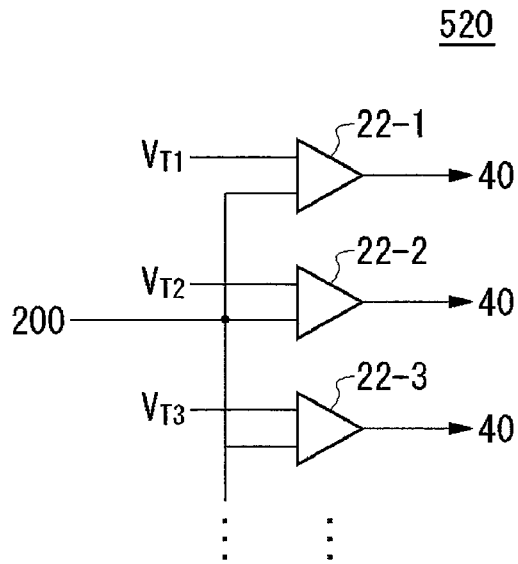
FIG. 3C shows an exemplary configuration of the level comparing section 520.

FIGS. 3A, 3B and 3C are diagrams showing exemplary configurations of the level comparing section 520. The level comparing section 520 shown in FIG. 3A is supplied with a first reference voltage VOH and a second reference voltage VOL and outputs a comparison result having three possible values. A case when the second reference voltage VOL is smaller than the first reference voltage VOH is explained in this example. The level comparing section 520 outputs a different comparison result in each of the following cases: when the voltage value of the signal under measurement is larger than the first reference voltage VOH, when the voltage value of the signal under measurement is less than or equal to the first reference voltage VOH and is larger than the second reference voltage VOL, and when the voltage value of the signal under measurement is less than or equal to the second reference voltage VOL.

The level comparing section 520 includes a first comparator 22-1 and a second comparator 22-2. The signal under measurement is split into two and supplied respectively to the first comparator 22-1 and the second comparator 22-2. The strobe timing generator 30 supplies strobes indicating substantially identical timings to the first comparator 22-1 and the second comparator 22-2.

The first comparator 22-1 compares a voltage value of the signal under measurement with the first reference voltage VOH at the timing indicated by each supplied strobe. The first comparator 22-1 outputs a logic value representing High when the voltage value of the signal under measurement is greater than the first reference voltage VOH, and outputs a logic value representing Low when the voltage value of the signal under measurement is less than or equal to the first reference voltage VOH, for example.

The second comparator 22-2 compares the voltage value of the signal under measurement with the second reference voltage VOL at the timing indicated by each supplied strobe. The second comparator 22-2 outputs a logic value representing High when the voltage value of the signal under measurement is greater than the second reference voltage VOL and outputs a logic value representing Low when the voltage value of the signal under measurement is less than or equal to the second reference voltage VOL, for example.

The level comparing section 520 outputs, as the comparison result, a set of the logic value output by the first comparator 22-1 and the logic value output by the second comparator 22-2. That is, when the logic value output by the first comparator 22-1 is set as M and the logic value output out of the second comparator 22-2 is set as N, the level comparing section 520 outputs the comparison result having three possible values of (M, N), which are (High, High), (Low, High), and (Low, Low) corresponding to the voltage value of the signal under measurement. In this example, the digital signal converting section 50 converts the comparison results (High, High), (Low, High) and (Low, Low) into digital values of 1, 0 and −1, respectively.

The level comparing section 520 shown in FIG. 3B outputs different comparison results depending on whether the voltage value of the signal under measurement is greater than a reference voltage value VT supplied thereto. That is, the level comparing section 520 of this example outputs binary comparison results. The level comparing section 520 includes a comparator 22 to which the reference voltage value VT and the signal under measurement are input. The comparator 22 compares the voltage value of the signal under measurement with the reference voltage value VT at the timings of the strobes fed from the strobe timing generator 30. When the voltage value of the signal under measurement is greater than the reference voltage value VT for example, the comparator 22 outputs the logic value representing High, and when the voltage value of the signal under measurement is less than or equal to the reference voltage value VT, the comparator 22 outputs the logic value representing Low. The level comparing section 520 outputs the logic value output by the comparator 22, as a comparison result. In this example, the digital signal converting section 50 converts the comparison results High and Low into digital values of 1 and −1, respectively.

The level comparing section 520 shown in FIG. 3C includes a plurality of comparators 22. Reference voltages VT1, VT2, . . . , which are different from each other, are supplied respectively to the comparators 22. The signal under measurement is branched and supplied to each of the comparators 22. The strobe timing generator 30 supplies strobes having substantially identical timings to each of the comparators 22.

Each comparator 22 compares the voltage value of the signal under measurement to the corresponding reference voltage VTx at the timings of the strobes supplied thereto. The operation of each comparator 22 is the same as the comparator 22 shown in FIG. 3B. The level comparing section 520 outputs sets of the logic values output by the comparators 22, as comparison results. That is, the level comparing section 520 of this embodiment outputs different comparison results depending on which one of the voltage ranges specified by two adjacent reference voltages, from among the three or more types of reference voltages VT supplied thereto, the voltage value of the signal under measurement falls into.

For example, the digital signal converting section 50 converts the comparison result in which the logic values output from all of the comparators 22 represent High into a digital value of 1, and converts the comparison result in which the logic values output from all of the comparators 22 represent Low into the digital value of −1. The digital signal converting section 50 also converts other comparison results into a predetermined digital value between 1 and −1, according to the logic values in each comparison result.

Preferably, each reference voltage supplied to the level comparing section 520 explained in FIGS. 3A through 3C is variable. For example, the measurement apparatus 10 controls each reference voltage based on information of the amplitude level to be measured of the signal under measurement.

Figure 4:
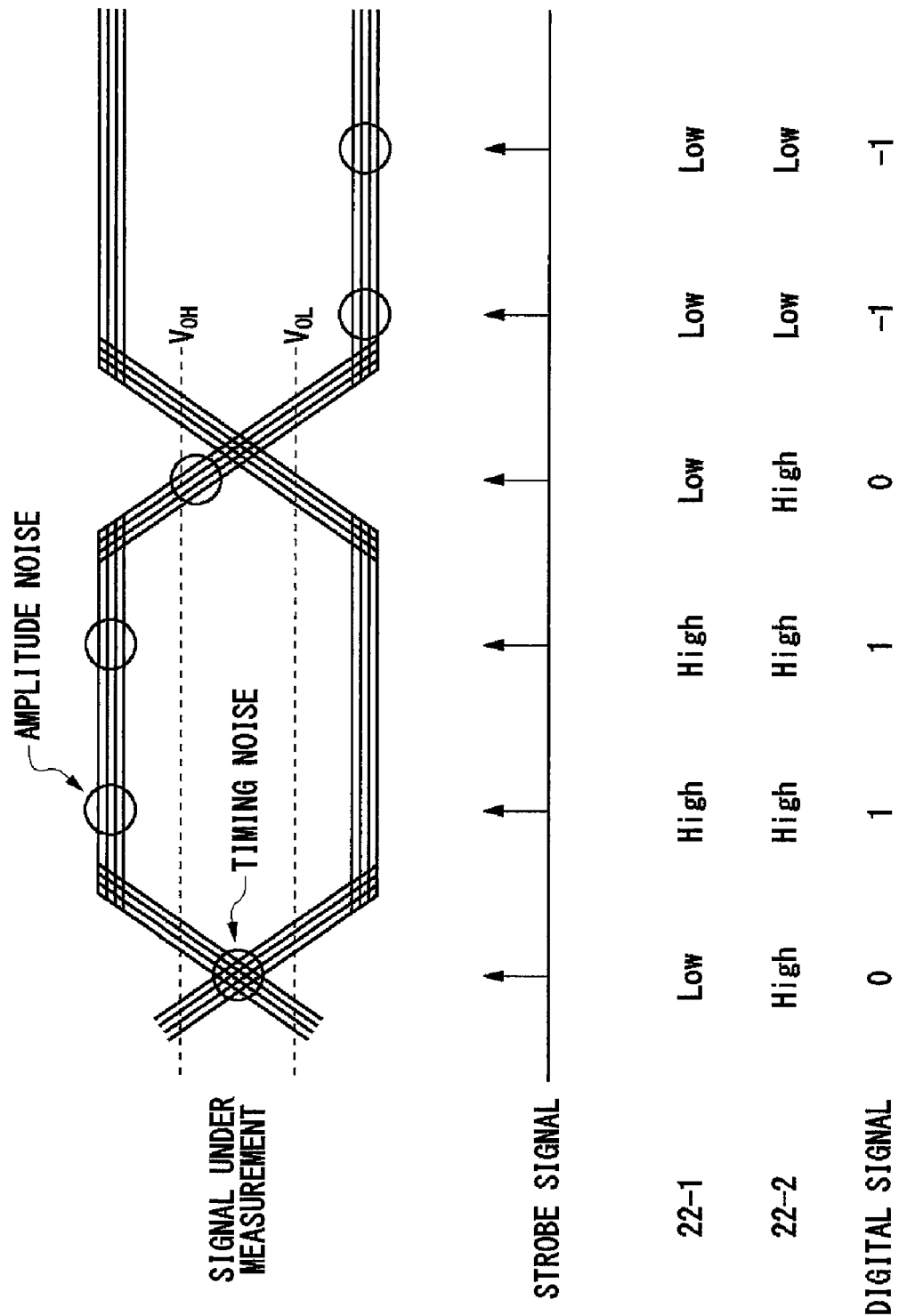
FIG. 4 shows an exemplary operation of the measurement apparatus 10 when the level comparing section 520 shown in FIG. 3A is used.

FIG. 4 shows an exemplary operation of the measurement apparatus 10 when the level comparing section 520 shown in FIG. 3A is used. The signal under measurement as shown in FIG. 4 is input to the measurement apparatus 10. The input signal contains timing noise, i.e. jitter along the time axis, and amplitude noise along the amplitude axis. The jitter of the timing noise is dominant over the edge portions of the signal under measurement and the amplitude noise is dominant over the stationary portions of the signal under measurement, for example.

As shown in FIG. 4, the vertical eye opening of the signal under measurement decreases due to the amplitude noise, and the horizontal eye opening of the signal under measurement decreases due to the timing noise. Ideally, the horizontal eye opening of the signal under measurement is affected only by the timing noise. However, the amplitude noise also affects the horizontal eye opening due to a kind of AM-to-PM conversion. Consequently, the amplitude noise has a relatively high probability of being converted into timing noise.

Therefore, it is preferable to measure timing jitter by removing the influence of the amplitude noise. To achieve this, the measurement apparatus 10 of this embodiment converts a voltage value of the signal under measurement that is greater than the first reference voltage VOH into the digital value of 1, and converts a voltage value of the signal under measurement smaller than the second reference voltage VOL into the digital value of −1. In this way, the influence of the amplitude noise can be removed automatically. The measurement apparatus 10 converts a voltage value of the signal under measurement that is less than or equal to the first reference voltage VOH and greater than the second reference voltage VOL into the digital value of 0. The timing at which these digital values are detected is determined only by the timing noise. Therefore, it is possible to accurately measure the timing noise by removing the influence of the amplitude noise based on the comparison results of the level comparing section 520.

As shown in FIG. 4, the strobes applied to the level comparing section 520 are arranged at substantially equal intervals independent of the stationary period of the signal under measurement. Therefore, the measurement can be carried out while excluding the time dependency of the timing noise. For example, four or more strobes may be arranged in each period of the signal under measurement. However, it should be noted that the frequency with which the strobes are applied to the level comparing section 520 is not limited to a frequency greater than the Nyquist frequency, and may instead be less than the Nyquist frequency.

Figure 5:
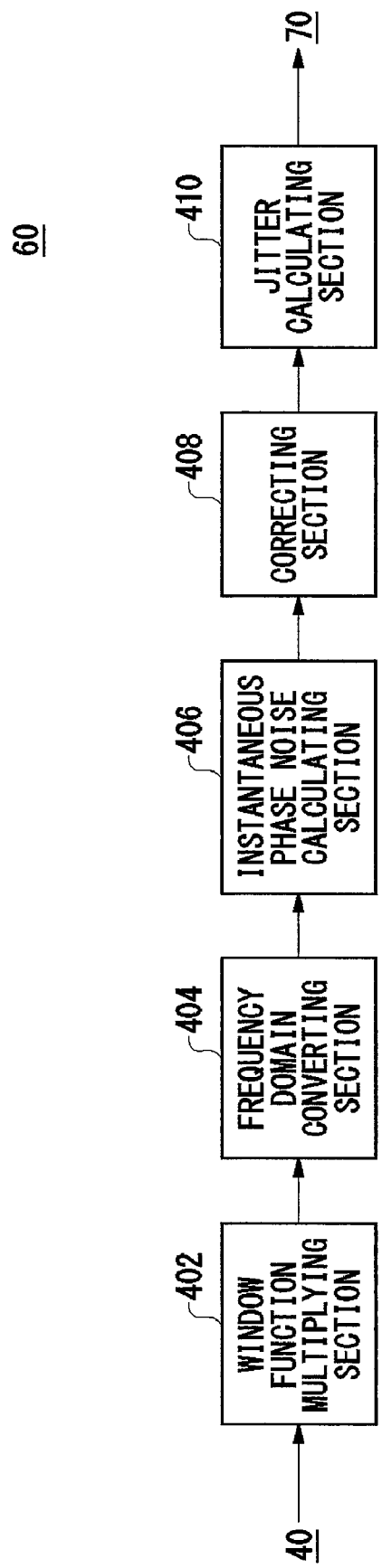
FIG. 5 shows an exemplary configuration of the digital signal processing section 60.

FIG. 5 shows an exemplary configuration of the digital signal processing section 60. The digital signal processing section 60 includes a window function multiplying section 402, a frequency domain converting section 404, an instantaneous phase noise calculating section 406, a correcting section 408, and a jitter calculating section 410.

The window function multiplying section 402 multiplies the data sequence stored in the capture memory 40 by a window function. For example, the window function multiplying section 402 multiplies the data sequence by a window function causing the values at the ends of the data sequence to be substantially 0 and the middle value to be substantially equal to 1, such as a Hanning window function. In this way, a spectrum can be obtained by Fourier transforming the data sequence, even if the length of the data sequence stored in the capture memory 40 is not an integer multiple of the period of the signal under measurement. The test apparatus 100 may use different oscillators to generate a reference clock input to the device under test 200 and a clock designating the strobe periods. In this case, the measurement apparatus 10 performs non-coherent sampling of the signal output by the device under test 200, and can also convert the sampling results into the frequency domain when provided with the window function multiplying section 402.

The frequency domain converting section 404 receives the data sequence that was multiplied by the window function in the window function multiplying section 402, and converts this data sequence into a spectrum. For example, the frequency domain converting section 404 calculates the spectrum in the frequency domain by performing a discrete Fourier transform on the data sequence.

Figure 6:
FIG. 6 shows an exemplary configuration of the digital signal processing section 60.

The instantaneous phase noise calculating section 406 receives the spectrum calculated by the frequency domain converting section 404 and calculates instantaneous phase noise of the signal under measurement on the temporal axis, based on the received spectrum. The method by which the instantaneous phase noise calculating section 406 calculates the instantaneous phase noise of the signal under measurement is described later in FIGS. 6 to 11. The digital signal processing section 60 may be configured to perform this calculation, as shown in FIG. 6.

The correcting section 408 corrects the instantaneous phase noise calculated by the instantaneous phase noise calculating section 406. The instantaneous phase noise calculated by the instantaneous phase noise calculating section 406 includes an error caused by the multiplication performed by the window function multiplying section 402. The correcting section 408 corrects the instantaneous phase noise based on the window function used in the multiplication by the window function multiplying section 402. For example, the correcting section 408 outputs, as a corrected instantaneous phase noise function, a result ($\Delta\phi(t)/w(t)$) obtained by dividing the instantaneous phase noise $\Delta\phi(t)$ on the temporal axis, as calculated by the instantaneous phase noise calculating section 406, by the window function $w(t)$ on the temporal axis.

The jitter calculating section 410 calculates the jitter of the signal under measurement based on the instantaneous phase noise corrected by the correcting section 408. For example, the jitter calculating section 410 detects the value of the instantaneous phase noise at a timing of each rising edge of the signal under measurement. Each of these instantaneous phase noise values corresponds to the timing jitter of the corresponding edge.

By correcting the instantaneous phase noise $\Delta\phi(t)$ based on the window function in this way, the instantaneous phase noise, jitter, and the like of the signal under measurement can be accurately measured. Examples of measurement results of the timing jitter of the signal under measurement obtained by the measurement apparatus 10 are described later in FIG. 20.

FIG. 6 shows an exemplary configuration of the digital signal processing section 60. The digital signal processing section 60 of the present embodiment further includes a band limiting section 412, an analytic signal generating section 414, and an instantaneous phase calculating section 416, in addition to the configuration of the digital signal processing section 60 shown in FIG. 5. In the configuration shown in FIG. 6, illustrations of the window function multiplying section 402, the frequency domain converting section 404, the correcting section 408, and the jitter calculating section 410 shown in FIG. 5 are omitted.

The band limiting section 412 extracts a frequency component in a prescribed frequency range from the spectrum calculated by the frequency domain converting section 404, and outputs the extracted frequency component to the analytic signal generating section 414. For example, the band limiting section 412 generates a spectrum in which the negative frequency component is set to 0. As other examples, the band limiting section 412 may extract a frequency component that is in the vicinity of a carrier frequency of the signal under measurement, or may extract a frequency component in a prescribed frequency range centered on the carrier frequency of the signal under measurement. This frequency range may be a range that does not include negative frequency.

The analytic signal generating section 414 converts the spectrum received from the band limiting section 412 into a function in the time domain. For example, the analytic signal generating section 414 performs an inverse Fourier transform of the spectrum. The band limiting section 412 removes the negative frequency component of the spectrum. Therefore, an analytic signal of the signal under measurement can be generated by performing the inverse Fourier transform on the spectrum. The analytic signal may be a signal in which the phases of the real part and the imaginary part differ from each other by 90 degrees.

The instantaneous phase calculating section 416 calculates the instantaneous phase $\phi(t)$ of the signal under measurement based on the analytic signal generated by the analytic signal generating section 414. For example, the instantaneous phase calculating section 416 calculates the instantaneous phase $\phi(t)$ of the signal under measurement by calculating the arctangent of the real part and the imaginary part of the signal under measurement.

The instantaneous phase noise calculating section 406 calculates the instantaneous phase noise $\Delta\phi(t)$ of the signal under measurement based on the instantaneous phase $\phi(t)$ calculated by the instantaneous phase calculating section 416. The instantaneous phase noise $\Delta\phi(t)$ of the signal under measurement represents deviation in the instantaneous phase $\phi(t)$ in relation to the ideal phase. The instantaneous phase noise calculating section 406 may calculate the instantaneous phase noise $\Delta\phi(t)$ by obtaining the difference between the instantaneous phase $\phi(t)$ and the ideal phase of the signal under measurement.

Figure 7:
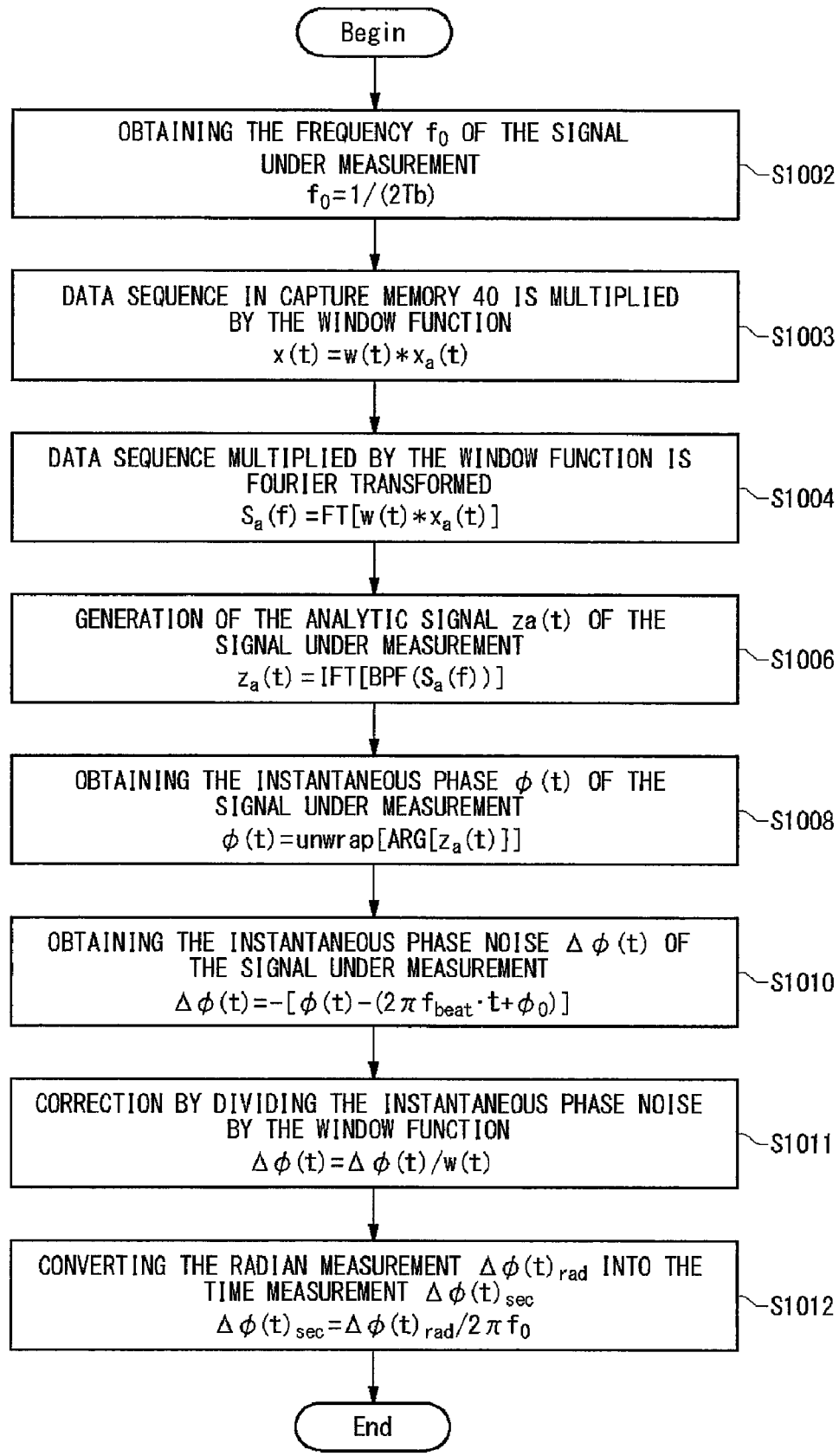
FIG. 7 is a flow chart showing an exemplary operation of the digital signal processing section 60.

FIG. 7 is a flow chart showing an exemplary operation of the digital signal processing section 60. The signal processing in the digital signal processing section 60 is described in FIGS. 8 to 11. At S1002, the digital signal processing section 60 obtains the average frequency $f_0$ of the signal under measurement. The digital signal processing section 60 may include a measuring section that measures the average frequency $f_0$ of the signal under measurement. As another example, the average frequency $f_0$ of the signal under measurement may be obtained from the inverse of double the average period Tb of the signal under measurement. The average frequency or the average period of the signal under measurement may be provided by a user. S1002 is described as the first step in FIG. 7, but it is not necessary to perform S1002 first.

Figure 8:
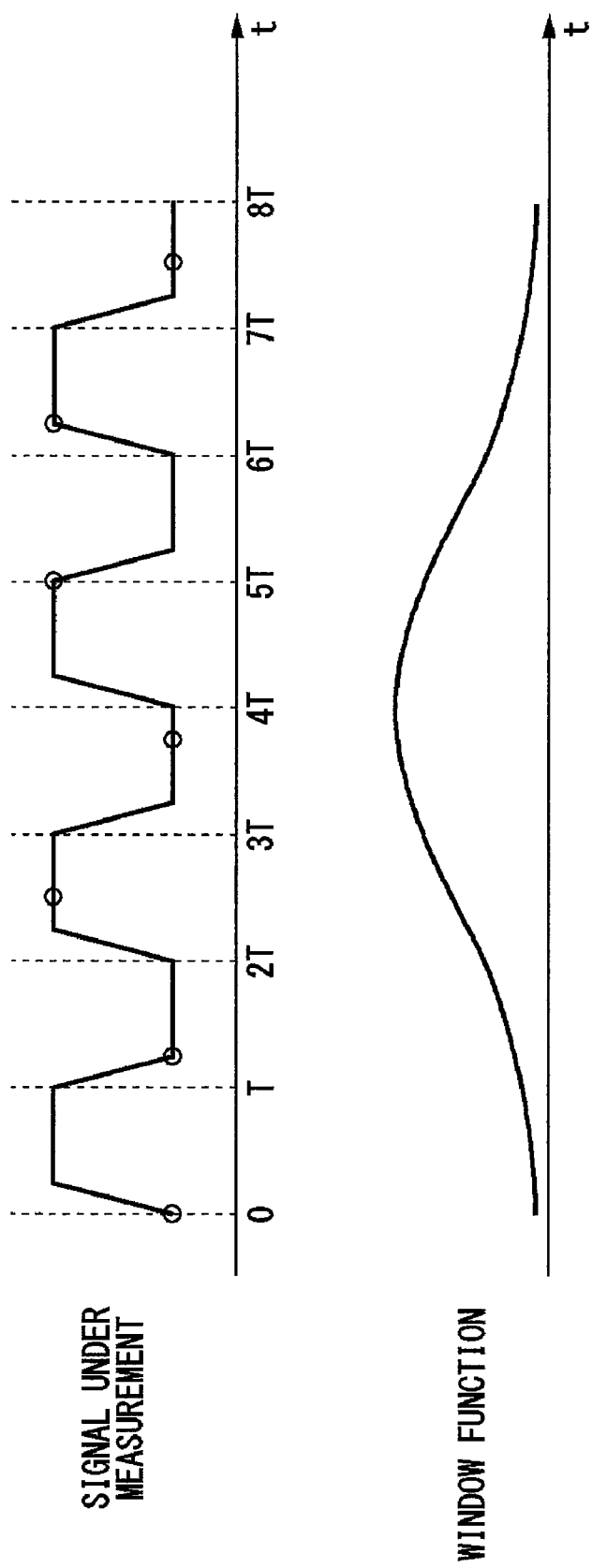
FIG. 8 shows examples of the data sequence xa(t) stored in the capture memory 40 and the window function w(t) used by the window function multiplying section 402 to multiply the data sequence xa(t) of the signal under measurement.

The window function multiplying section 402 generates a data sequence x(t) by multiplying the data sequence xa(t) stored in the capture memory 40 by the window function w(t) (S1003). FIG. 8 shows examples of the data sequence xa(t) stored in the capture memory 40 and the window function w(t) used by the window function multiplying section 402 to multiply the data sequence xa(t) of the signal under measurement. The window function multiplying section 402 may multiply the data sequence xa(t) by the Hanning window function, as described above.

Figure 9A:
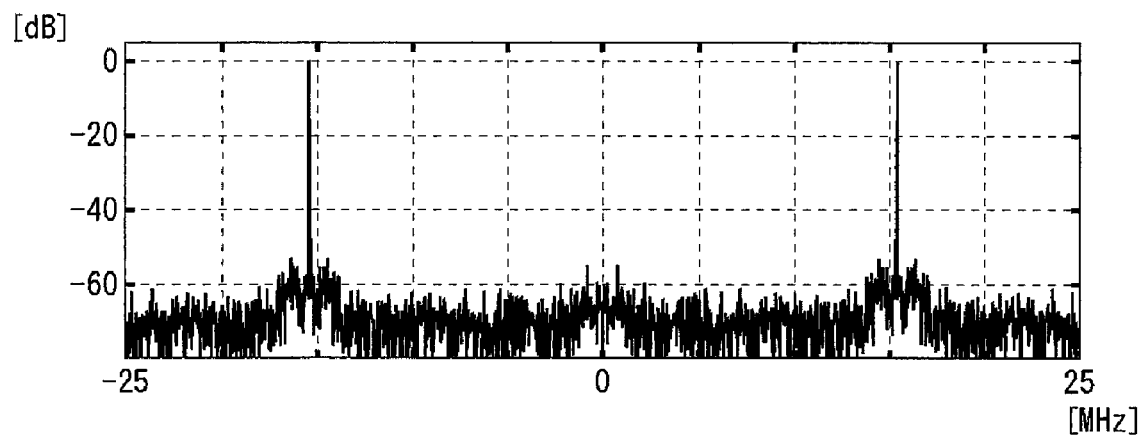
FIG. 9A shows an example of a spectrum calculated by the frequency domain converting section 404.

The frequency domain converting section 404 calculates a spectrum Sa(f) by performing a Fourier transform on the data sequence x(t), which is equal to w(t)×xa(t) (S1004). FIG. 9A shows an example of a spectrum calculated by the frequency domain converting section 404. As shown in FIG. 9A, over the positive and negative frequencies, the spectra are symmetrical.

Figure 9B:
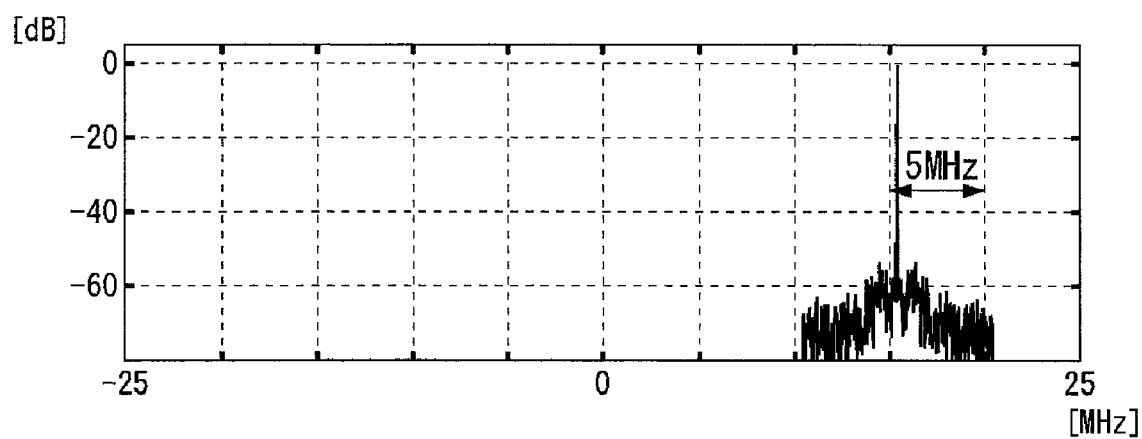
FIG. 9B shows an example of the frequency component extracted by the band limiting section 412.
Figure 10A:
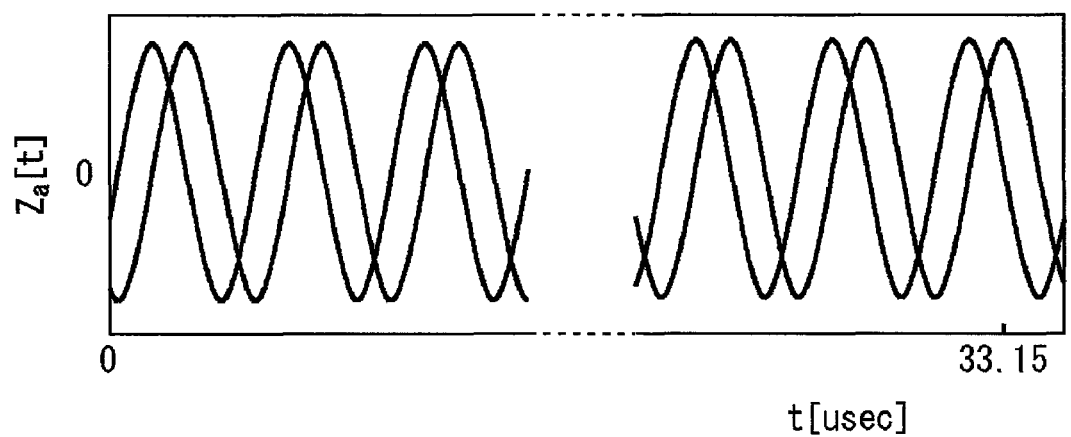
FIG. 10A shows exemplary waveforms of the real part and the imaginary part of the analytic signal generated by the analytic signal generating section 414.

The analytic signal generating section 414 generates an analytic signal Za(t) based on the spectrum Sa(f) (S1006). The analytic signal generating section 414 may generate the analytic signal by performing an inverse Fourier transform on a prescribed frequency component of the spectrum Sa(f) extracted by the band limiting section 412, as described above. FIG. 9B shows an example of the frequency components extracted by the band limiting section 412. The band limiting section 412 may extract prescribed frequency components in the positive frequency band, as described above. FIG. 10A shows exemplary waveforms of the real part and the imaginary part of the analytic signal generated by the analytic signal generating section 414.

Figure 10B:
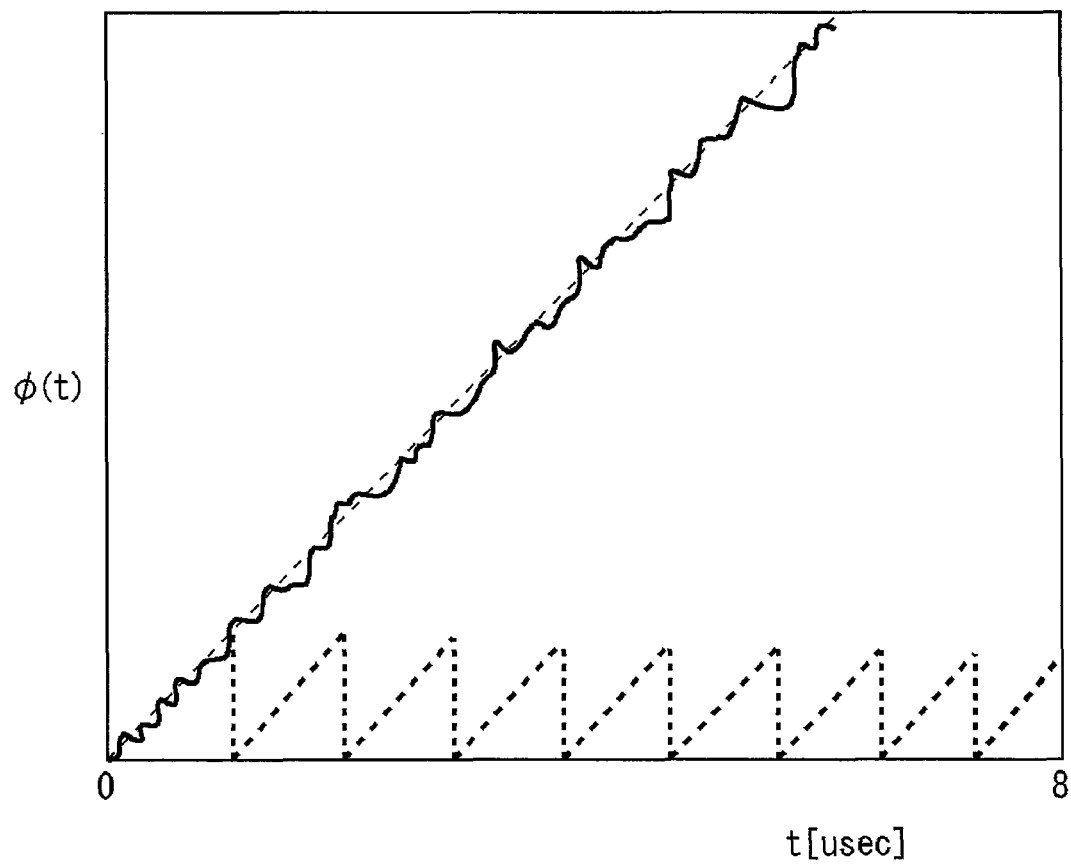
FIG. 10B shows an example of the instantaneous phase φ(t).

The instantaneous phase calculating section 416 obtains the arctangent of the real part and the imaginary part of the analytic signal Za(t), as expressed by arctan [Im(Za(t))/Re(Za(t))], to calculate the instantaneous phase $\phi(t)$ (S1008). FIG. 10B shows an example of the instantaneous phase $\phi(t)$. Since ARG[Za(t)] is a value from $-\pi$ to $\pi$, inclusive, the value following $\pi$ is $-\pi$, which results in a discontinuous waveform as shown by the dotted line of FIG. 10B. Therefore, the instantaneous phase calculating section 416 can remove the discontinuous phases from ARG[Za(t)] through a phase unwrap, thereby achieving a continuous linear waveform as shown by the solid line of FIG. 10B. The instantaneous phase calculating section 416 can perform the phase unwrap by sequentially adding $2\pi$ to the discontinuous phase ARG[$z_a$(t)], for example.

Figure 11A:
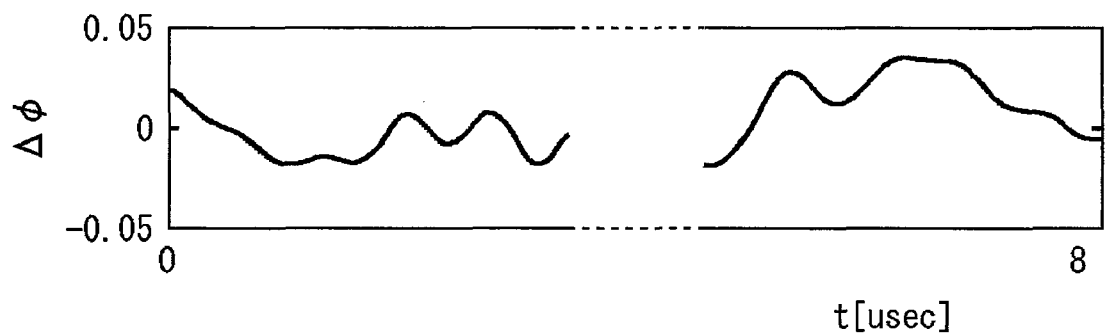
FIG. 11A shows an example of the instantaneous phase noise Δφ.

The instantaneous phase noise calculating section 406 calculates the instantaneous phase noise $\Delta\phi$ from the instantaneous phase $\phi(t)$ (S1010). FIG. 11A shows an example of the instantaneous phase noise $\Delta\phi$. The instantaneous phase noise $\Delta\phi(t)$ can be calculated by subtracting the ideal linear phase of the signal under measurement from the instantaneous phase $\phi(t)$, as described above. For example, the instantaneous phase noise calculating section 406 calculates the instantaneous phase noise $\Delta\phi(t)$ by subtracting the linear component $2\pi f_{beat}t+\phi_0$ from the instantaneous phase $\phi(t)$. Here, $f_{beat}$ is the frequency for sampling the signal under measurement uniformly with the period resolution ($\Delta$). For example, the following expression may be used.

$$f_{beat} = \frac{1}{T} - \frac{1}{2(T_b + \Delta)}$$

The period resolution represents the difference in periods between the signal under measurement and the strobes, and $\phi_0$ represents the initial angle of the instantaneous phase $\phi(t)$.

The instantaneous phase noise calculating section 406 may obtain $f_{beat}$ from the period T of the signal under measurement and the strobe period ($2(T_b+\Delta)$), and may subtract the linear component $2\pi f_{beat}t+\phi_0$ form the instantaneous phase $\phi(t)$. As another example, the instantaneous phase noise calculating section 406 may obtain an approximated straight line of the instantaneous phase $\phi(t)$ by performing a least squares technique or the like, and may subtract this approximated straight line from the instantaneous phase $\phi(t)$.

Figure 11B:
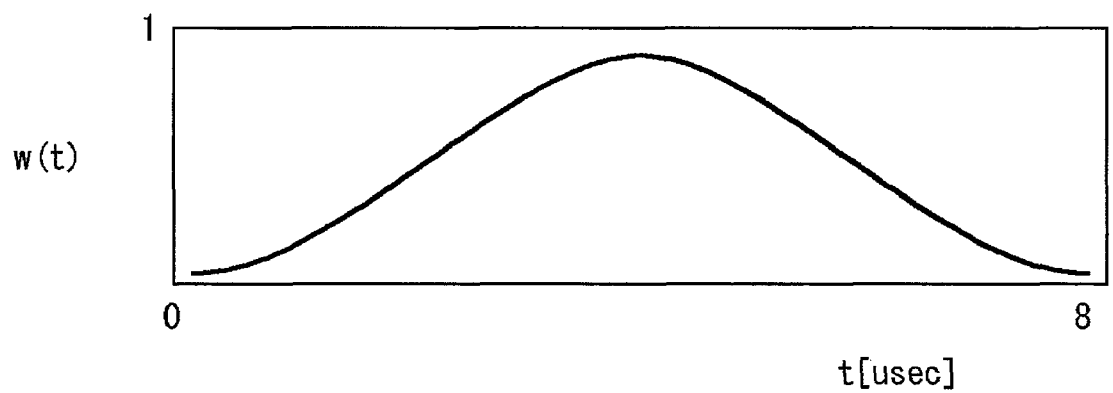
FIG. 11B shows an example of the window function w(t).

The correcting section 408 corrects the instantaneous phase noise $\Delta\phi(t)$ by dividing the instantaneous phase noise $\Delta\phi(t)$ by the window function w(t) (S1011). FIG. 11B shows an example of the window function w(t). This window function is the same as the window function used in the process of S1003. In this way, the instantaneous phase noise $\Delta\phi(t)$ can be calculated more accurately.

The instantaneous phase noise $\Delta\phi(t)$ in radian units is then converted into instantaneous phase noise $\Delta\phi(t)$ in time units (S1012). For example, the correcting section 408 converts the instantaneous phase noise $\Delta\phi(t)$ in radian unit into instantaneous phase noise $\Delta\phi(t)$ in time unit by dividing the instantaneous phase noise $\Delta\phi(t)$ in radian unit by $2\pi f_0$. As another example, the correcting section 408 may divide the instantaneous phase noise $\Delta\phi(t)$ resulting from the process of S1012, instead of the instantaneous phase noise $\Delta\phi(t)$ resulting from process of S1011, by the window function w(t).

Figure 12A:
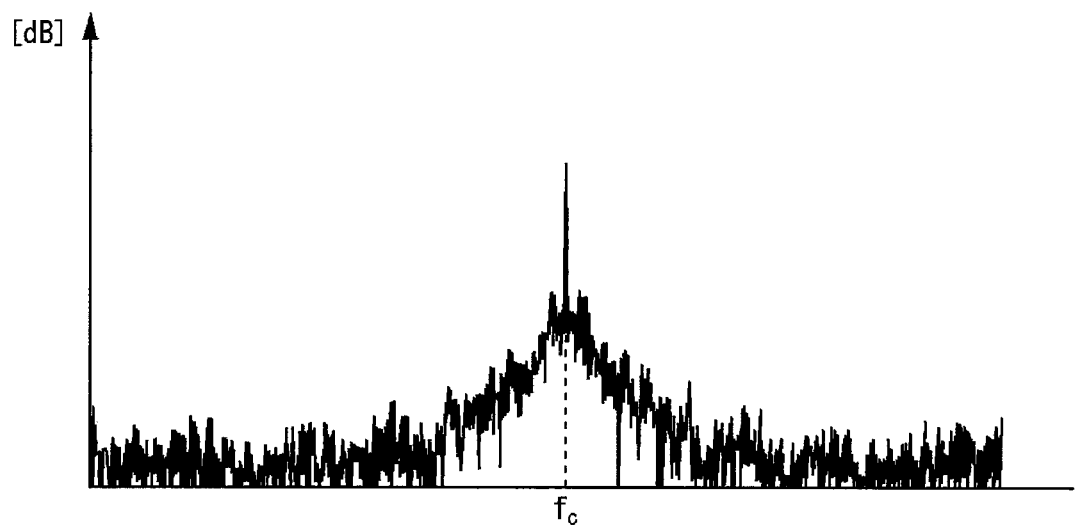
FIG. 12A shows an example of the spectrum extracted by the band limiting section 412 at the process of S1006 in FIG. 11.

FIG. 12 describes another exemplary operation of the band limiting section 412. FIG. 12A shows an example of the spectrum to be extracted (bandlimited) by the band limiting section 412 at the process of S1006 in FIG. 11. The band limiting section 412 removes the deterministic noise component from the spectrum. The deterministic noise component may be deterministic jitter that can be reproduced under a prescribed condition, such as a line spectrum.

Figure 12B:
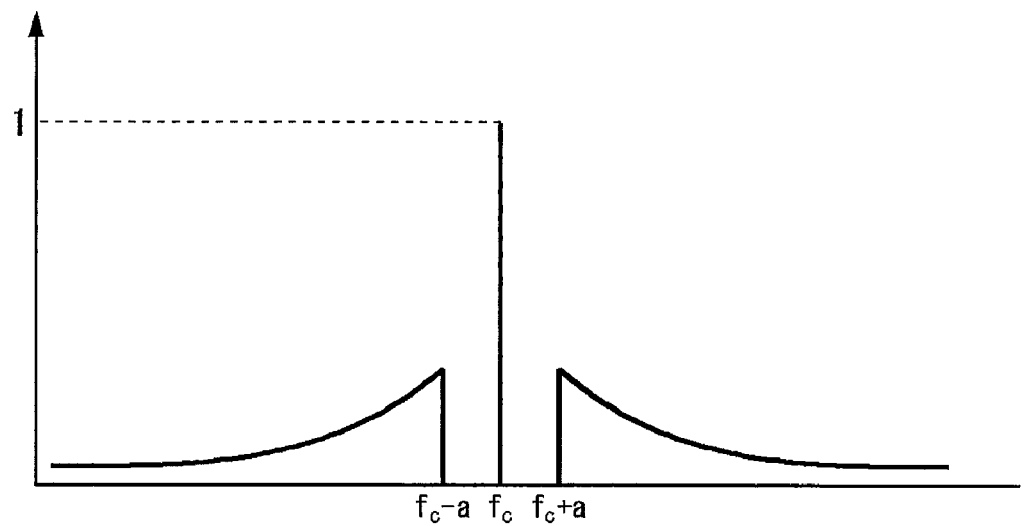
FIG. 12B shows an exemplary spectrum generated by the band limiting section 412.

FIG. 12B shows an exemplary spectrum generated by the band limiting section 412. The band limiting section 412 removes, from the spectrum shown in FIG. 12A, a deterministic line spectrum components within a prescribed frequency range, i.e. fc−a to fc+a, in the sideband of the carrier frequency fc of the signal under measurement. Here, the band limiting section 412 does not remove the frequency component of the carrier frequency fc. Through this process, the noise components in the vicinity of the carrier frequency fc can be removed. Furthermore, the frequency range fc−a to fc+a can be set in advance by the user based on the frequency range of the jitter to be measured, or the like.

The band limiting section 412 may instead remove a predetermined out-of-band frequency component from the spectrum at a frequency outside of the aforementioned frequency range, i.e. a frequencies less than fc−a or a frequencies greater than fc+a. For example, the band limiting section 412 removes a frequency components having a level greater than a predetermined threshold value, from the frequencies less than fc−a and the frequencies greater than fc+a. In other words, the band limiting section 412 replaces these frequency components with zeros.

At this time, the band limiting section 412 may smooth the spectra over the frequencies outside of the aforementioned frequency range, i.e. the frequencies less than fc−a or the frequencies greater than fc+a, and generate the threshold value from these smoothed spectra. For example, the band limiting section 412 generates the threshold value by adding a predetermined offset value to the level of the smoothed spectra. Using the generated threshold value, the band limiting section 412 may remove the frequency components having a level greater than the threshold value in the smoothed spectra. The band limiting section 412 may generate the smoothed spectra by inputting the spectrum over the frequencies less than f-ca and frequencies greater than f+ca into a low-pass filter having a prescribed cutoff frequency.

Through this process, the deterministic noise components of the spectrum can be eliminated from the frequencies less than f-ca and the frequencies greater than f+ca. The threshold value may be set in advance by the user. The band limiting section 412 may use a different threshold value for each predetermined frequency range.

The band limiting section 412 may normalize the spectrum by dividing the level of each frequency component in the spectrum by the level of the frequency component of the carrier frequency. As a result of dividing the level of the sideband frequency components by the level of the carrier frequency, the carrier-power-to-sideband-noise ratio, i.e. the phase noise, is obtained.

Figure 13:
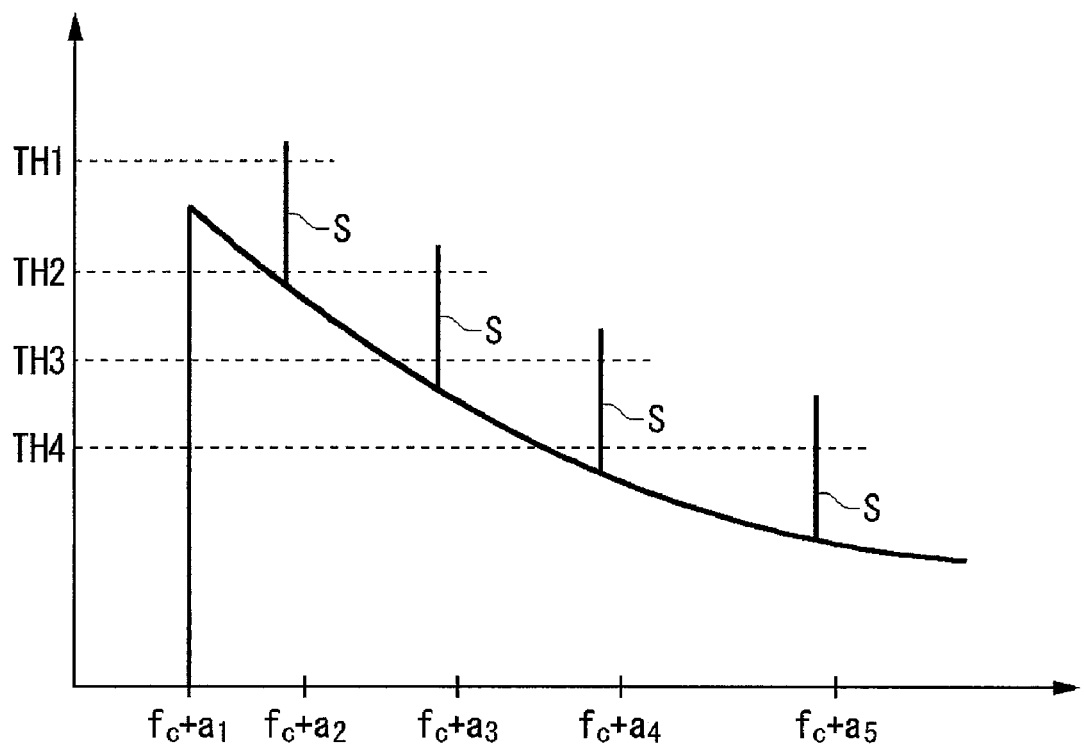
FIG. 13 shows examples of threshold values supplied to the band limiting section 412.

FIG. 13 shows examples of threshold values supplied to the band limiting section 412. The band limiting section 412 of the present embodiment is supplied with a different threshold value for each frequency range, as described above. For example, a threshold value TH1 is supplied for the frequency range from fc+a1 to fc+a2, a threshold value TH2 is supplied for the frequency range from fc+a2 to fc+a3, a threshold value TH3 is supplied for the frequency range from fc+a3 to fc+a4, and so on. These threshold values may decrease according to the frequency difference aN of the carrier frequency. As another example the band limiting section 412 may use threshold values that correspond to an average value of the level of the frequency component in each frequency range.

As yet another example, the band limiting section 412 may use the smoothed spectra to generate the threshold value for each frequency range. For example, the band limiting section 412 sets the threshold value at each frequency range to be a value obtained by adding a predetermined offset value to the average value of the level of the smoothed spectra at the corresponding frequency range. The band limiting section 412 may use the generated threshold values to remove the prescribed frequency components from the smoothed spectra, as described above.

Through this process, the deterministic noise components having peaks at prescribed frequencies can be removed. The jitter calculating section 410 can then calculate the jitter based on the spectrum output by the band limiting section 412 to obtain the random jitter of the signal under measurement.

Figure 14:
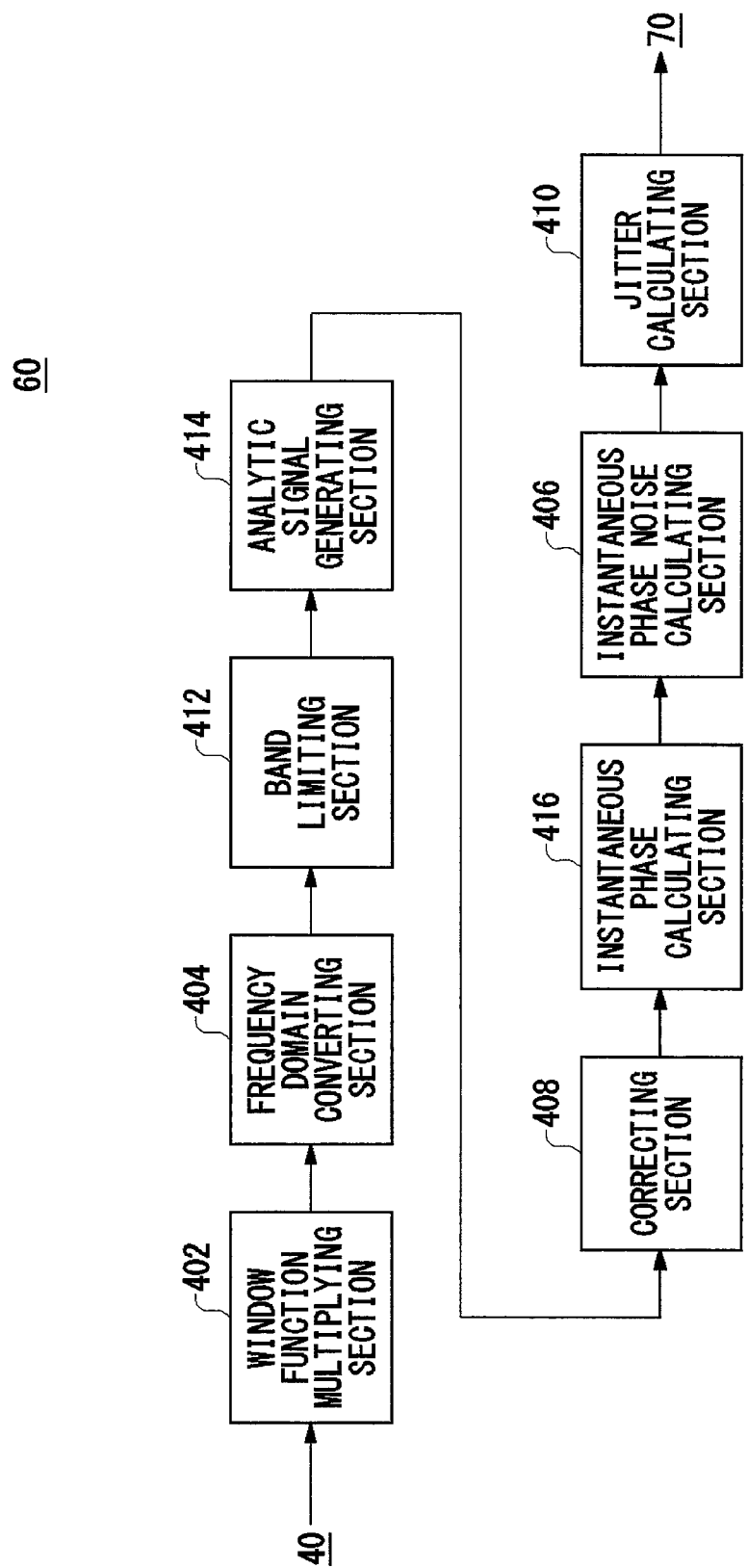
FIG. 14 shows another exemplary configuration of the digital signal processing section 60.

FIG. 14 shows another exemplary configuration of the digital signal processing section 60. The digital signal processing section 60 of the present embodiment differs from the digital signal processing section 60 described in FIG. 5 and FIG. 6 in regards to the positioning of the correcting section 408. In the present embodiment, the correcting section 408 is provided between the analytic signal generating section 414 and the instantaneous phase calculating section 416. The correcting section 408 corrects the analytic signal generated by the analytic signal generating section 414 and inputs the corrected analytic signal to the instantaneous phase calculating section 416. As with the previous configurations, this configuration enables correction of the calculation error in the instantaneous phase noise, the jitter, or the like caused by the multiplication by the window function during the Fourier transform.

Figure 15:
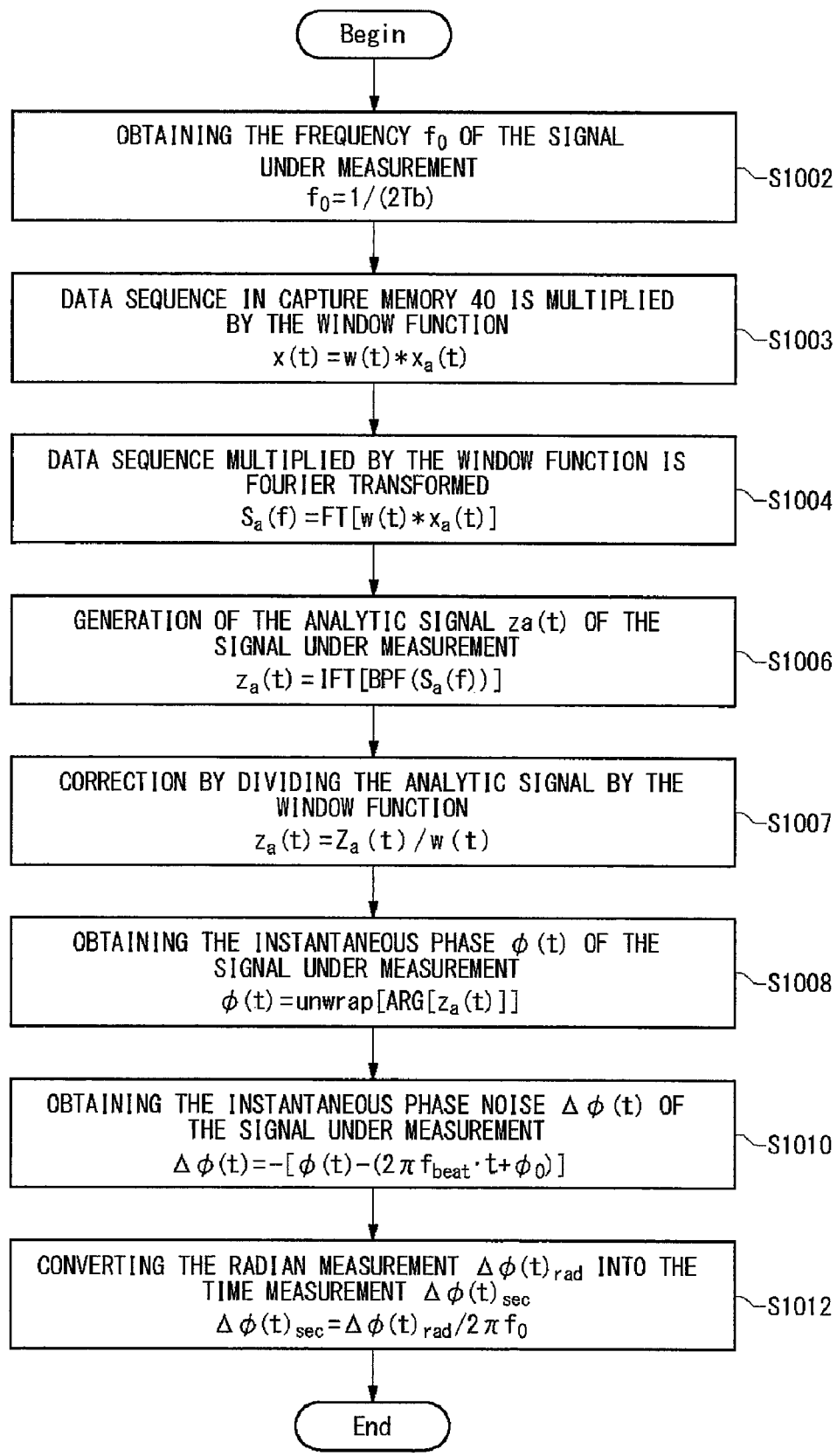
FIG. 15 is a flow chart showing an exemplary operation of the digital signal processing section 60 described in FIG. 14.

FIG. 15 is a flow chart showing an exemplary operation of the digital signal processing section 60 described in FIG. 14. The processes from S1002 to S1006 in this embodiment may be identical to the processes from S1002 to S1006 in FIG. 7.

In the digital signal processing section 60 of the present embodiment, the analytic signal generating section 414 generates the analytic signal of the signal under measurement, after which the correcting section 408 corrects the analytic signal (S1007). The correcting section 408 may correct the analytic signal za(t) by dividing both the real part and the imaginary part of the analytic signal za(t) by the window function w(t). In this way, the correcting section 408 can correct the amplitude-modulated component of the analytic signal caused by amplitude modulating the data sequence of the signal under measurement with the window function.

The digital signal processing section 60 executes the processes of S1008, S1010, and S1012 described in FIG. 7. As with the previous process, this process enables correction of the calculation error in the instantaneous phase noise, the jitter, or the like caused by the multiplication by the window function during the Fourier transform. Furthermore, as described in FIGS. 12 and 13, the band limiting section 412 may remove the frequency components of the deterministic noise from the spectrum output by the frequency domain converting section 404.

Figure 16:
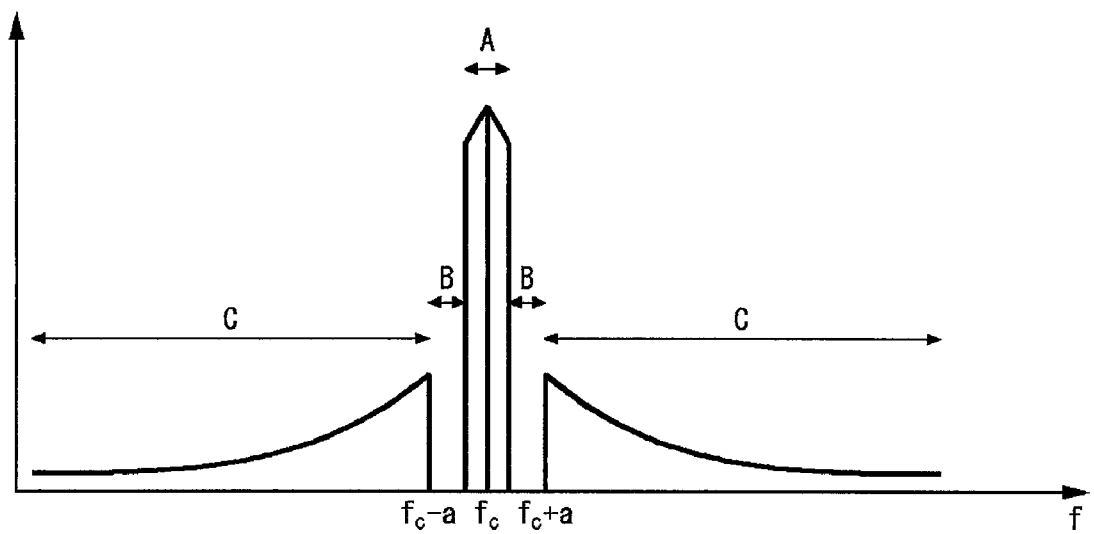
FIG. 16 shows an exemplary operation of the band limiting section 412 included in the digital signal processing section 60 described in FIG. 14.

FIG. 16 shows an exemplary operation of the band limiting section 412 included in the digital signal processing section 60 described in FIG. 14. As described in FIG. 12B, the band limiting section 412 removes the frequency components within the prescribed frequency range, i.e. fc−a to fc+a, in the sideband of the carrier frequency fc of the signal under measurement.

At this time, in the example of FIG. 12B, only the frequency component of the carrier frequency fc remains. The band limiting section 412 of the present embodiment, however, passes the frequency components within a first frequency range (Δ) included in the carrier frequency fc. The first frequency range (Δ) includes at least the frequency component of the carrier frequency and the frequency components adjacent to the frequency component of the carrier frequency on both sides. Here, the frequency components adjacent to the frequency component of the carrier frequency on both sides may be components having frequencies closest to the carrier frequency on both sides, from among the frequencies discretized by the discrete Fourier transform. The first frequency range (Δ) is preferably set as a frequency having an upper and lower limit substantially centered on the carrier frequency fc.

As shown in FIG. 16, the band limiting section 412 removes the frequency components in second frequency ranges (B) outside of the first frequency range (Δ). The second frequency ranges (B) are located on both sides of the first frequency range (Δ). The second frequency ranges (B) preferably have substantially identical widths.

As shown in FIG. 16, the band limiting section 412 passes the frequency components in third frequency ranges (C) outside of the second frequency ranges (B). The third frequency ranges (C) are located on the outsides of the second frequency ranges (B). The third frequency ranges (C) preferably have substantially identical widths. The first frequency range (A), the second frequency ranges (B), and the third frequency ranges (C) are set by the user based on the jitter frequency to be measured, or the like.

As shown in the process of S1003 in FIG. 15, multiplying the data sequence by the window function causes a frequency component to occur on both sides of the carrier frequency in the spectrum in the frequency domain. Because of these frequency components, the analytical signal generated from the band-limited spectrum, as described above, suffers from side effects due to the multiplication by the window function. Therefore, the instantaneous phase noise and the jitter of the signal under measurement can be more accurately calculated when the analytic signal is corrected by being divided by the window function.

As described in relation to FIG. 12B, the envelop curve |za(t)| of the analytic signal za(t) is constant in the process that leaves only the carrier frequency component. Here, the envelope may be a line connecting the peaks of the waveform of the analytic signal. In other words, in the process that leaves only the carrier frequency component, the envelope |za(t)| of the analytic signal za(t) is not affected by the multiplication by the window function.

Therefore, in the process described in relation to FIG. 12B, the affect of the multiplication by the window function cannot be corrected even if the analytical signal is divided by the window function. But since the effect of multiplying by the window function remains in the phase information of the analytic signal, this effect can be corrected by dividing the instantaneous phase noise calculated based on the analytic signal by the window function, as described in relation to FIG. 7.

Figure 17:
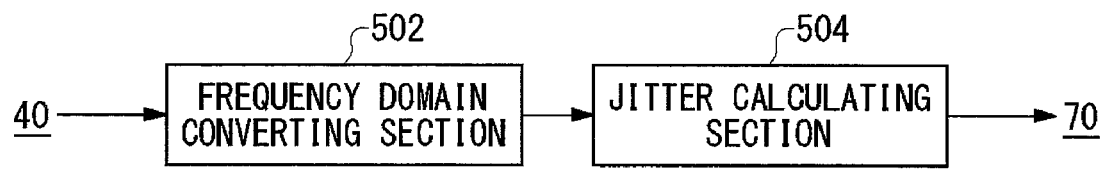
FIG. 17 shows another exemplary configuration of the digital signal processing section 60.

FIG. 17 shows another exemplary configuration of the digital signal processing section 60. The digital signal processing section 60 of the present embodiment includes a frequency domain converting section 502 and a jitter calculating section 504. The frequency domain converting section 502 may be the same as the frequency domain converting section 404 described in relation to FIG. 5. The frequency domain converting section 502 converts the data sequence stored in the capture memory 40 into a spectrum in the frequency domain. The jitter calculating section 504 calculates the jitter amplitude of the signal under measurement based on the levels of the frequency components in a predetermined frequency range of the spectrum generated by the frequency domain converting section 502.

Figure 18:
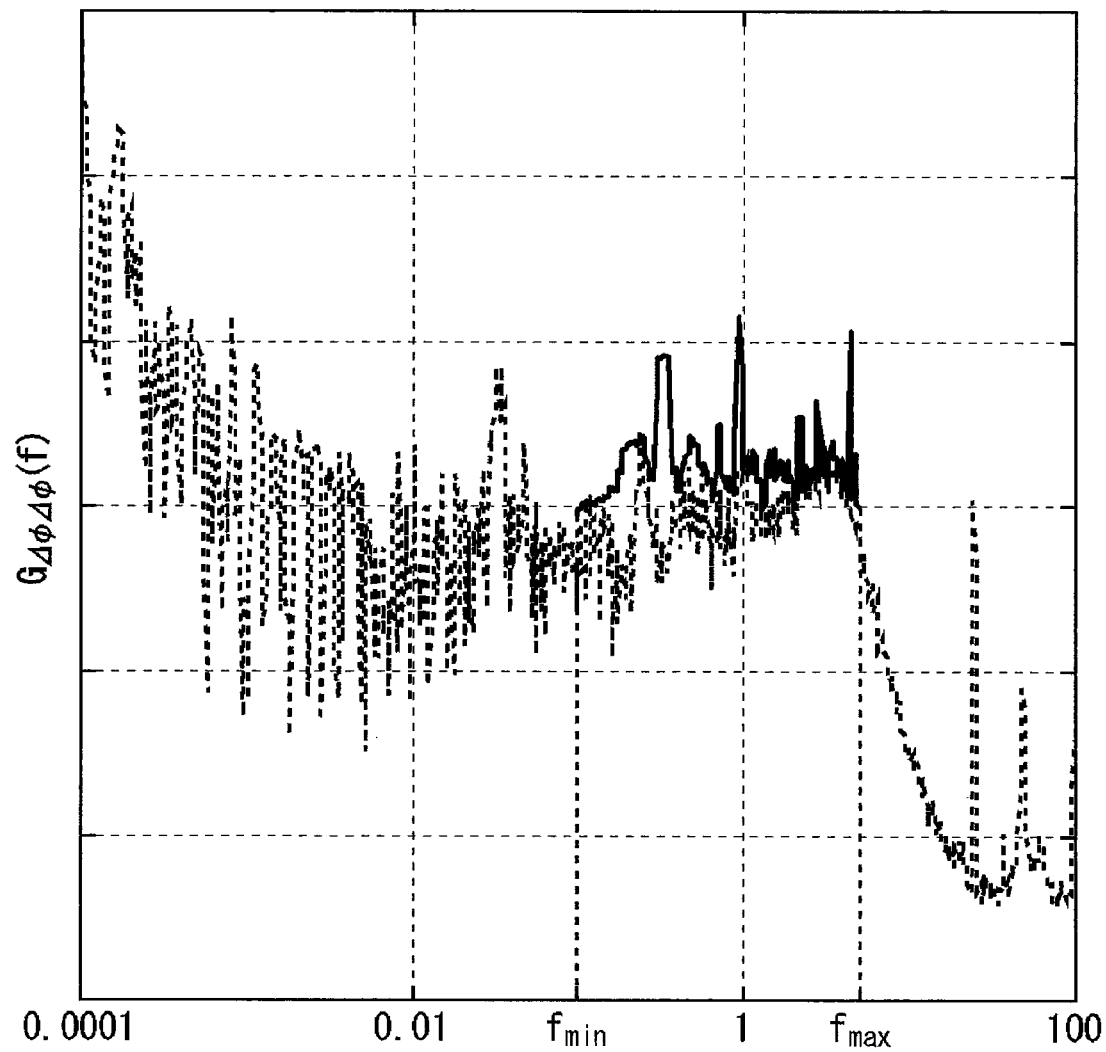
FIG. 18 shows an exemplary sideband of the spectrum output by the frequency domain converting section 502.
Figure 19:
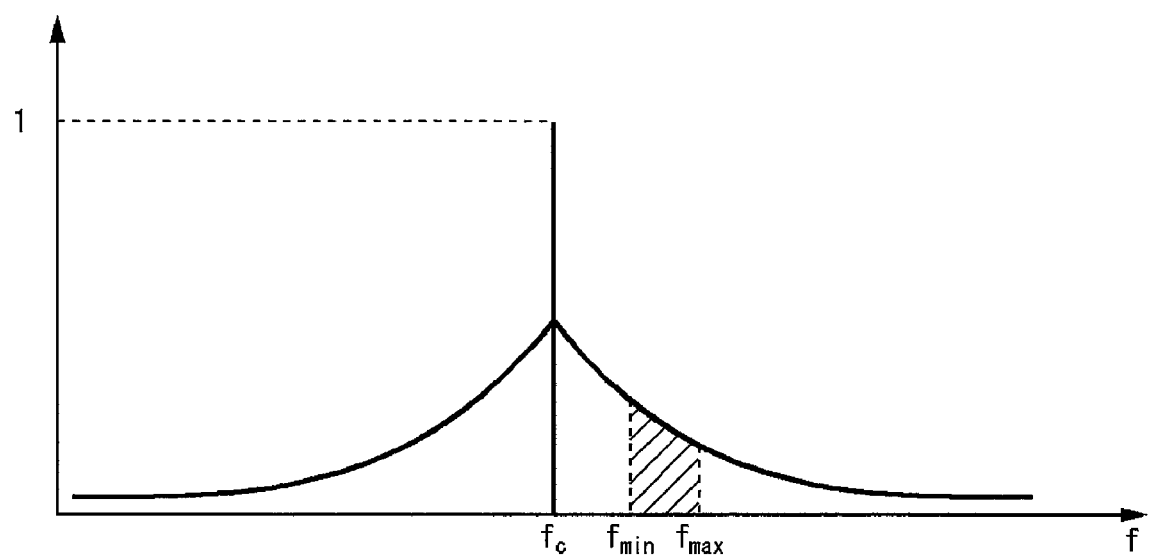
FIG. 19 shows an exemplary carrier and both sidebands of the spectrum output by the frequency domain converting section 502.

FIGS. 18 and 19 show examples of the spectrum output by the frequency domain converting section 502. The jitter calculating section 504 calculates a jitter value of the signal under measurement based on the levels of the frequency components in the prescribed frequency range, i.e. from fmin to fmax, of the spectrum.

At this time, the jitter calculating section 504 may normalize the spectrum by dividing the level of each frequency component in the spectrum by the level of the frequency component of the carrier frequency. The jitter calculating section 504 may calculate the jitter amplitude of the signal under measurement based on a value obtained by integrating the level of the frequency components in the prescribed frequency range, i.e. from fmin to fmax. For example, the jitter calculating section 504 calculates the amplitude $TJ_{RMS}[sec]$ of the timing jitter of the signal under measurement using the expression below.

$$TJ_{RMS} = \frac{\left(\int_{fmin}^{fmax} \log_{10}(f - f_c) \frac{G_{\Delta\phi\Delta\phi}(f)}{\Delta f \cdot enob} df\right)^{0.5}}{2\pi f_c}$$

It should be noted that $\Delta f$ is a frequency resolution designated by the product of Tb and FFT, i.e. the number of data on which the FFT process is performed. Also, $G_{\Delta\phi\Delta\phi}(f)$ represents a spectrum, and enob represents an equivalent noise bandwidth designated by the window function.

The above process enables the amplitude of the timing jitter of the signal under measurement to be measured. The jitter calculating section 504 may integrate the level of the frequency components in the prescribed frequency range after normalizing the spectrum supplied thereto, as described in relation to FIG. 12B. In the example relating to FIG. 12B, the inverse Fourier transform is performed on the spectrum before normalization, but in the process of the present embodiment, the jitter is measured by integrating the normalized spectra. In this case, the amplitude of the random component of the timing jitter can be measured.

FIG. 18 shows an exemplary sideband of the spectrum output by the frequency domain converting section 502. In FIG. 18, the dotted line represents the spectrum of the signal under measurement measured by a conventional spectrum analyzer. As described above, the jitter calculating section 504 integrates the spectra within the prescribed range indicated by the solid line in FIG. 18. This integration may be performed after normalization of the spectra, as described above.

FIG. 20 shows examples of jitter values measured by the measurement apparatus 10 described in FIGS. 1 to 19. FIG. 20 shows measurement results obtained by the measurement apparatus 10 described in FIGS. 17 to 19 contrasted with measurement results obtained by a conventional spectrum analyzer. FIG. 20 also shows measurement results obtained by the measurement apparatus 10 described in FIGS. 1 to 16 contrasted with measurement results obtained by a conventional oscilloscope. In FIG. 20, the "Rate" indicates the bit rate of the signal under measurement, and fj indicates the upper limit of the frequency of the jitter, in the same manner as fmax.

As shown in FIG. 20, each measurement result of the measurement apparatus 10 closely matches a measurement result from the conventional spectrum analyzer or the conventional oscilloscope. Therefore, by using the measurement apparatus 10 of the present invention, the jitter amplitude of the signal under measurement can be accurately measured using a simple configuration.

Figure 21:
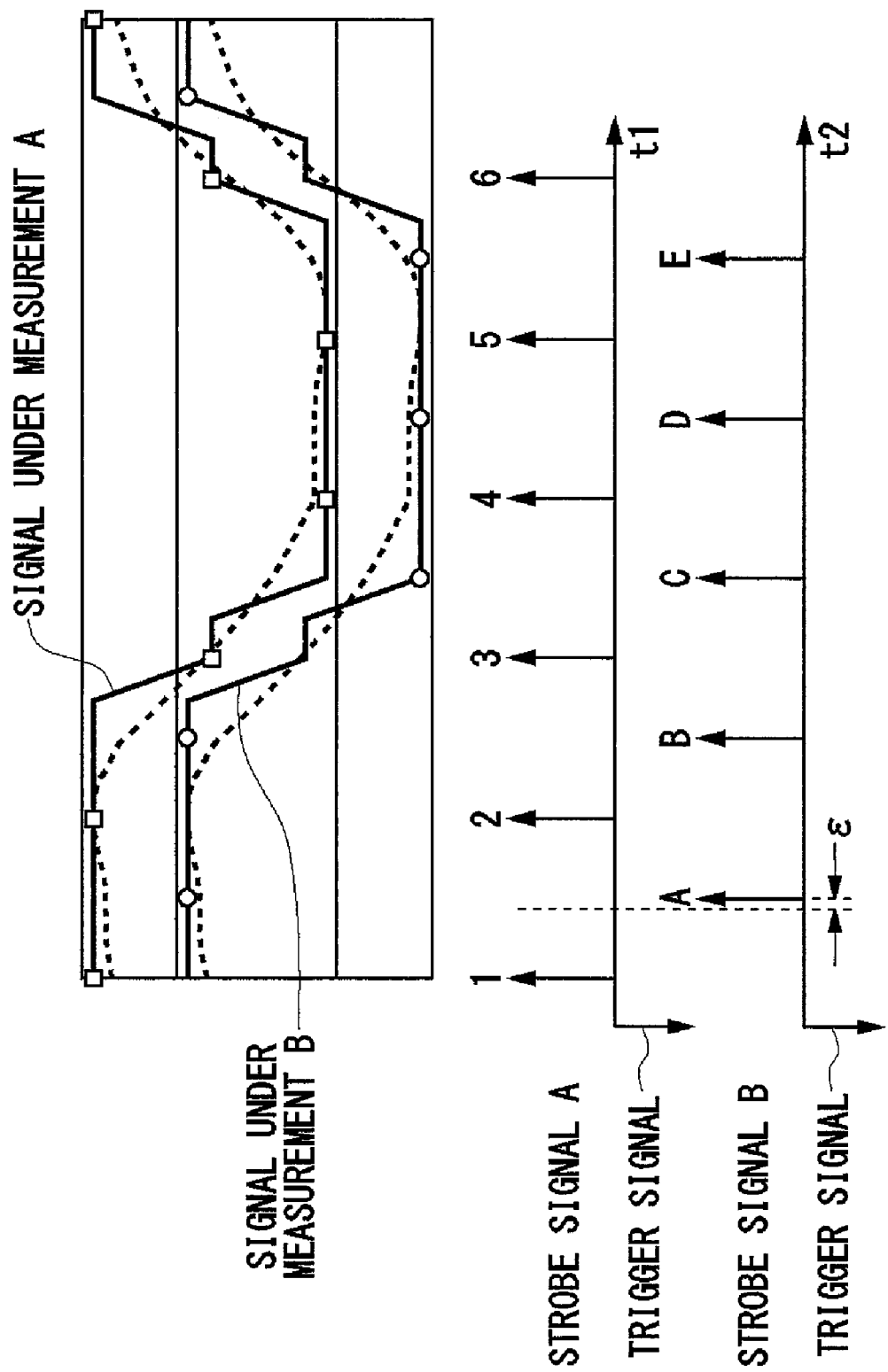
FIG. 21 shows an exemplary operation of the level comparing section 520 and the strobe timing generator 30.

FIG. 21 shows an exemplary operation of the level comparing section 520 and the strobe timing generator 30. The measurement apparatus 10 according to the present embodiment samples the signal under measurement at the frequency of an integer multiple of the generated strobe frequency using the equivalent-time sampling approach by repeatedly receiving the signal under measurement and shifting the phase of the strobe with respect to the signal under measurement. In the present embodiment, the measurement apparatus 10 receives repetitions of the same signal under measurement twice, referred to hereinafter as signal under measurement A and signal under measurement B.

First, the strobe timing generator 30 generates a strobe signal A in which strobes are arranged at equal time intervals for the signal under measurement A in synchronization with (or asynchronous to) the period of the signal under measurement or the test rate. Here, the strobe timing generator 30 generates a strobe to be input to the level comparing section 520 on the basis of the phase of a trigger signal in synchronization with the signal under measurement. For example, the strobe timing generator 30 starts to output the strobe signal A on the basis of the trigger signal having a predetermined phase for the signal under measurement after a predetermined offset time lapses.

Then, the strobe timing generator 30 starts to output a strobe signal B for the signal under measurement B which is received following the signal under measurement A also on the basis of the trigger signal after a predetermined offset time lapses. In the strobe signal B, strobes are arranged at the same time intervals as in strobe signal A.

Here, the phase of the trigger signal being the basis of the signal under measurement A is substantially the same as the phase of the trigger signal being the basis of the signal under measurement B, and each strobe interval of the strobe signal A is also the same as that of the strobe signal B. Additionally, the offset of the strobe signal A from the trigger signal and the offset of the strobe signal B may be different by substantially half of a strobe interval. That is, when the strobe signal A and the strobe signal B are overlapped, the strobes in strobe signal A and the strobes in strobe signal B are alternately arranged at substantially equal intervals.

By generating such strobe signals A and B, one level comparing section 520 can equivalently sample with the frequency twice as high as the frequency at which the strobes are generated. The strobe timing generator 30 may include an oscillator circuit that generates strobes arranged at a predetermined time intervals and a delay circuit that delays an output from the oscillator circuit. In this case, the oscillator circuit sequentially generate the strobe signal A and the strobe signal B. Then, the delay circuit sequentially delays each strobe in accordance with an appropriate offset for each strobe.

Hereinbefore, the present embodiment has been described by means of the strobe signal A and strobe signal B, however, the strobe timing generator 30 may sequentially generate even more strobe signals in another embodiment. By sequentially changing the offsets of the strobes, an equivalent time measurement can be performed with high frequency.

Figure 22:
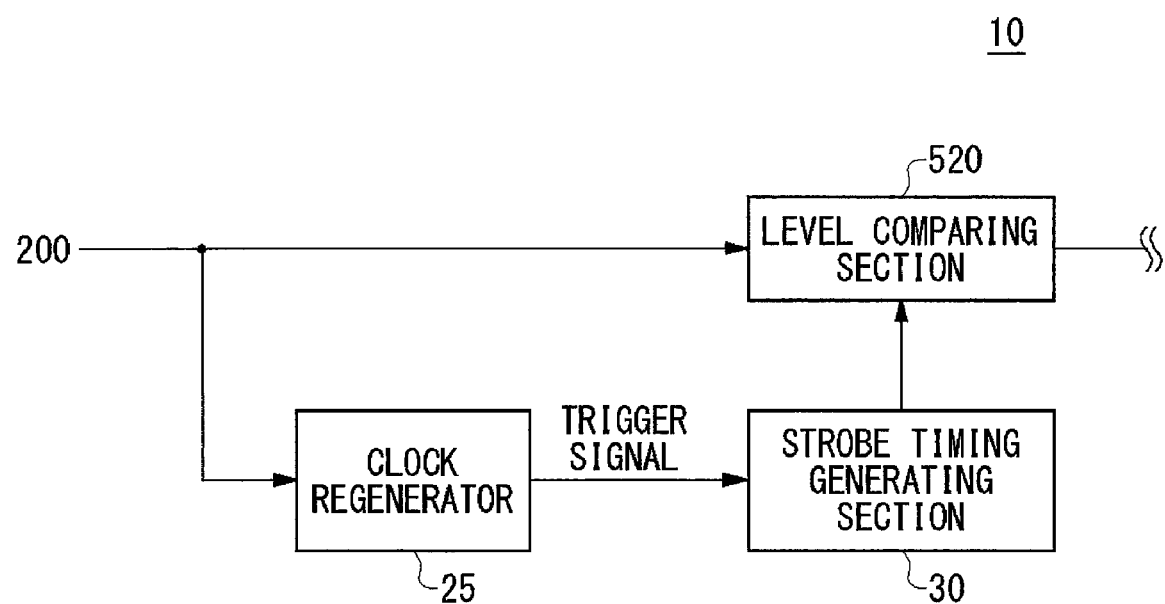
FIG. 22 shows another example of the measurement apparatus 10.

FIG. 22 shows another example of the measurement apparatus 10. The measurement apparatus 10 according to the present embodiment further includes a clock regenerator 25 in addition to the components of the measurement apparatus 10 described with reference to FIG. 1. The other components are the same as those of the measurement apparatus 10 described with reference to FIGS. 1 to 21, so that the description is omitted. The clock regenerator 25 generates a recovered clock in synchronization with a signal under measurement based on the signal under measurement, and inputs the recovered clock to the strobe timing generator 30 as a trigger signal. Thus, the timing at starting to generate the strobe A and the strobe B described in FIG. 21 can be controlled, so that the strobe signal A and the strobe signal B having a predetermined phase difference therebetween can be generated.

Figure 23:
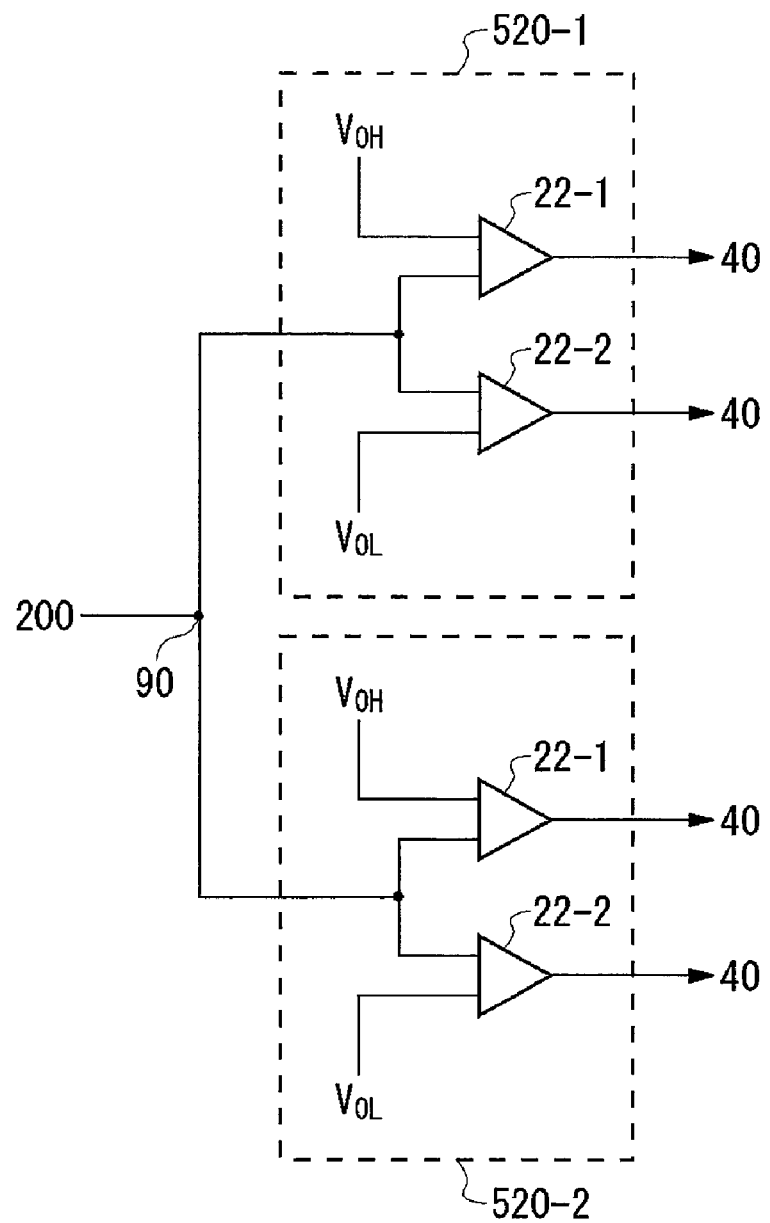
FIG. 23 shows another exemplary configuration of the level comparing section 520.

FIG. 23 shows another exemplary configuration of the level comparing section 520. The measurement apparatus 10 according to the present embodiment includes two level comparing sections 520-1 and 520-2 (hereinafter generically referred to as level comparing sections 520). Each level comparing section 520 is the same as the level comparing section 520 described in FIG. 3A. Additionally, each level comparing section 520 receives a first reference voltage VOH and a second reference voltage VOL which are the same. Moreover, a signal under measurement is split and input to each level comparing section 520. The measurement apparatus 10 may further include an input section 90 that splits a signal under measurement and inputs the same to each level comparing section 520 in parallel. In this case, the strobe timing generator 30 inputs strobes having phases different from each other to each level comparing section 520. For example, the strobe timing generator 30 inputs the strobe signal A shown in FIG. 21 to the level comparing section 520-1 and also inputs the strobe signal B shown in FIG. 21 to the level comparing section 520-2. Thereby an interleaved-sampling can be performed by using two level comparing sections 520, so that a signal under measurement can be measured with the frequency twice as high as the frequency at which the strobe signals are generated.

Figure 24:
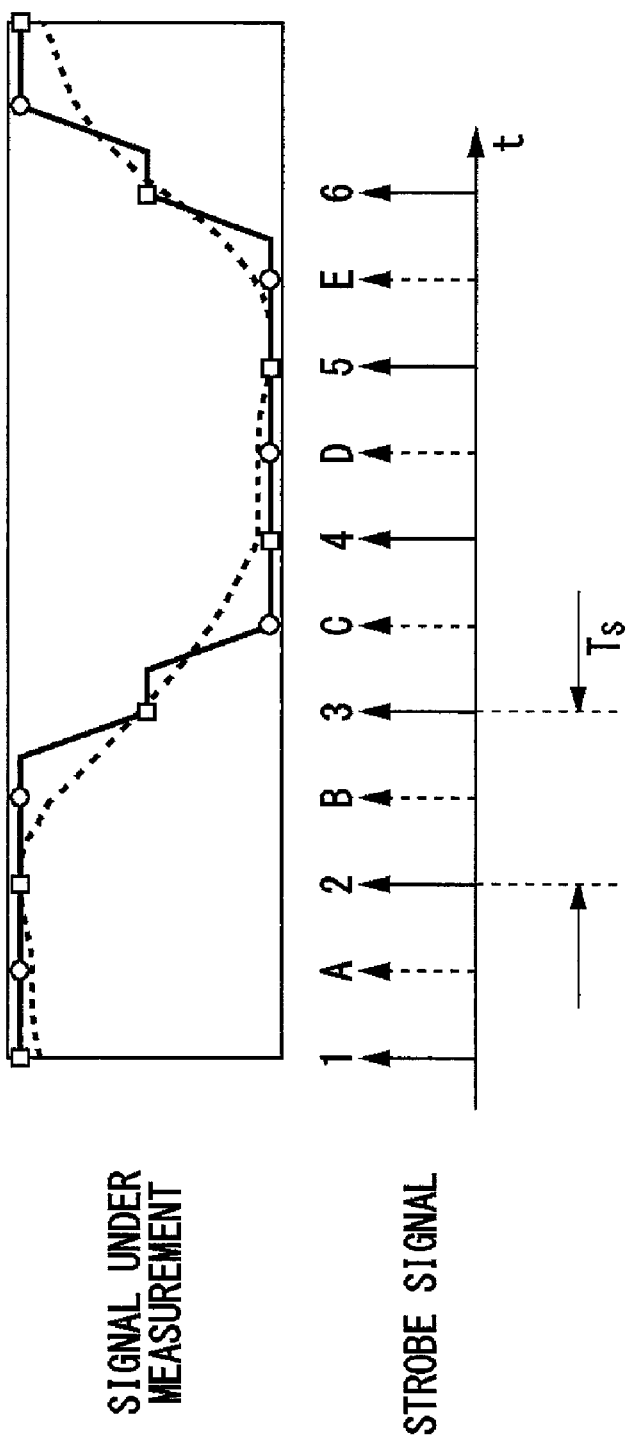
FIG. 24 shows an exemplary operation of the level comparing section 520 and the strobe timing generator 30 shown in FIG. 23.

FIG. 24 shows an exemplary operation of the level comparing section 520 and the strobe timing generator 30 shown in FIG. 23. As described above, the strobe timing generator 30 generates strobe signal A (1, 2, 3 . . . ) and the strobe signal B (A, B, C . . . ) and inputs the same to each level comparing section 520.

The capture memory 40 aligns comparison results of two level comparing sections 520 in accordance with the phases of the corresponding strobe signals and stores therein the same. For example, the capture memory 40 sequentially aligns the comparison result corresponding to each of the strobe 1, the strobe A, the strobe 2, the strobe B . . . shown in FIG. 14 and stores therein the same. In this case, since the strobe signal A and the strobe signal B are generated simultaneously, it is not necessary to separately generate each strobe signal on the basis of the trigger signal. It is preferred that a group of strobes obtained by overlapping the strobe signal A and the strobe signal B are arranged at substantially equal time intervals. For example, the strobe timing generator 30 may have a circuit that generates the strobe signal A and a circuit that generates the strobe signal B by delaying the strobe signal A.

In the present embodiment, the measurement apparatus 10 includes two level comparing sections 520, but the measurement apparatus 10 may include more level comparing sections 520 in another embodiment. In this case, a measurement with higher frequency can be performed by changing the offset of the strobe input to each level comparing section 520.

However, with respect to the sampling method described with reference to FIGS. 21 to 24, if there is any error between the phase of any strobe and a predetermined phase, the error could be shown in the measurement result. Therefore, it is preferred that any measurement error due to the error of the phase of the strobe, i.e. the error of the sampling timing, is corrected.

Figure 25:
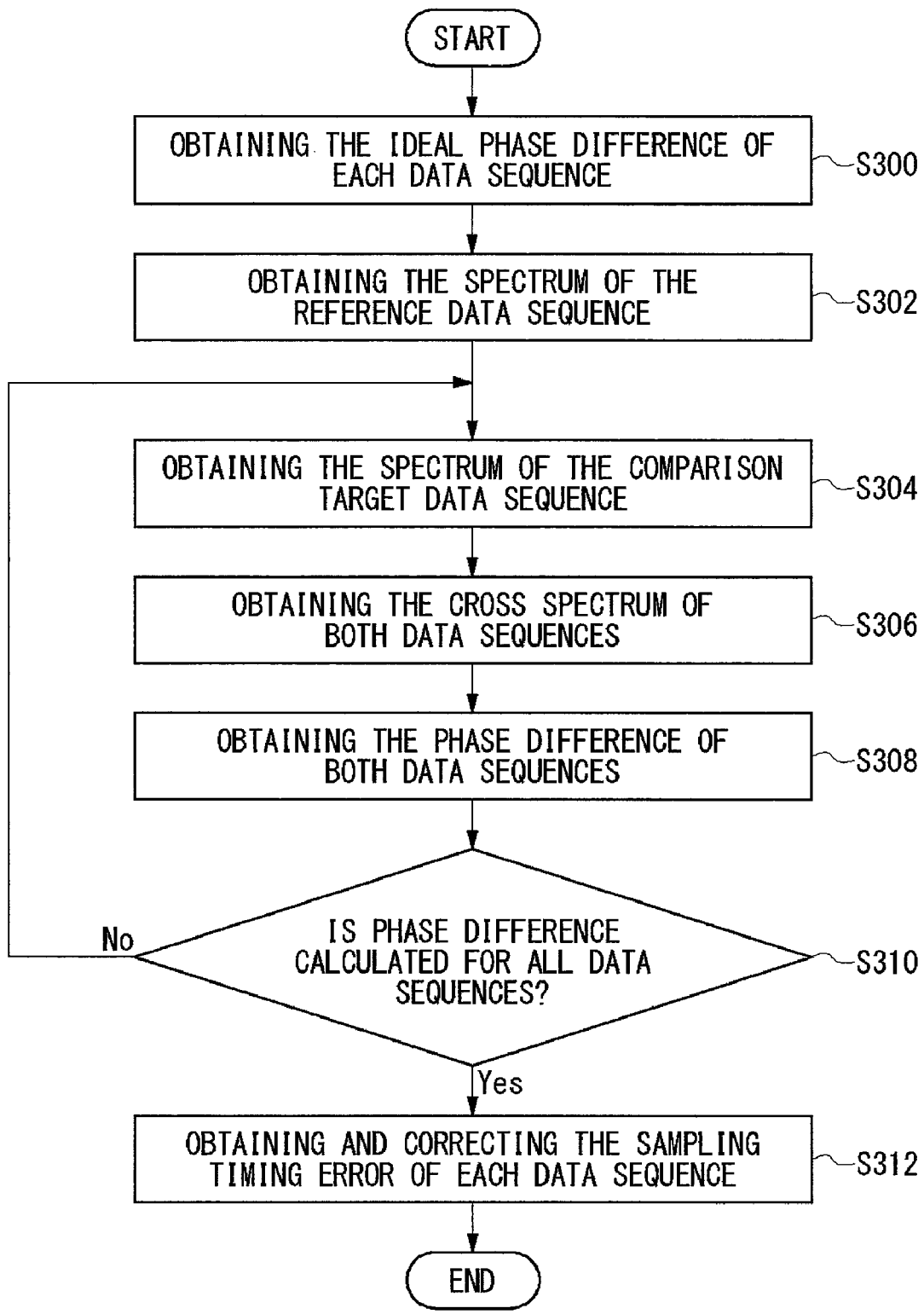
FIG. 25 is a flowchart showing an example of a method for correcting error of a sampling timing.
Figure 26:
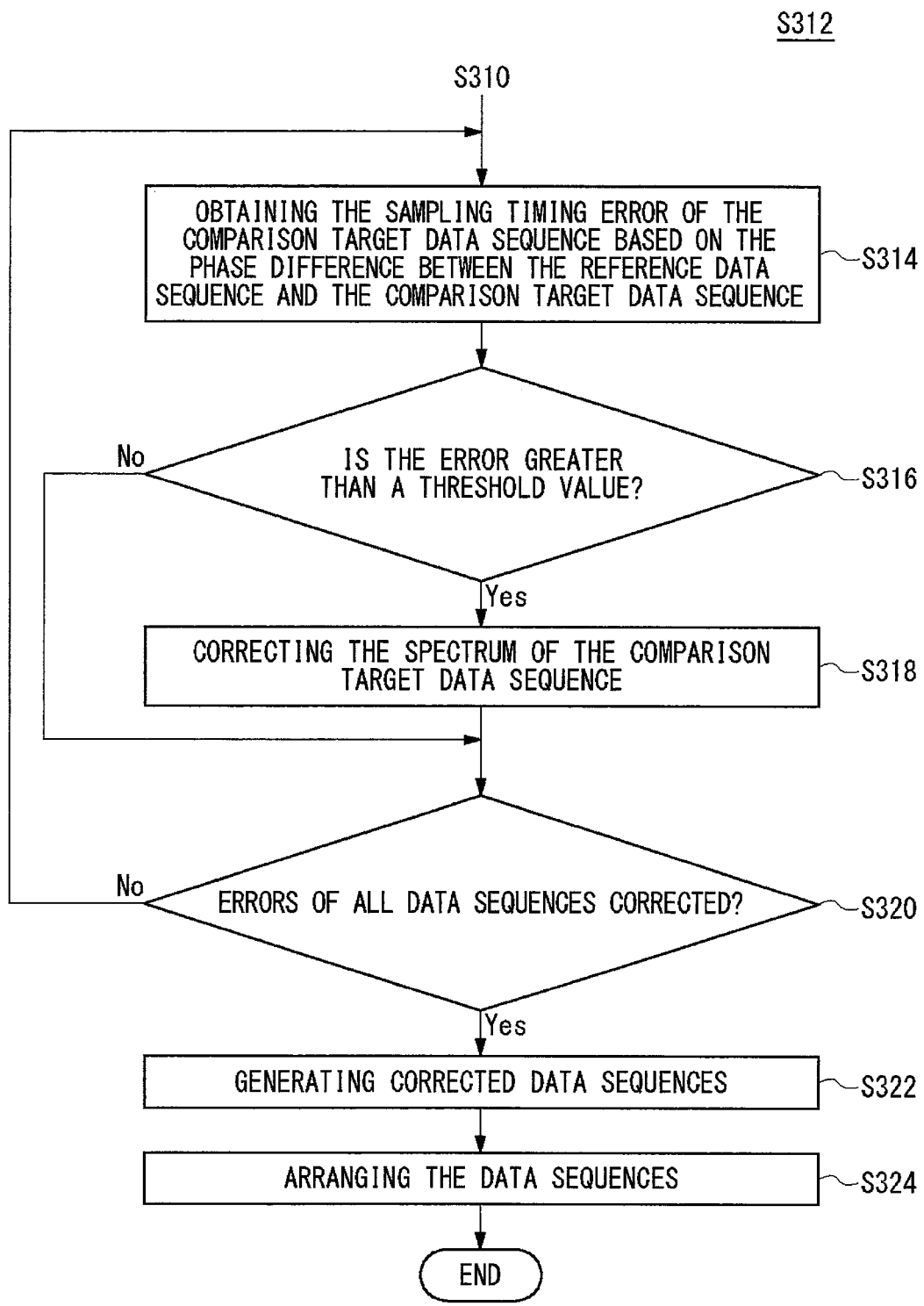
FIG. 26 is a flowchart showing an example of a method for correcting error of a sampling timing.

FIGS. 25 and 26 are flowcharts showing examples of methods for correcting error of a sampling timing. The correction may be performed by the digital signal processing section 60. First, an ideal value of the phase difference between the sampling timing for each data sequence sampled in accordance with each strobe signal is calculated in the ideal phase difference calculating step S300. For example, the phase difference is calculated as $2\pi(\Delta t/T)$, where $\Delta t$ is the ideal value of the difference between the offset for each strobe, and T is the average period of the signal under measurement.

Next, at the reference spectrum calculating step S302, the digital signal processing section 60 selects any data sequence among a plurality of data sequences as a reference, and calculates the spectrum of the data sequence. The spectrum can be calculated by performing a fast Fourier transform on the data sequence.

Next, at the comparison spectrum calculating step S304, a data sequence different from the reference data sequence is selected and the spectrum of the data sequence is calculated. The spectrum can be calculated by performing a fast Fourier transform on the selected data sequence.

Next, at the cross spectrum calculating step S306, the digital signal processing section 60 calculates the cross spectrum of the spectrum of the reference data sequence and the spectrum of the data sequence to be compared. The cross spectrum can be calculated by complex-number multiplying the complex conjugate spectrum of the reference data sequence by the spectrum of the data sequence to be compared.

Next, at the phase difference calculating step S306, the phase difference between the reference data sequence and the data sequence to be compared is calculated. The phase difference can be calculated based on the cross spectrum calculated in S306. That is, the phase component of the cross spectrum indicates the phase difference between the reference data sequence and the data sequence to be compared.

Here, the phase difference is calculated by means of the cross spectrums of two data sequences in step S304 and step S306, but the phase difference may be calculated by means of an other method. For example, the phase difference may be calculated based on the cross correlation between the spectrums of two data sequences.

Next, the digital signal processing section 60 judges whether the phase difference is calculated for each of the data sequences to be compared in S310. If there is any data sequence for which the phase difference from the reference data sequence has not been calculated, the processes from S304 to 306 are performed again on the data sequence.

If the phase difference has been calculated for each data sequence to be compared, the measurement error is corrected based on the phase difference between each data sequence to be compared, at the error correction step S312. For example, each data sequence is corrected based on the difference between the phase difference among each data sequence to be compared and the ideal phase difference calculated in S300.

FIG. 26 is a flowchart showing an example of processing in the error correction step S312. Firstly, a sampling timing error of the data sequence to be compared is calculated based on the phase difference between the reference data sequence and the data sequence to be compared at the timing error calculating step S314. The timing error can be calculated based on the ideal phase difference.

Next, at the comparison step S316, the digital signal processing section 60 judges whether the timing error is greater than a predetermined threshold value. When the timing error is less than or equal to the threshold value, the corresponding data sequence is not corrected, and the process shifts to S320. If the timing error is greater than the threshold value, the corresponding data sequence is corrected at the correction step S318. The data sequence may be corrected by shifting the phase of the spectrum of the data sequence based on the timing error.

Next, the digital signal processing section 60 judges whether the timing error is corrected for each of the data sequences. If there is any data sequence for which the timing error has not been corrected, the processes from S314 to S318 are performed again on the data sequence. If the timing error for each of the data sequence has been corrected, each data sequence for which the timing error is corrected is generated at the data sequence generating step S322. For example, a data sequence for which the timing error is corrected can be acquired by performing an inverse fast Fourier transform on the spectrum for each data sequence for which timing error is corrected.

Then, at the alignment step S324, each data sequence is aligned. For example, each piece of data is aligned according to the sampling timing for each data. Through the above-described processing, any measurement error due to the sampling timing error can be corrected. Therefore, the jitter can be accurately measured.

Figure 27:
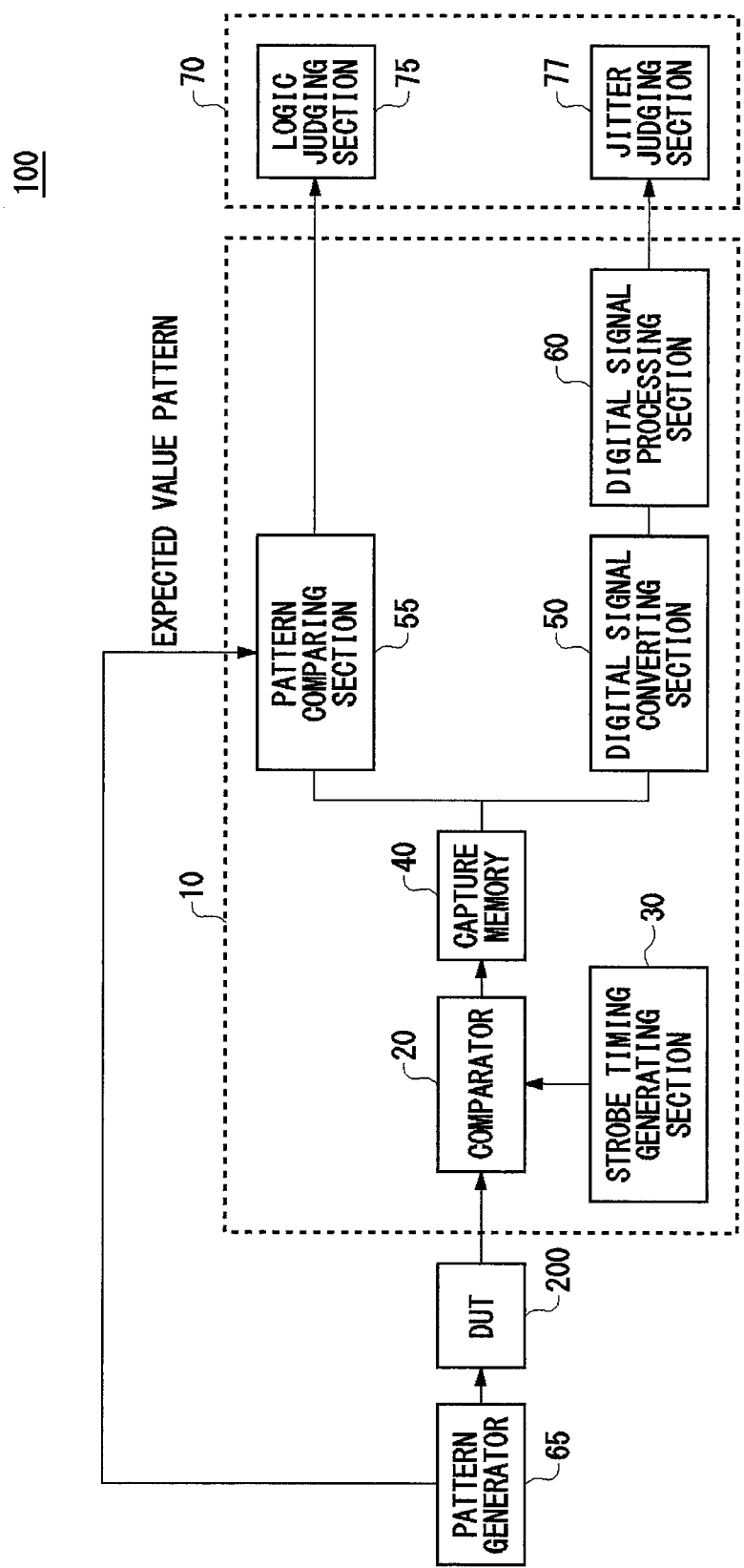
FIG. 27 shows another exemplary configuration of the test apparatus 100.

FIG. 27 shows another exemplary configuration of the test apparatus 100. The test apparatus 100 according to the present embodiment has a function to perform a function test on the device under test 200, in addition to the function to perform the jitter test performed by the test apparatus 100 described with reference to FIGS. 1 to 26.

Additionally, the test apparatus 100 according to the present embodiment further includes a pattern generator 65 and a pattern comparing section 55, in addition to the components of the test apparatus 100 described with reference to FIGS. 1 to 26. The judging section 70 includes a logic judging section 75 and a jitter judging section 77. Each of the other components has the function and the configuration of the components with the reference numerals the same as those of the components described with reference to FIGS. 1 to 26.

When performing a functional test on the device under test, the pattern generator 65 inputs a test signal having a predetermined logic level to the device under test 200. The level comparing section 520 compares the voltage value of the signal under measurement output by the device under test 200 with a predetermined reference voltage at the provided strobe timing to detect the logic level of the signal under measurement.

At this time, the strobe timing generator 30 generates a strobe. When the functional test is performed, the strobe timing generator 30 generates the strobe in accordance with a test rate synchronized with the period of the signal under measurement. For example, the strobe timing generator 30 generates one strobe at the substantially central timing of each test rate. In this way, the level comparing section 520 detects the logic level for each period of the signal under measurement.

As described above, when a jitter test is performed, the strobe timing generator 30 may generate a strobe independent of the test rate. The strobe timing generator 30 has an oscillator circuit that generates a strobe, for example. When performing the functional test, the strobe timing generator 30 may control the operation of the oscillator circuit according to the test rate, but need not control the operation of the oscillator circuit according to the test rate when performing the jitter test. Additionally, the strobe timing generator 30 may include a first oscillator circuit that generates strobes for performing the functional test, and a second oscillator circuit that generates strobes for performing the jitter test. In this case, the operation of the first oscillator circuit is controlled by the test rate, and the second oscillator circuit operates independent of the test rate.

When the functional test is performed, the pattern comparator 55 compares whether the logic pattern of the signal under measurement given by the comparison result stored in the capture memory 40 matches a predetermined expected value pattern. The expected value pattern may be generated by the pattern generator 65 based on the logic pattern of the test signal.

The logic judging section 75 judges the whether the device under test 200 is defective based on the comparison result by the pattern comparing section 55. The digital signal converting section 50, the digital signal processing section and the judging section 70 may be a computing device with embedded software. In this case, the test apparatus 100 can perform a jitter test using a conventional test apparatus for a functional test without adding further hardware. Therefore, the device under test 200 can be tested at low cost.

Here, the circuits connected at a stage after the capture memory 40 may process the signal under measurement in non-real time fashion. For example, after a series of test signals are input to the device under test 200 and the logic values for the resulting series of signals under measurement is stored in the capture memory 40, the pattern comparing section 55, the digital signal converting section 50, the digital signal processing section 60, and the judging section 70 may process the data stored in the capture memory 40. The test apparatus 100 may input the subsequent series of test signals to the device under test 200 while the pattern comparing section 55, the digital signal converting section 50, the digital signal processing section 60, and the judging section 70 process the data.

Figure 28:
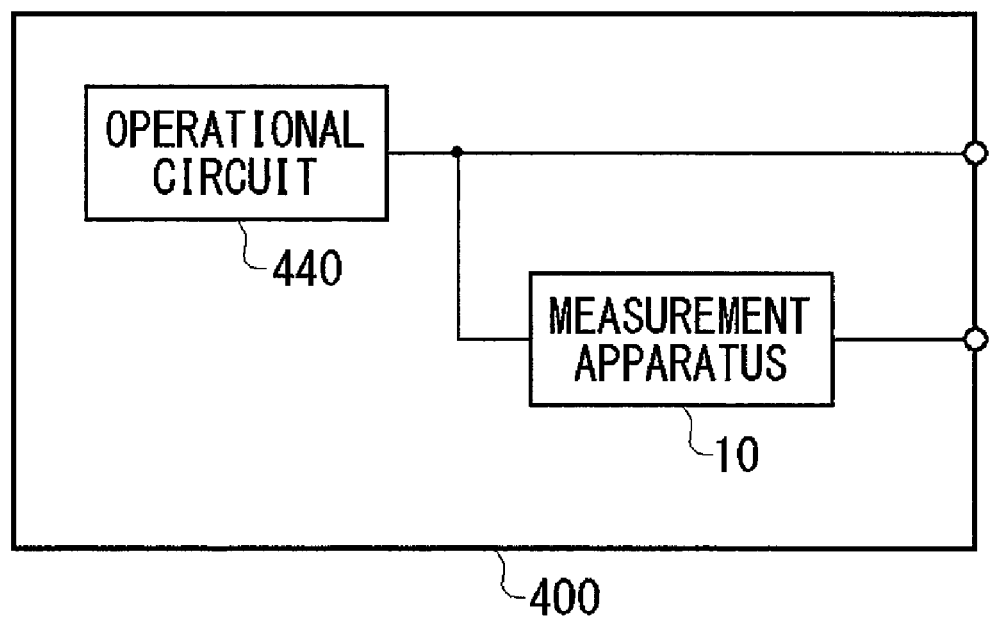
FIG. 28 shows an exemplary configuration of an electronic device 400 according to an embodiment of the present invention.

FIG. 28 shows an exemplary configuration of an electronic device 400 according to an embodiment of the present invention. The electronic device 400 includes an operational circuit 440 that generates a signal under measurement and a measurement apparatus 10. For example, the electronic device 400 may have a part of the configuration of the operational circuit 440 and the measurement apparatus 10 within a package formed of resin and ceramic.

The operational circuit 440 operates in response to a signal input from an external section and outputs a signal under measurement to the outside. The measurement apparatus 10 measures the signal under measurement output by the operational circuit 440. The measurement apparatus 10 may have the same configuration as that of the measurement apparatus 10 described with reference to FIGS. 1 to 26. Additionally, the measurement apparatus 10 may have the same configuration as that of the measurement apparatus 10 which will be described with reference to FIGS. 29 to 50.

Furthermore, the measurement apparatus 10 may have a portion of the configuration of the measurement apparatuses 10 described in FIGS. 1 to 26 and FIGS. 29 to 50. For example, the measurement apparatus 10 may include the level comparing section(s) 520 and the capture memory 40. In this case, the level comparing section(s) 520 receive(s) strobes described with reference to FIGS. 1 to 26 or FIGS. 29 to 50. The strobes may be provided from the outside, or may be generated within the electronic device 400.

If a strobe is generated within the electronic device 400, it is preferable that the electronic device 400 further include a strobe timing generator 30. As described with reference to FIGS. 1 to 26, the capture memory 40 stores the measurement result obtained by equivalently sampling the signal under measurement at high frequency.

Therefore, jitter in the electronic device 400 can be accurately measured by accessing the comparison result stored in the capture memory 40. In this case, it is not necessary for an external device to measure the high-speed signal under measurement, so that the cost of the external equipment can be reduced.

Figure 29:
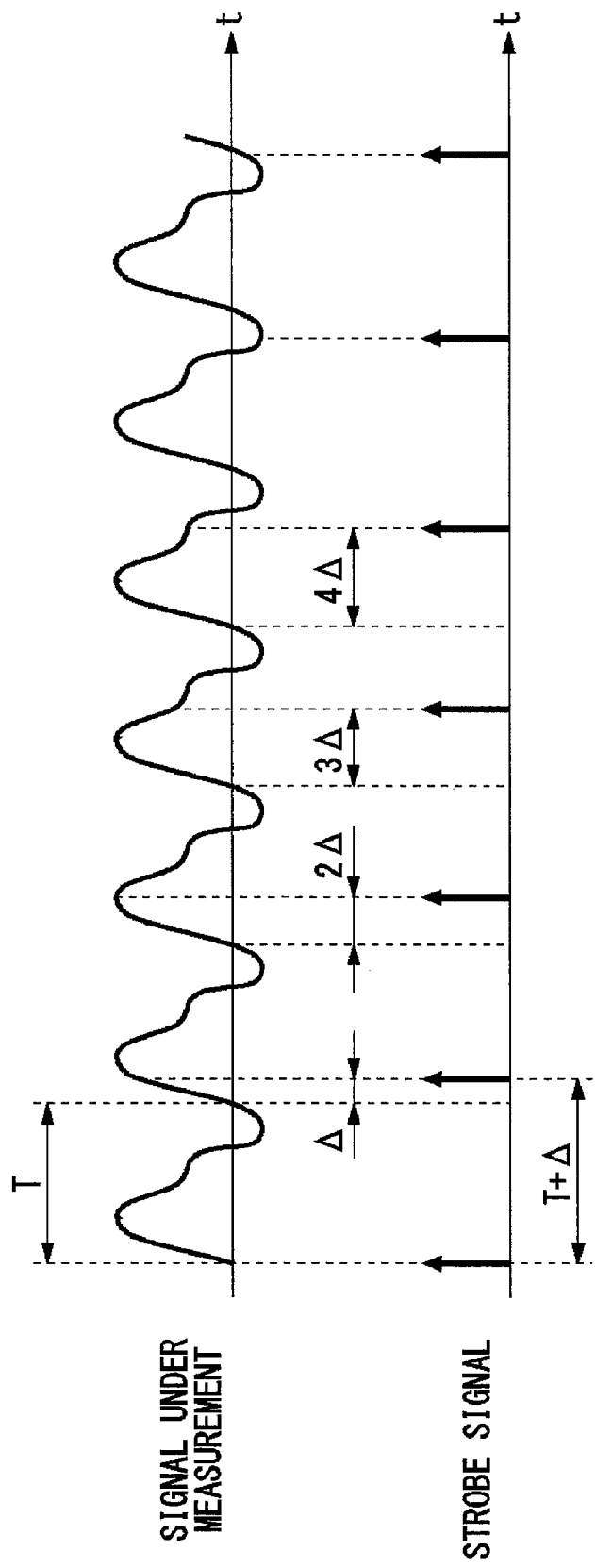
FIG. 29 shows an example of strobes generated by the strobe timing generator 30.

FIG. 29 shows an example of strobes generated by the strobe timing generator 30. The strobe timing generator 30 according to the present embodiment sequentially generates strobes with a period (T+Δ) different from the period (T) of the signal under measurement by a predetermined value (Δ). That is, the strobe timing generator 30 generates strobes whose phase relative to the phase of the signal under measurement is gradually changed. The signal under measurement in the present embodiment is a signal having substantially the same waveform for the period T.

Additionally, the strobe timing generator 30 according to the present embodiment may generate strobes with periods that do not satisfy the Nyquist theorem for the signal under measurement. That is, the strobe timing generator 30 according to the present embodiment undersamples the signal under measurement. For example, the strobe timing generator 30 generates strobes having periods larger than half of that of the signal under measurement. In the present embodiment, the strobe timing generator 30 generates strobes with periods larger than that of the signal under measurement at even intervals as shown in FIG. 29.

As described above, by gradually changing the relative phase between the strobes and the repetitive signal under measurement, the signal under measurement can be equivalently sampled with fine time resolution.

For example, in a case that the period of the signal under measurement is 400 ps and the period of the strobe signal is 405 ps, the phase of the strobe signal relative to that of the signal under measurement is changed by 5 ps for each period. The waveform is substantially the same for each period of the signal under measurement, so that the signal under measurement can be equivalently sampled at the period 5 ps.

The capture memory 40 may store therein the comparison results output by the level comparing section 520 in accordance with the strobes in chronological order. The digital signal converting section 50 may retrieve the comparison results at the predetermined number of points from among the comparison results stored in the capture memory 40, convert the retrieved comparison results to a digital signal, and input the digital signal to the digital signal processing section 60.

FIG. 30 shows an example of instantaneous phase noise Δϕ(t) calculated when the difference between the period of the signal under measurement and the period of the strobe signal (hereinafter referred to as period resolution) is changed. In the present embodiment, the instantaneous phase noise for each of the period resolutions (Δ) 5 ps, 10 ps, 20 ps, and 40 ps is indicated. When the period resolution (Δ) is changed as shown in FIG. 22, the waveform of the calculated instantaneous phase noise is changed. Therefore, it is preferable that the period resolution (Δ) is selected as a value of the same order as the random jitter value of the signal under measurement, the standard deviation, and the rms value.

Figure 31:
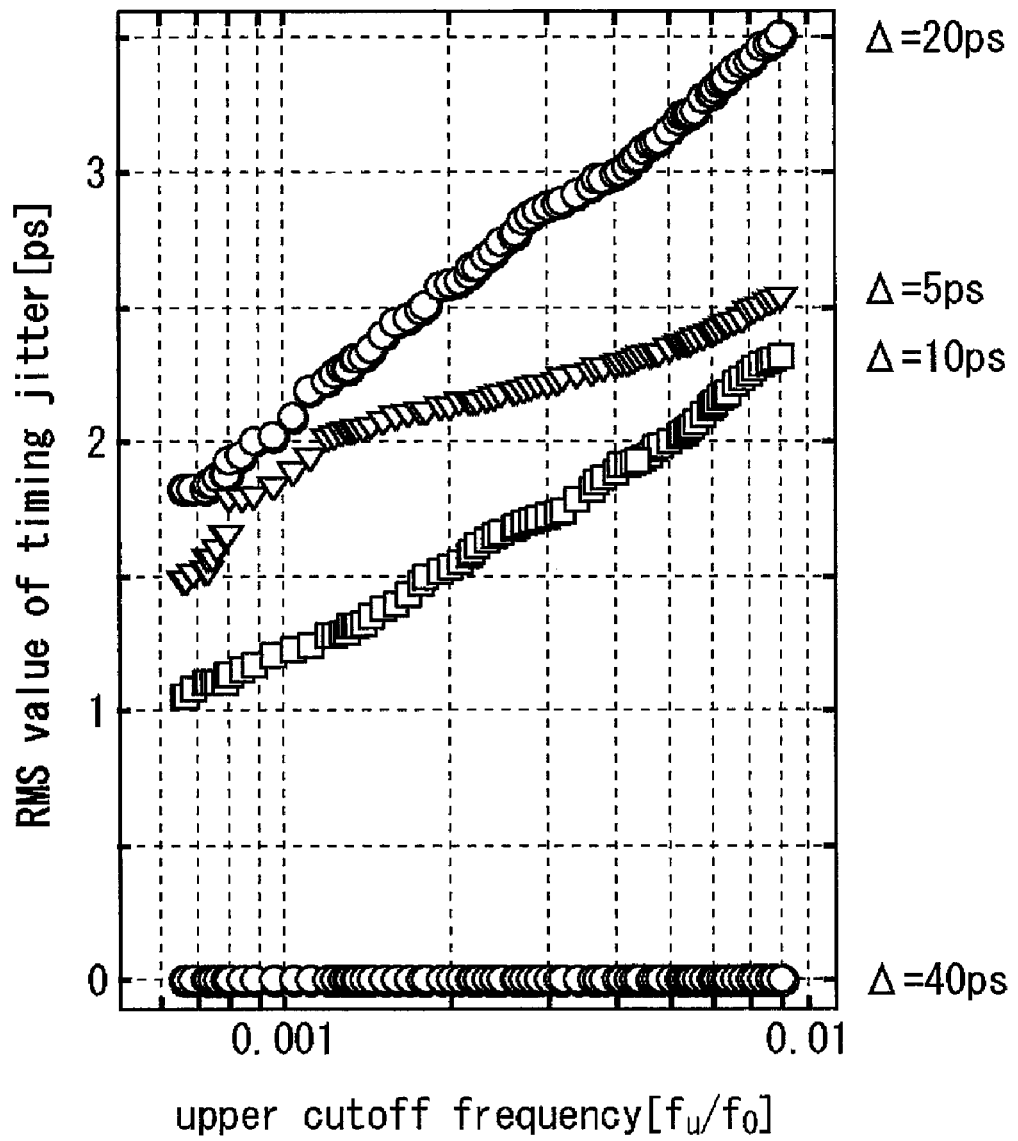
FIG. 31 is a diagram illustrating the measurement bandwidth dependency of the jitter value calculated for each period resolution ($\Delta$).

FIG. 31 is a diagram illustrating the measurement bandwidth dependency of the jitter value calculated for each period resolution (Δ). The jitter value according to the present embodiment is calculated for each period resolution (Δ) when the rms value of the jitter variation in the signal under measurement is 2 ps. In FIG. 31, the frequency fu on the horizontal axis corresponds to the cutoff frequency with reference to the carrier frequency $f_0$.

Figure 32:
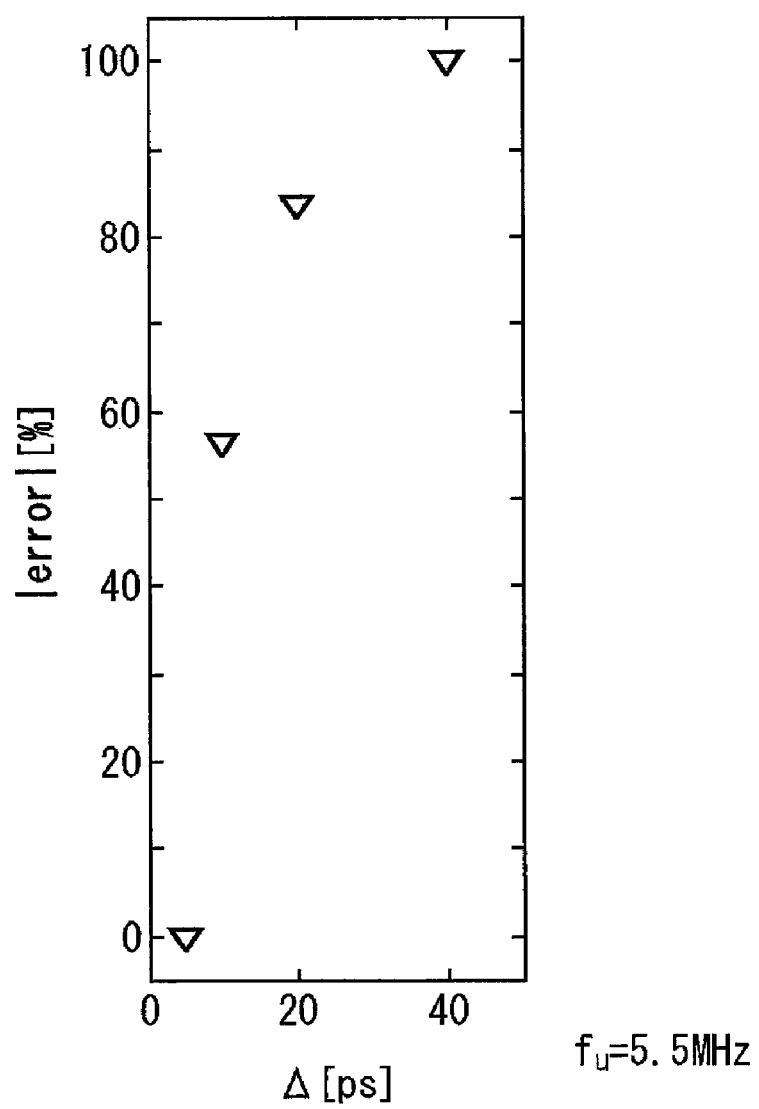
FIG. 32 is a diagram showing an example measurement error of the jitter value calculated for each period resolution ($\Delta$).

FIG. 32 is a diagram showing an example measurement error of the jitter value calculated for each period resolution (Δ). In the present example, the measurement value when the period resolution (Δ) is 5 ps is assumed to be the true value. As shown in FIGS. 31 and 32, as the period resolution (Δ) is increased, the measurement error of the jitter value is rapidly increased.

The strobe timing generator 30 may set the period of the strobe so as to further reduce the period resolution (Δ). For example, when several kinds of periods can be selected as the period of the strobe in the strobe timing generator 30, the strobe timing generator 30 may select a period for which the period resolution (Δ) is further reduced.

Additionally, the strobe timing generator 30 may set the period of the strobe such that the value of the period resolution (Δ) is determined in accordance with the jitter amplitude to be measured or the time resolution for calculating jitter. For example, if the amplitude value of the jitter to be measured or the jitter value to be calculated is provided, the strobe timing generator 30 may sequentially set the period resolution of the strobe signals as two times the rms value of the jitter or as roughly the same as the value of the required time resolution. Here, the jitter value to be measured may be the peak-to-peak value of the timing jitter. Additionally, it is preferable that the value of the period of the signal under measurement is provided to the strobe timing generator 30.

The maximum value of the difference between the timing for each edge of the signal under measurement and the ideal timing, i.e. the timing jitter, is determined by the value of the timing jitter. That is, the probability that each edge of the signal under measurement deviates from the ideal timing changes in accordance with the value of jitter. Therefore, each edge of the signal under measurement may deviate from the ideal timing by two to three times the jitter value. Alternatively, a period resolution (Δ) of approximately two times the jitter value can be used to accurately detect the timing jitter (the difference between the timing of the signal under measurement and its ideal timing) in the signal under measurement, as shown below in FIG. 34.

Additionally, by setting the period resolution (Δ) be less than an appropriate time resolution for calculating the jitter value, the jitter value at the time resolution can be more accurately calculated. The period resolution (Δ) may be defined based on the standard deviation of the probability density function of jitter in the signal under measurement. Hereinafter, an example of a procedure to define the period resolution (Δ), i.e. an equivalent sampling interval based on the standard deviation, will be described.

Figure 33A:
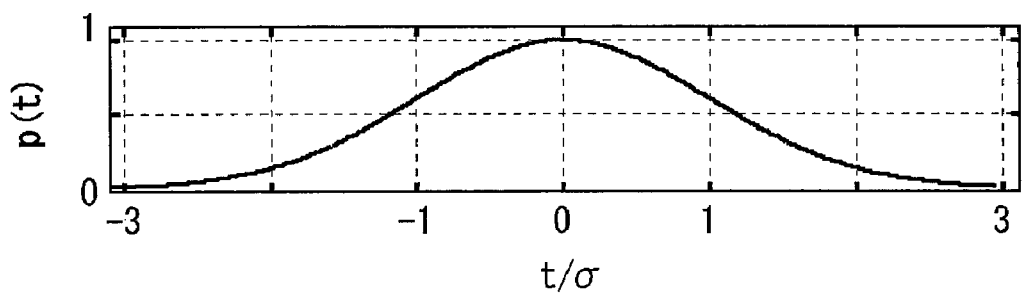
FIG. 33A shows an example of a probability density function p(t) of jitter in a signal under measurement.

FIG. 33A shows an example of a probability density function p(t) of jitter in a signal under measurement. In FIG. 33A, the horizontal axis indicates the time normalized by the standard deviation of the probability density function p(t). The normalized mean square error of the jitter measurement is given by the following expression.

$$\varepsilon^2[p(t)] = \frac{c^2}{2BTWp(t)} + \frac{W^4}{576}\left(\frac{p''(t)}{p(t)}\right)^2 \qquad \text{expression (1)}$$

Here, the first term of the right-hand side of the expression (1) indicates a random error in the measurement error. Additionally, the second term of the right-hand side of the expression (1) indicates a bias error in the measurement error. Furthermore, W is the interval for which the signal under measurement is observed, i.e. is proportional to the period resolution, and P''(t) indicates the second derivative of the probability density function p(t). With respect to each constant of the random error of the first term of the right-hand side, refer to the following document: "Analysis and Measurement Procedure 3rd ed.", pp. 290, J. S. Bendat and A. G. Piersol.

As evidenced by the expression (1), the jitter component in the signal under measurement can be accurately measured provided that the observation interval W, i.e. the period resolution ($\Delta$), is sufficiently reduced. That is, the second term of the right-hand side of the expression (1) is substantially zero and the measurement error due to the bias error is removed, so that jitter component can be accurately measured.

In theory, by sufficiently increasing the resolution for setting the period of the strobes, the period resolution ($\Delta$) can be sufficiently reduced. However, it is difficult to realize any circuit being capable of such strobes.

Moreover, if such a circuit is provided in the measurement apparatus 10, the cost of the measurement apparatus 10 could be increased. Additionally, when the value which can be set for the period of the strobes is limited, it is difficult to sufficiently reduce the period resolution.

Thus, hereinafter it will be described that jitter component in the signal under measurement can be accurately measured by appropriately selecting the period of the strobes even if the value to be set for the period of the strobes is limited and the resolution for setting the period is relatively coarse. When the jitter in the signal under measurement follows a Gaussian distribution, the probability density function p(t) is given by the following expression.

$$p(t) = (\sigma\sqrt{2\pi})^{-1} \exp\left[-\frac{t^2}{2\sigma^2}\right] \qquad \text{expression (2)}$$

Here, $\sigma$ indicates the standard deviation of the probability density function of the jitter in the signal under measurement.

Based on the expression (2), the factor $(p''(t)/p(t))^2$ of the second term of the right-hand side of the expression (1) is given by the following expression.

$$\left(\frac{p''(t)}{p(t)}\right)^2 = \frac{1}{\sigma^4}(t+\sigma)^2(t-\sigma)^2 \qquad \text{expression (3)}$$

Figure 33B:
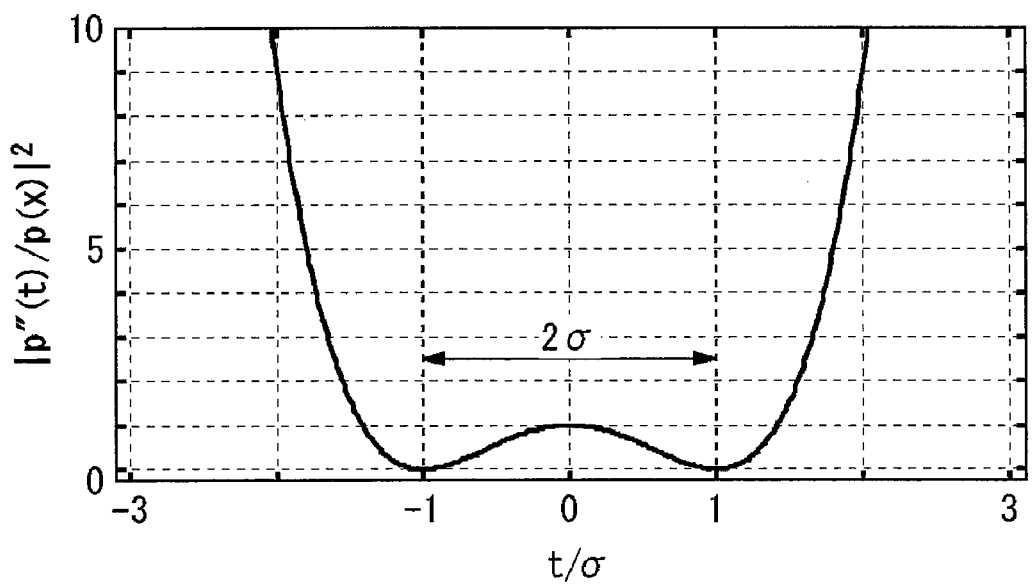
FIG. 33B shows an exemplary waveform of the function of Expression 3.

FIG. 33B shows an example of a waveform of the function of the expression (3). As shown in the expression (3) and FIG. 33B, when $|t|=\sigma$, the second term of the right-hand side of the expression (1) is substantially zero. That is, when the period resolution ($\Delta$) of the strobe signal and the signal under measurement, i.e. the measurement interval, is $2\sigma$, the second term of the right-hand side of the expression (1) is substantially zero, so that the bias error among the measurement errors can be removed and the jitter component can be accurately measured. The random error of the measurement error indicated by the first term of the right-hand side of the expression (1) can be reduced by sufficiently increasing the number of pieces of measurement data.

Figure 34:
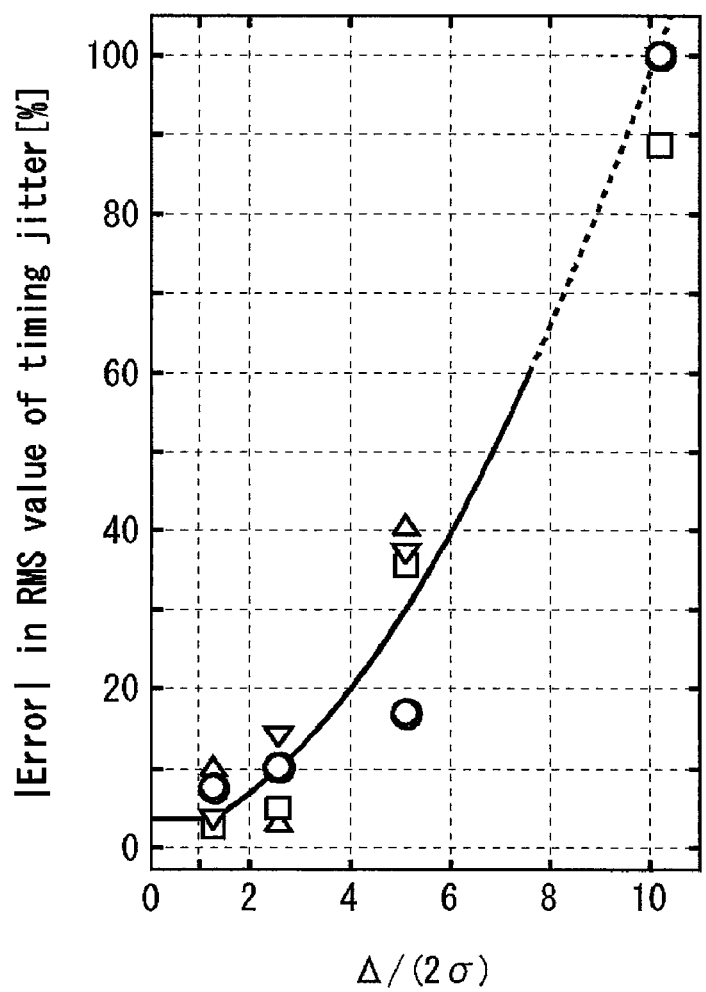
FIG. 34 shows a relationship between the period resolution ($\Delta$) and the measurement error.

FIG. 34 shows a relationship between the period resolution ($\Delta$) and the measurement error. In FIG. 34, the horizontal axis indicates the period resolution ($\Delta$) normalized by $2\sigma$. The vertical axis indicates the measurement error corresponding to the above-described bias error. Measurements are performed four times as shown by circles and squares, and the measurement results are approximated by a curved line in the present embodiment. As shown in FIG. 34, it can be observed that the measurement error is sufficiently reduced around a point where ($\Delta$) is $2\sigma$, that is, where $\Delta/2\sigma=1$.

The strobe timing generator 30 of the measurement apparatus 10 according to the present embodiment may set or select the period of the strobes based on the standard deviation of the probability density function of jitter in the signal under measurement. For example, the strobe timing generator 30 may set the period of the strobes such that the standard deviation $\sigma$ of the jitter to be measured and the period of the signal under measurement are previously provided, and the period resolution ($\Delta$) is substantially equal to double the standard deviation $\sigma$. The strobe timing generator 30 may set the period of the strobes such that the measurement error due to the bias component falls within an allowable range. In this case, it is preferred that the strobe timing generator 30 sets the period of the strobes such that the period resolution ($\Delta$) is about twice as large as the standard deviation $\sigma$.

Additionally, when several kinds of periods which can be selected as the period of the strobes are previously set, the strobe timing generator 30 may select the period of the strobe such that the period resolution ($\Delta$) is as close as possible to a value twice as large as the standard deviation $\sigma$. In the above example, the probability density function of jitter in the signal under measurement has a Gaussian distribution, but the jitter to be measured is not limited to the jitter having a Gaussian distribution. Even if the jitter has a different distribution, the period of the strobes can be appropriately set based on the standard deviation of jitter by the same process described with reference to FIGS. 33 and 34.

Hereinbefore, it was theoretically derived that the optimum period resolution ($\Delta$) is $2\sigma$ and the theory was experimentally validated as shown in FIG. 34. Here, in the expression (1) and the expression (3), the parameter for the sampling is only the observation interval W, so that the expression (1) and the expression (3) are independent of any sampling method. That is, the expression (1) and the expression (3) can be effectively used not only for equivalent sampling (undersampling) but also for real time-sampling (over-sampling).

FIG. 35 shows an exemplary configuration of the pattern generator 65 included in the test apparatus 100 shown in FIG. 27. The pattern generator 65 includes a pattern generating section 67 that generates a signal pattern of a test signal and a driver 69 that outputs the test signal based on the signal pattern. The driver 69 operates according to a predetermined test rate and causes the device under test 200 to output a signal under measurement with a period corresponding to the test rate or an integer multiple of the test rate. The driver 69 receives a timing signal with a period corresponding to the test rate T and causes the device under test 200 to output a signal under measurement corresponding to the period in the present embodiment.

The strobe timing generator 30 generates a strobe at a period T+Δ, which is greater than the test rate T by a predetermined value. By such operation, a high-speed signal under measurement can be accurately measured with lower operation frequency. It is preferred that several kinds of differences Δ are prepared for the period of the strobe which can be selected for the test rate T. For example, several sets of timings which can be set for the strobe timing generator 30 are prepared, and the period resolution A between the test rate and the strobe when each timing set is set may be measured in advance.

The strobe timing generator 30 may select the timing set having the minimum period resolution A among the timing sets, and also may select the timing set in which the period resolution A of the period is less than double the jitter value to be measured.

Figure 36:
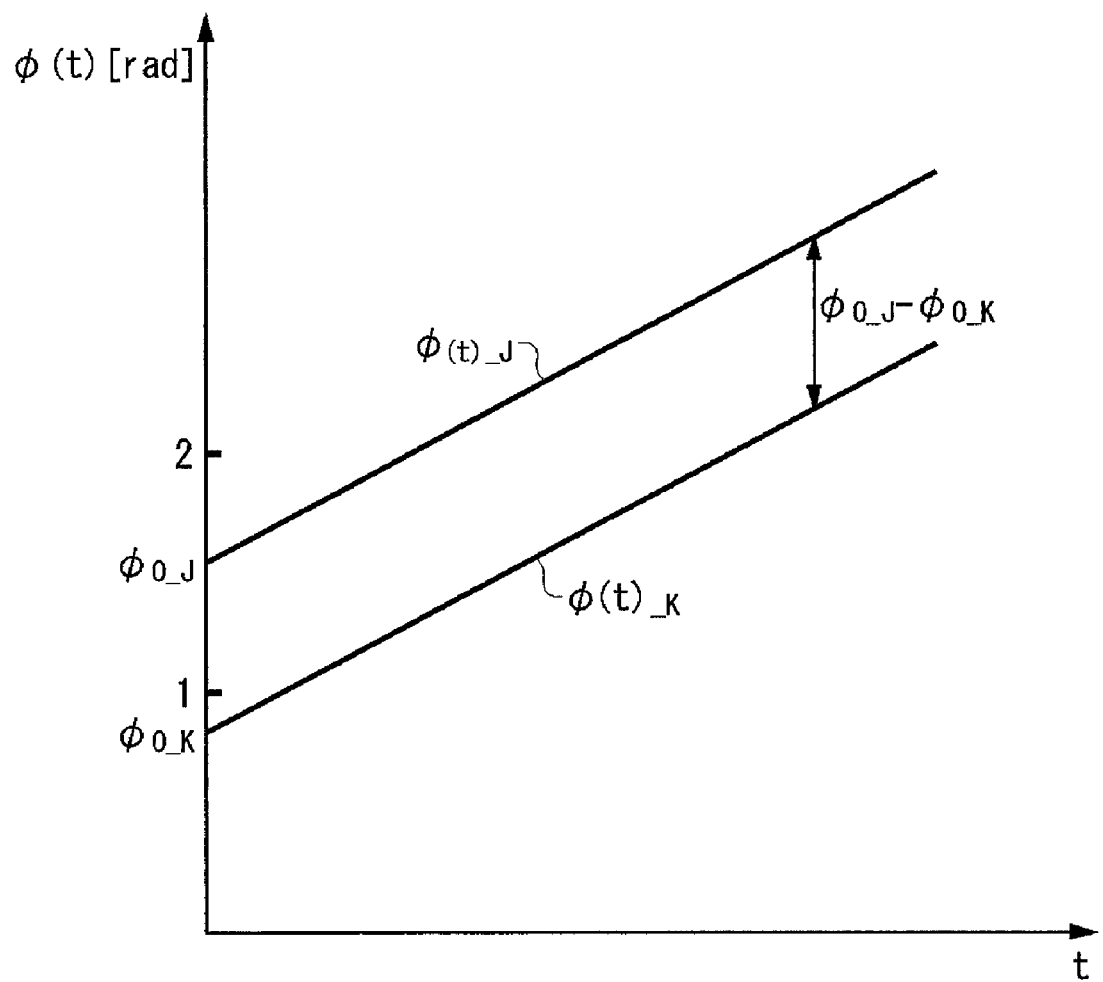
FIG. 36 shows an example of the instantaneous phase $\phi$ of a signal under measurement K and a signal under measurement J.

FIG. 36 shows an example of the instantaneous phase ϕ of a signal under measurement K and a signal under measurement J. The test apparatus 100 may calculate a deterministic skew between two signals under measurement based on the offset values $\phi_{0\_K}$ and $\phi_{0\_J}$. Here, the deterministic skew may be the difference between electrical lengths of the paths through which two signals are propagated.

For example, the digital signal converting section 50 and the digital signal processing section 60 may calculate $\phi_{0\_K}$ and $\phi_{0\_J}$ which are the values of the instantaneous phase ϕ(t) for each signal under measurement, and calculate the difference between $\phi_{0\_K}$ and $\phi_{0\_J}$ as the deterministic skew. Additionally, the digital signal converting section 50 and the digital signal processing section 60 may calculate the deterministic skew in time units by dividing the deterministic skew calculated in radian units by $2\pi f_0$. The digital signal converting section 50 and the digital signal processing section 60 may convert the instantaneous phase noise ϕ(t) in radian units to the instantaneous phase noise ϕ(t) in time units, and calculate the deterministic skew in time units based on the difference between the initial value for each instantaneous phase ϕ(t). Additionally, the digital signal converting section 50 and the digital signal processing section 60 may calculate the random skew between two signals under measurement based on the instantaneous phase noise Δϕ(t) for each of two signals under measurement.

Figure 37A:
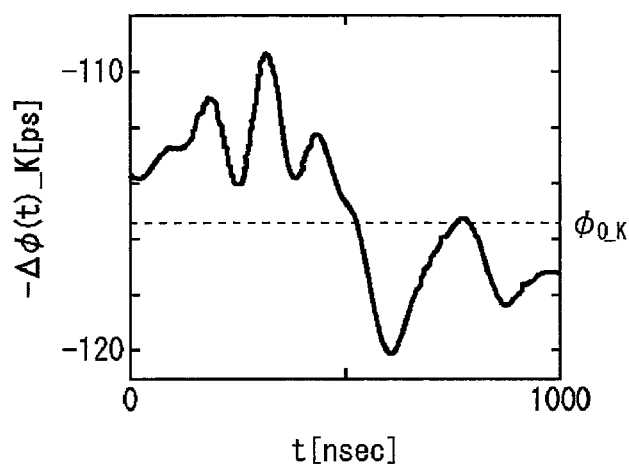
FIG. 37A shows an example of the instantaneous phase noise $\Delta\phi(t)\_K$ of the signal under measurement K.
Figure 37B:
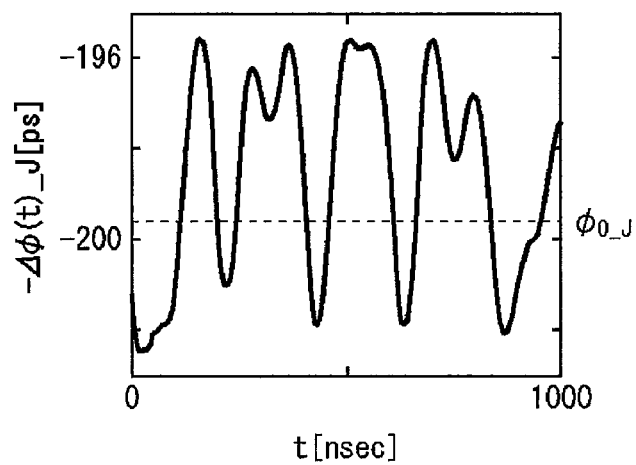
FIG. 37B shows an example of the instantaneous phase noise $\Delta\phi(t)\_J$ of the signal under measurement J.
Figure 37C:
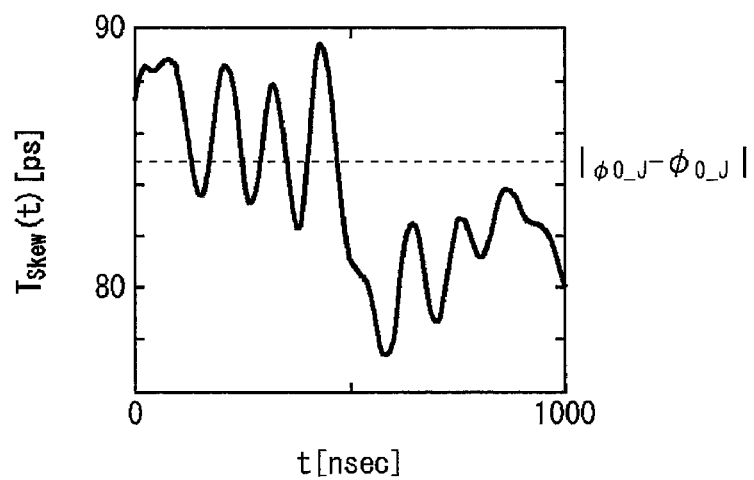
FIG. 37C shows an example of the random skew between the signal under measurement K and the signal under measurement J.

FIGS. 37A, 37B, and 37C are explanatory diagrams of a method of measuring random skew between the signal under measurement K and the signal under measurement J. FIG. 37A shows an example of the instantaneous phase noise Δϕ(t)_K of the signal under measurement K. FIG. 37B shows an example of the instantaneous phase noise Δϕ(t)_J of the signal under measurement J. FIG. 37C shows an example of the random skew between the signal under measurement K and the signal under measurement J. In FIG. 37, the instantaneous phase noise Δϕ(t) is a value obtained by subtracting a linear component $2\pi f_{beat}$ from the instantaneous phase ϕ(t). Here, the $f_{beat}$ is a frequency for equivalently sampling the signal under measurement with the period resolution (Δ). For example, $f_{beat}$ may be indicated by the following expression:

$$f_{beat} = \frac{1}{2T} - \frac{1}{2(T_b + \Delta)}$$

The random skew corresponds to the difference between the instantaneous phase Δϕ(t) of the signal under measurement K and the instantaneous phase Δϕ(t) of the signal under measurement J, so that the random skew $T_{skew}(t)$ shown in FIG. 37C can be derived by calculating the difference between the instantaneous phase Δϕ(t) shown in FIG. 37A and the instantaneous phase Δϕ(t) shown in FIG. 37B. The digital signal converting section 50 and the digital signal processing section 60 may calculate the random skew.

Additionally, when the test apparatus 100 measures the deterministic skew or the random skew described in FIGS. 36 and 37, it is preferable that the test apparatus 100 have two level comparing sections 520 in parallel. Then, the signal under measurement K and the signal under measurement J are input to those level comparing sections 520 at the same time. Additionally, the same strobes are provided to the level comparing sections 520. That is, the test apparatus 100 simultaneously under-samples two signals under measurement input to the level comparing sections 520.

Then, as described above, the instantaneous phase ϕ(t) for each signal is calculated, and the offset value at a predetermined time (e.g. T=0) for each instantaneous phase ϕ(t) is then calculated. The difference between the calculated values indicates the deterministic skew. Such processing may be performed by the digital signal converting section 50 and the digital signal processing section 60. Additionally, the test apparatus 100 may have two capture memories 40 corresponding to two level comparing sections 520. The digital signal converting section 50 and the digital signal processing section 60 receive data from two capture memories 40 and calculate the above-described deterministic skew and random skew. When measuring the deterministic skew and the random skew, the digital signal processing section 60 may remove the deterministic component as described in relation to FIG. 12.

Figure 38:
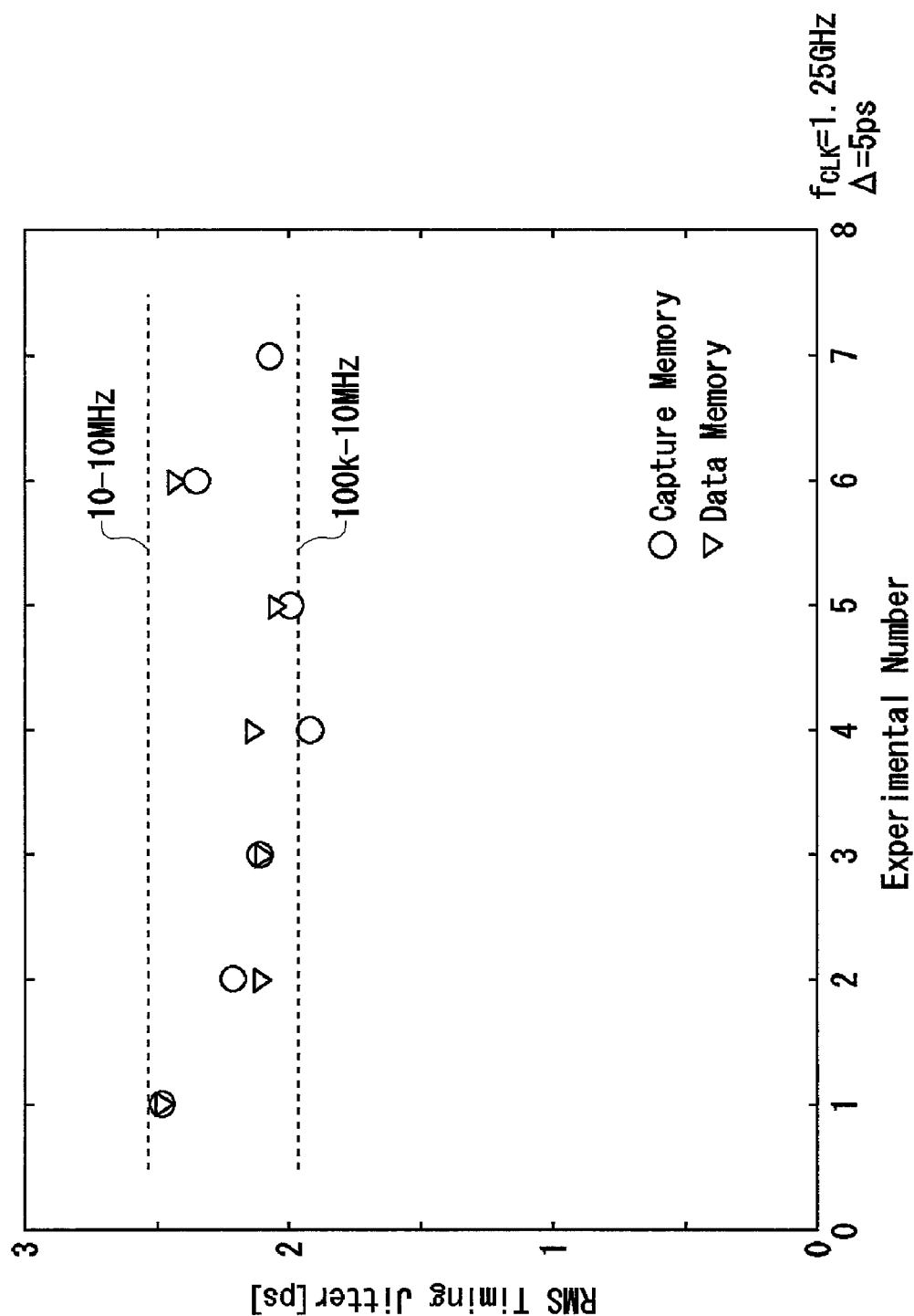
FIG. 38 shows a comparison between a jitter measurement result by the test apparatus 100 and a jitter measurement result by using a signal source analyzer E5052A.

FIG. 38 shows a comparison between a jitter measurement result by the test apparatus 100 and a jitter measurement result by using a signal source analyzer E5052A. The range of the result of jitter measurement by the signal source analyzer is indicated by dotted lines in FIG. 38. The signal source analyzer may be a general measurement apparatus having a function to measure jitter.

Additionally, the results of jitter measurement performed by the measurement apparatus 100 are plotted by circles and triangles in FIG. 38. As shown in FIG. 38, the measurement result of the test apparatus 100 is well matched with the measurement result used to measure jitter. That is, FIG. 38 shows that the jitter can be accurately measured by using the test apparatus 100.

Figure 39:
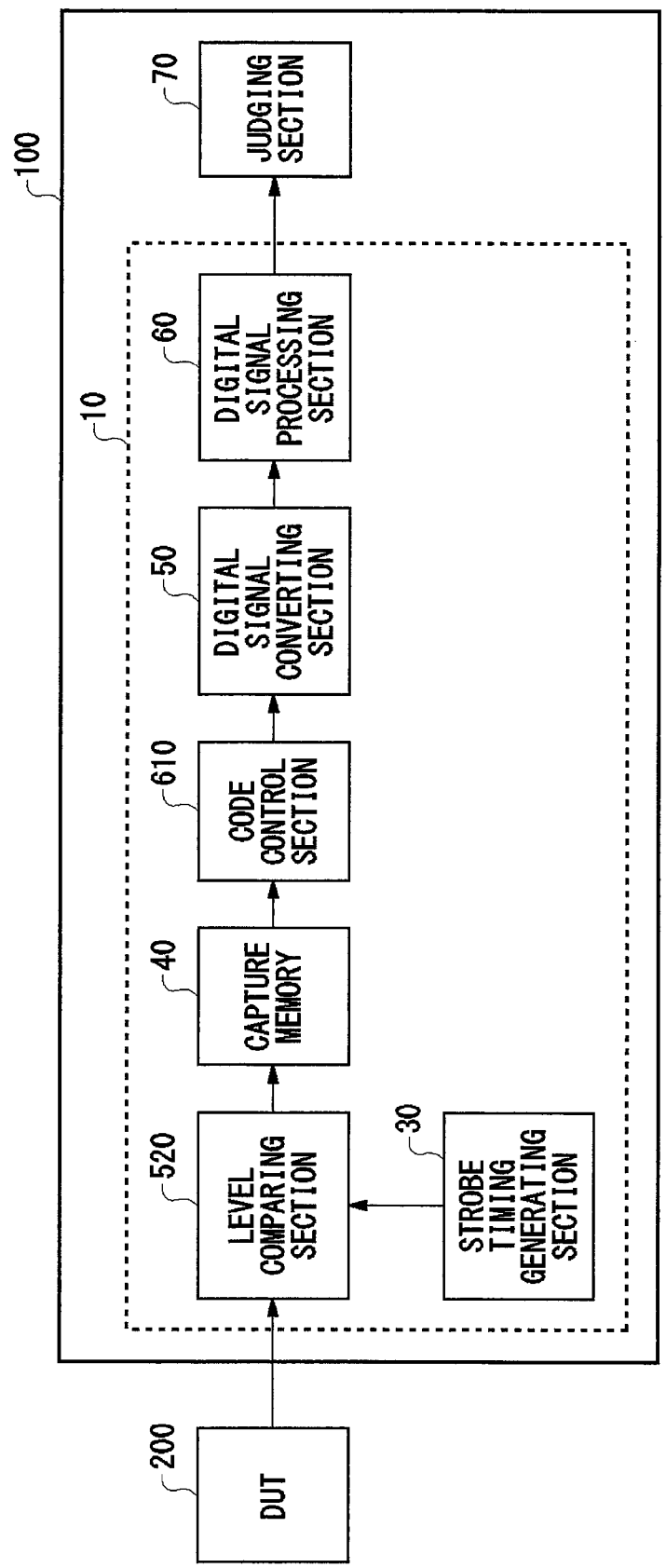
FIG. 39 shows another exemplary configuration of the test apparatus 100.

FIG. 39 shows another exemplary configuration of the test apparatus 100. The test apparatus 100 of the present embodiment is provided with the measurement apparatus 10 and the judging section 70. The measurement apparatus 10 includes the code control section 610 in addition to the measurement apparatus 10 shown in FIG. 1. The elements having the same reference numerals as elements of FIG. 1 may have the same function and configuration as the corresponding elements in FIG. 1.

The strobe timing generator 30 of the present embodiment sequentially generates strobes that are arranged at substantially equal time intervals, and each interval is larger than a bit time interval of the signal under measurement. The bit time interval of the signal under measurement may be a period for which the signal level of the signal under measurement is changed. Additionally, the signal under measurement may be a signal having a signal level that alternatively transitions between H level and L level for each bit time interval.

The level comparing section 520 detects the signal level of the signal under measurement at a timing at which each strobe is sequentially provided. The level comparing section 520 may detect the signal level of the signal under measurement by using the level comparing section 520 described with reference to FIG. 1. The level comparing section 520 may sequentially compare the voltage value of the signal under measurement and the given reference voltage value at a timing at which each strobe is sequentially provided. For example, the level comparing section 520 may output a logic value of 1 when the voltage value of the signal under measurement is greater than the reference voltage value, and output a logic value of −1 when the voltage value of the signal under measurement is less than the reference voltage value. Additionally, the level comparing section 520 may compare a plurality of reference voltage values different from each other with the voltage value of the signal under measurement. In this case, the level comparing section 520 outputs several kinds of logic values corresponding to several kinds of comparison results. The capture memory 40 stores the signal levels output by the level comparing section 520. The capture memory 40 may store the logic values sequentially output by the level comparing section 520 in a time series.

The code control section 610 may alternately invert the data values of the data sequence stored in the capture memory 40, with reference to an intermediate level of the signal under measurement. For example, the code control section 610 inverts the data values of even numbered data series or odd numbered data series in the data sequence. Here, the data values may be values expressing digital values of the level, i.e. a voltage value, of the signal under measurement. As another example, the code control section 610 may alternately invert the logic values of the data sequence stored in the capture memory 40. The code control section 610 may invert the data values or the logic values of the data sequence by multiplying the data sequence stored in the capture memory 40 by $\cos(\pi k)$.

Figure 43:
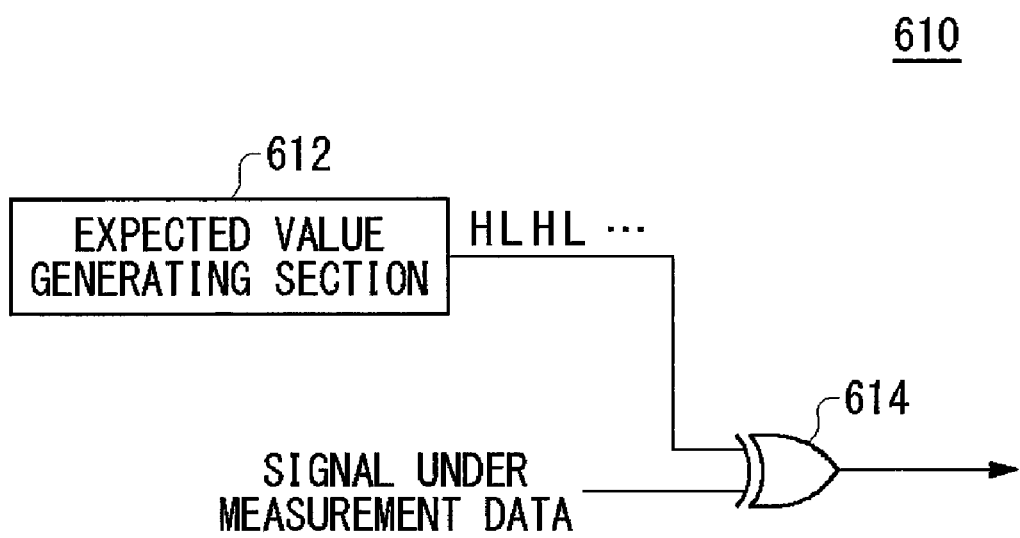
FIG. 43 shows an exemplary configuration of the code control section 610.

The code control section 610 may output a comparison result obtained by comparing the logic values of the data sequence to the expected logic value (referred to hereinafter as "expected value"), as shown in FIG. 43. At this time, the code control section 610 may alternately invert the expected value to which the logic values of the data sequence are compared.

The digital signal processing section 60 calculates the measurement result of the signal under measurement based on the data sequence stored in the capture memory 40. The data sequence may be the logic values or the data values described above arranged in a time series. Additionally, the digital signal processing section 60 may measure the waveform, the spectrum, the jitter, the instantaneous phase, the instantaneous phase noise, and the like of the signal under measurement based on the data sequence. The digital signal processing section 60 may calculate the skew between two signals under measurement. Furthermore, the digital signal processing section 60 may calculate the gain of the jitter transfer function between the input and the output of the device under test 200. The digital signal processing section 60 may calculate the bit error rate (BER) of the device under test 200. The operation of the measurement apparatus 10 for each measuring object will be described later.

Figure 40:
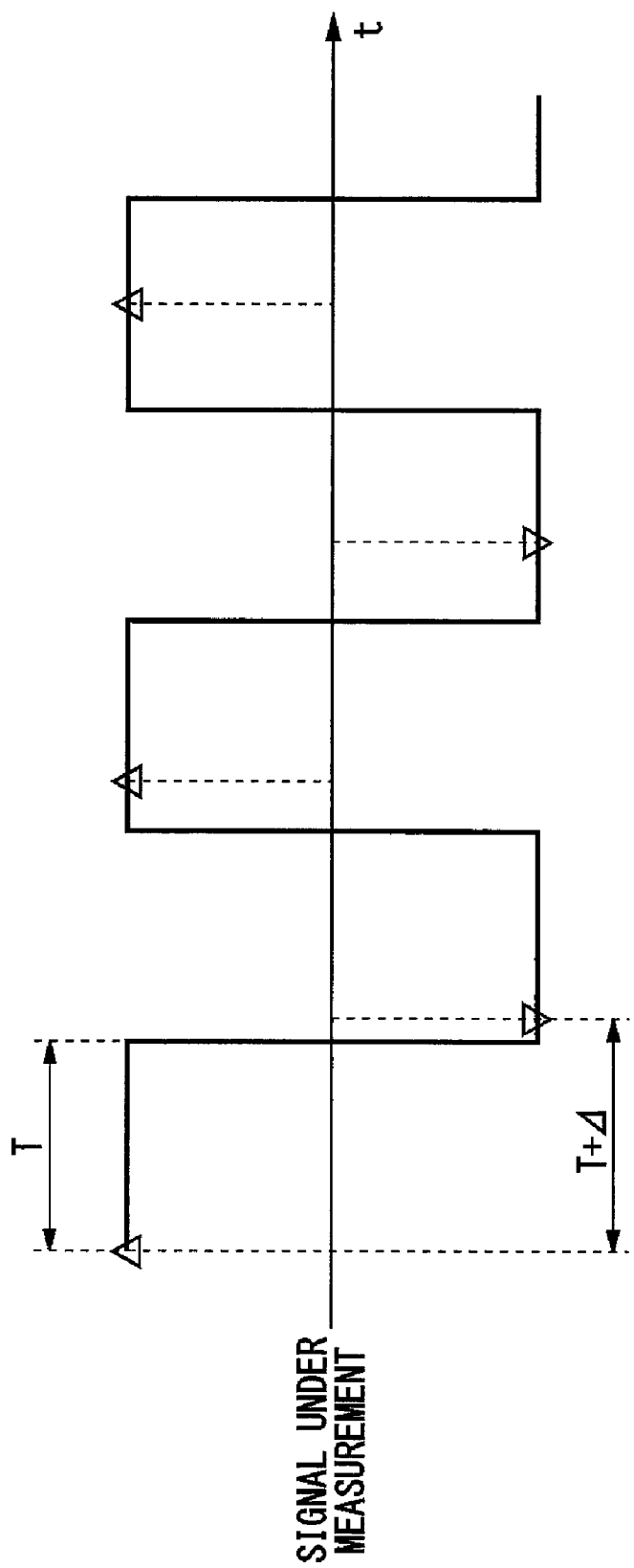
FIG. 40 shows an example of strobes generated by the strobe timing generator 30.

FIG. 40 shows an example of strobes generated by the strobe timing generator 30. The bit time interval of the signal under measurement is described as T in the present embodiment. The test apparatus 100 according to the present embodiment operates at a test rate substantially equal to the bit time interval of the signal under measurement. The strobe timing generator 30 generates equal to or less than one strobe for each test rate.

Additionally, the strobe timing generator 30 sequentially generates strobes at a period (T+Δ) different from the test rate (T) of the signal under measurement by a predetermined value (Δ). Moreover, the strobe timing generator 30 may output strobes for the signal under measurement for a period which does not satisfy the Nyquist sampling theorem.

For example, when the logic value of the signal under measurement is changed alternately to H level or L level for each bit time interval, the Nyquist sampling theorem is satisfied provided that the period of the strobe is less than the bit time interval (T). The strobe timing generator 30 may sequentially output strobes at a period slightly larger than the bit time interval. In this case, the level comparing section 520 detects H level and L level of the signal under measurement substantially in turn, as shown in FIG. 32.

FIG. 41 shows an exemplary operation of the digital signal processing section 60. In the present embodiment, a signal under measurement in which the logic value is alternately changed to H level or L level for each bit time interval is measured, as described in FIG. 40. Here, the signal under measurement according to the present embodiment is a jitter free signal. The operation of the strobe timing generator 30 is the same as that of the strobe timing generator 30 described in FIG. 40.

Figure 41A:
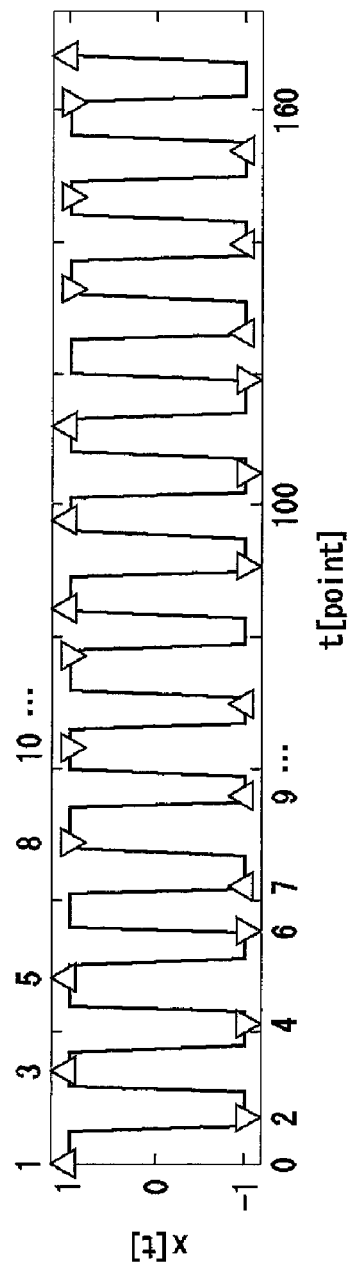
FIG. 41A shows an exemplary data sequence input to the digital signal processing section 60.

FIG. 41A shows an example of a data sequence input to the digital signal processing section 60. As described in FIG. 40, the level comparing section 520 detects the signal under measurement over a bit interval for which the signal under measurement is in H level and a bit interval for which the signal under measurement is in L level, substantially in turn.

Figure 41B:
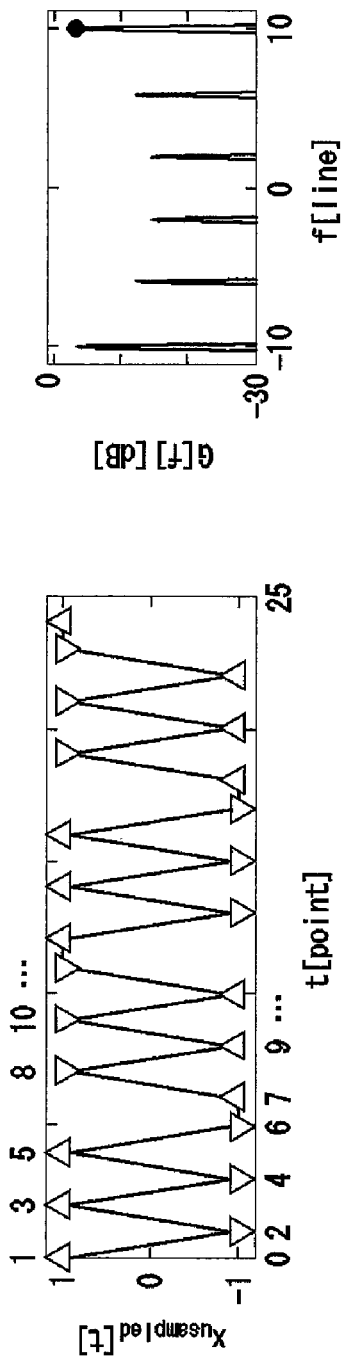
FIG. 41B shows exemplary data processing of the digital signal processing section 60.
Figure 41C:
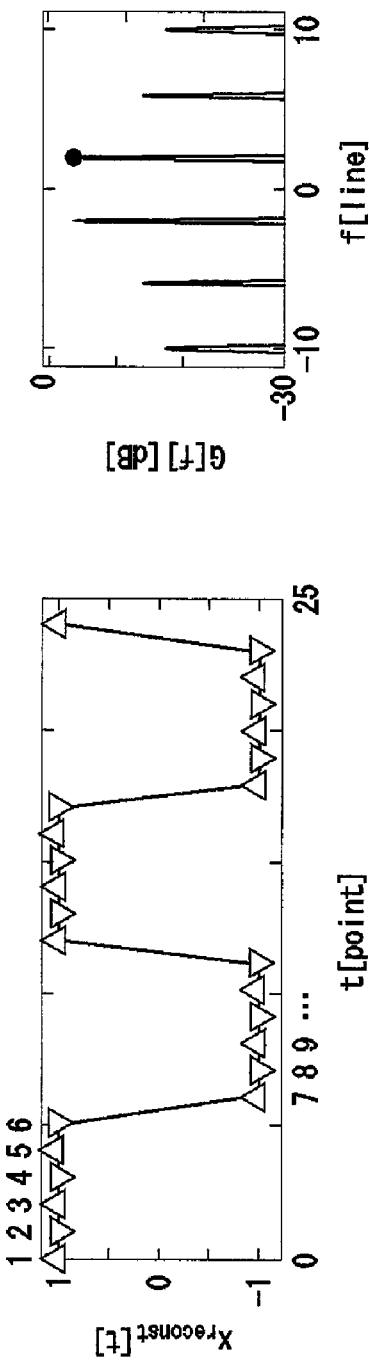
FIG. 41C shows exemplary data processing of the digital signal processing section 60.

FIGS. 41B and 41C show examples of data processing by the digital signal processing section 60. First, the digital signal processing section 60 compresses the data sequence input thereto into an equivalent time waveform as shown in the left figure of FIG. 41B. That is, the digital signal processing section 60 can process the data sequence sampled at the period T+Δ as the data sequence equivalently sampled at the period π. The right figure of FIG. 41B shows an example of the spectrum obtained by performing a Fourier transform on the data sequence shown in the left figure of FIG. 41B.

Next, as shown in the left figure of FIG. 41C, the digital signal processing section 60 inverts the data values corresponding to the odd numbered strings or the even numbered strings among the data of the data sequence shown in the right figure of FIG. 41B with respect to the zero level of the signal under measurement.

For example, the digital signal processing section 60 holds the original value of the $1^{st}$, $3^{rd}$, $5^{th}$, $7^{th}$ $9^{th}$ . . . piece of data among the data shown in FIGS. 41A and 41B. As another example, the digital signal processing section 60 inverts the value of the $2^{nd}$, $4^{th}$, $6^{th}$, $8^{th}$ $10^{th}$ . . . piece of data with respect to the zero level of the signal under measurement. That is, the data value with a logic value 1 is converted to the logic value −1, and the data value with the logic value −1 is converted to the logic value 1 in the present embodiment.

In other words, a waveform equivalent to the waveform obtained by sampling the signal under measurement at the sampling period Δ can be obtained by inverting the data value of either the odd numbered data series or the even numbered data series as shown in FIG. 41. Therefore, the waveform of the signal under measurement can be more accurately reproduced.

Here, the right figure of FIG. 41C is an example of a spectrum obtained by performing a Fourier transform on the data sequence shown in the left figure of FIG. 41C. By performing a Fourier transform on the data sequence shown in the left figure of FIG. 41C, the digital signal processing section 60 can calculate the spectrum of the signal under measurement.

The digital signal processing section 60 may multiply each data value by cos(πk), to invert the data value as described above. Here, k indicates the data number in the data sequence. The process to invert the data value on the time axis is equivalent to multiplying by cos(πk), so the process to invert the data value on the frequency axis is equivalent to shifting the frequency by π. That is, the spectrum shown in FIG. 41C can be calculated by shifting the frequency component of the spectrum shown in FIG. 41B by π. The digital signal processing section 60 may calculate the spectrum of the signal under measurement (as shown in the right figure of FIG. 41C) by shifting by π the frequency of the spectrum (the right figure of FIG. 41B) obtained by performing a Fourier transform on the data sequence (the left figure of FIG. 41B) which has not undergone the data value inverting process. Furthermore, the digital signal processing section 60 may calculate the waveform (as shown in the left figure of FIG. 41C) of the signal under measurement by performing an inverse Fourier transform on the calculated spectrum of the signal under measurement.

Figure 42A:
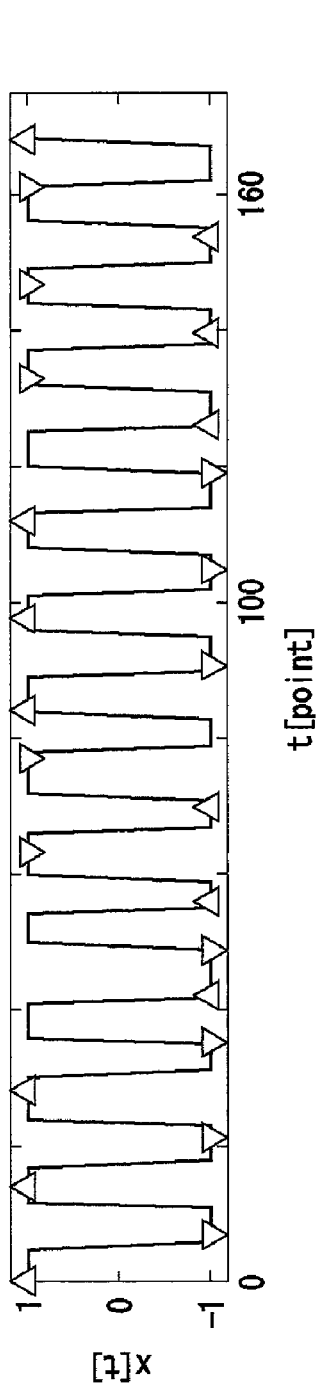
FIG. 42A shows an example of a data sequence input to the digital signal processing section 60 when the jitter is injected into the signal under measurement.
Figure 42B:
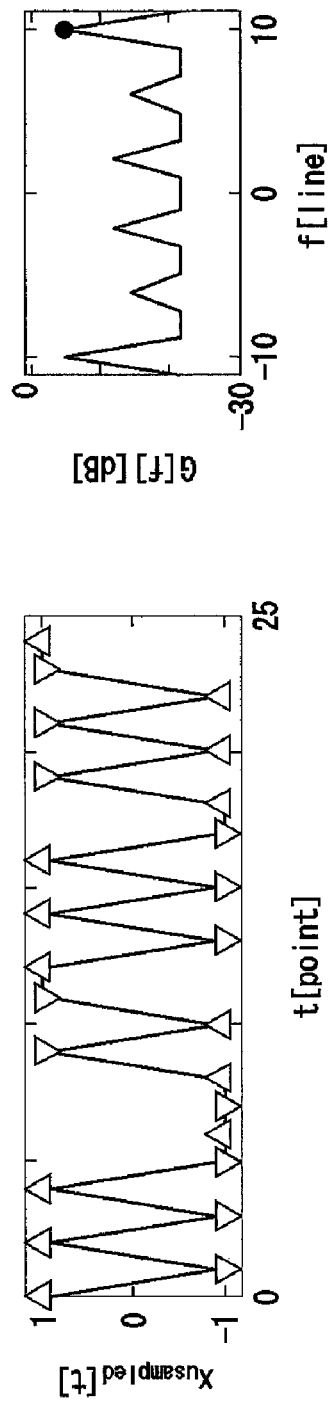
FIG. 42B shows an example of data processing by the digital signal processing section 60 when the jitter is injected into the signal under measurement.
Figure 42C:
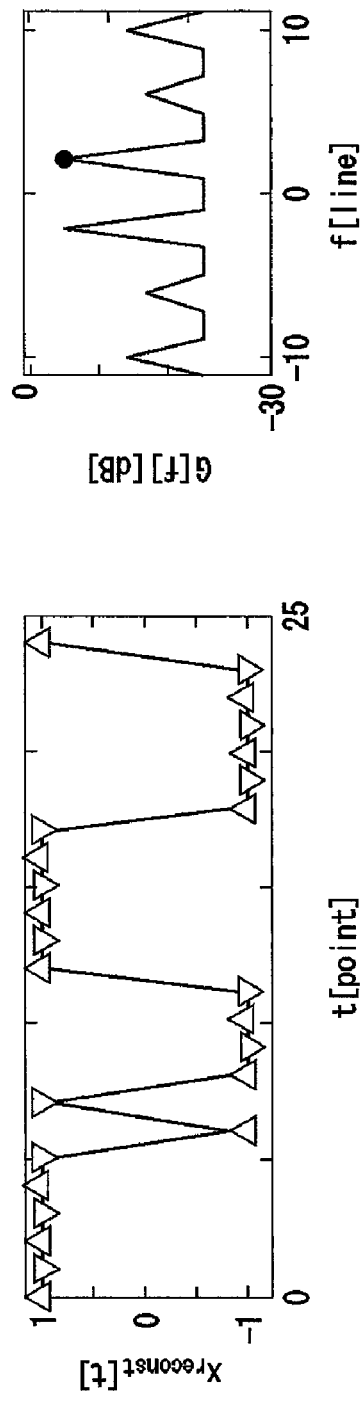
FIG. 42C shows an example of data processing by the digital signal processing section 60 when the jitter is injected into the signal under measurement

FIG. 42 is a diagram showing a process identical to the process described in FIG. 41 performed on the signal under measurement into which jitter is injected. FIG. 42A shows an example of a data sequence input to the digital signal processing section 60 when the jitter is injected into the signal under measurement. FIGS. 42B and 42C show examples of data processing by the digital signal processing section 60 when the jitter is injected into the signal under measurement.

As shown in FIG. 42B and FIG. 42C, if jitter is applied to the signal under measurement, the jitter component appears in the data sequence. The jitter component corresponding to the jitter frequency also appears around the carrier frequency of the spectrum obtained by performing a Fourier transform on the data sequence. The digital signal processing section 60 may calculate the jitter in the signal under measurement based on the spectrum.

In the present embodiment, the signal under measurement is sampled at the period slightly larger than the bit time interval of the signal under measurement. In this case, the data value of the sampled signal under measurement is alternately inverted for each time interval with respect to the zero level of the signal under measurement as described above. That is, the odd numbered or the even numbered data values are inverted. For example, the data values of the sampled signal under measurement are inverted one by one.

In the same way, the logic values of the sampled signal under measurement may be alternately inverted for each bit time interval. That is, the logic values of the sampled signal under measurement may be inverted one by one. The inversion of the logic value may be a process to convert the logic value H to the logic value L and convert the logic value L to the logic value H. Meanwhile, the inversion of the data values may be a process to invert the level of the signal under measurement, such as the voltage value, on with respect to the zero level of the signal under measurement, such as zero voltage.

FIG. 43 shows an exemplary configuration of the code control section 610. The code control section 610 alternately inverts the expected value, as described above. The code control section 610 of the present embodiment includes an expected value generating section 612 and a logic comparing section 614.

The logic comparing section 614 outputs a comparison result indicating whether each logic value of the signal under measurement detected by the level comparing section 520 matches the supplied expected value. The logic comparing section 614 may include an exclusive OR circuit that outputs an exclusive OR of the expected value and the logic values of the signal under measurement. The expected value generating section 612 inverts the expected values immediately before each expected values corresponding to the odd numbered or even numbered data series, and supplies the logic comparing section 614 with these inverted expected values.

Figure 44:
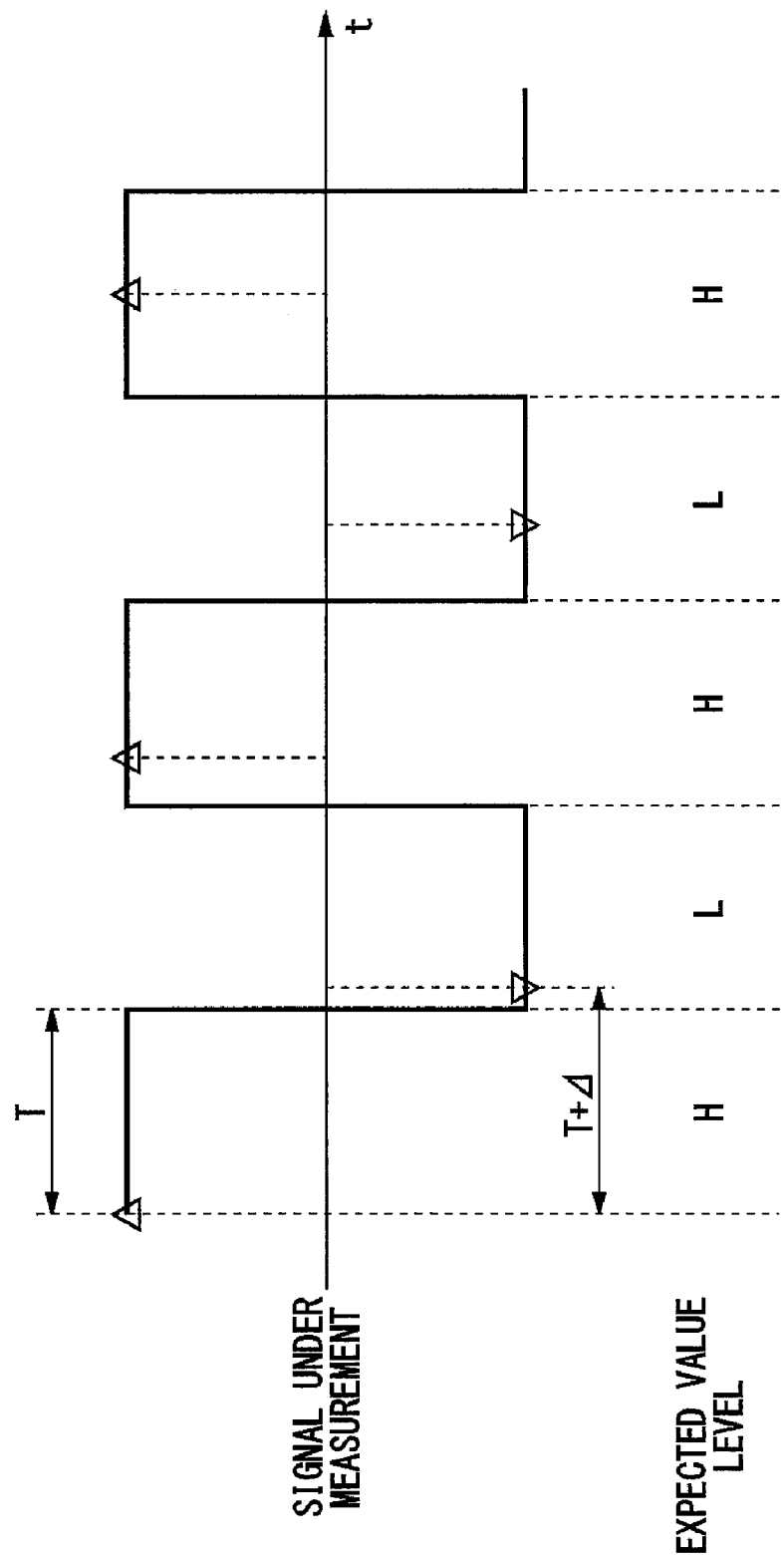
FIG. 44 shows an exemplary operation of the test apparatus 100 using the code control section 610 shown in FIG. 43.

FIG. 44 shows an exemplary operation of the test apparatus 100 using the code control section 610 shown in FIG. 43. The measurement apparatus 10 of the present embodiment generates a comparison result indicating whether the logic value of each bit in the signal under measurement matches the predetermined expected value.

As described above, the expected value generating section 612 may invert the expected values corresponding to either the odd numbered data or the even numbered data in the data sequence of the signal under measurement. For example, when there may be two logic values as the expected value, a logic value different from the adjacent expected value may be set. By such a process, the result of comparing the logic value for each bit of the signal under measurement to the predetermined expected value corresponds to the data sequence shown in the left figures of FIG. 41C and FIG. 42C.

Figures 45A, 45B:
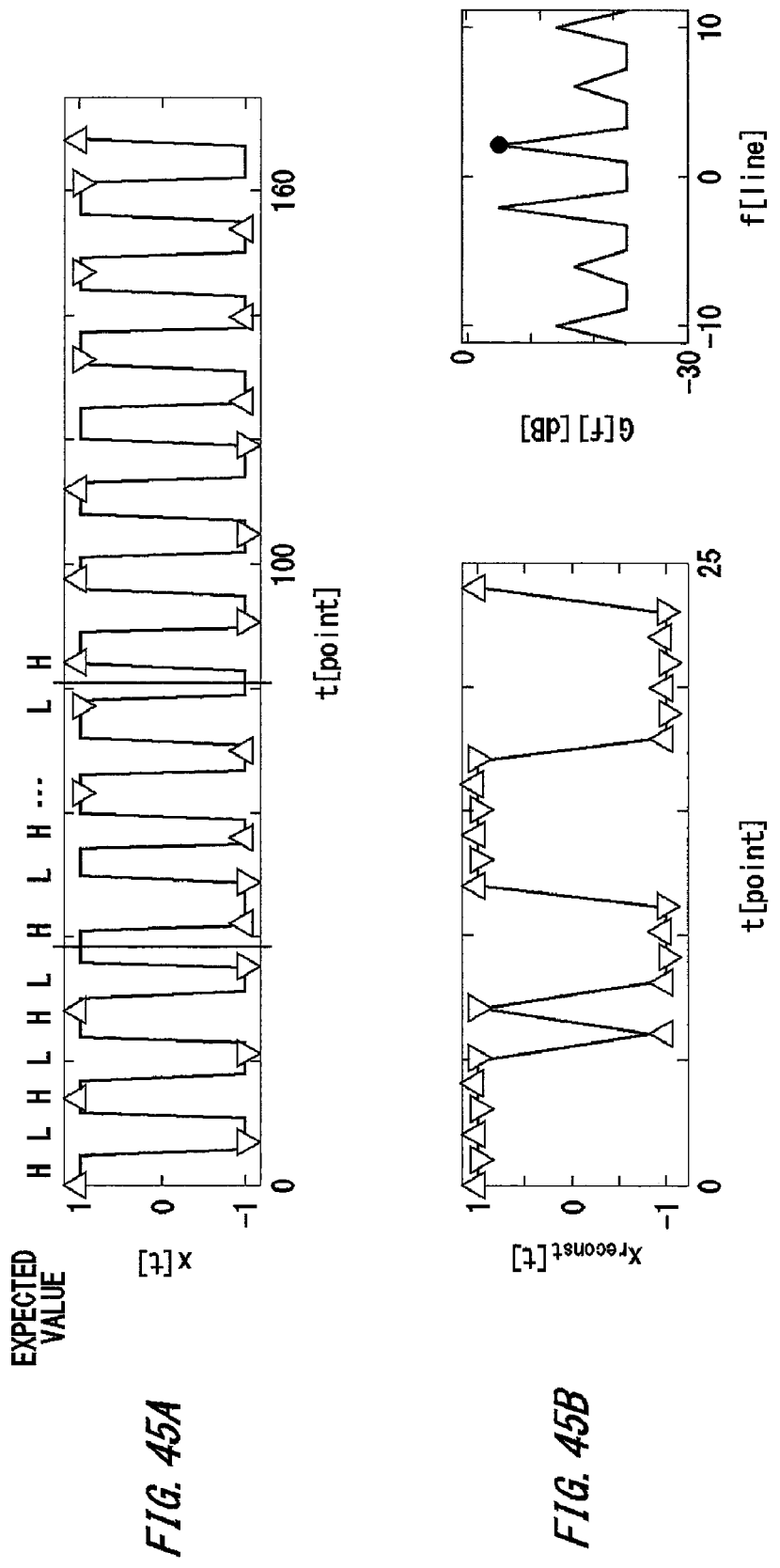
FIG. 45A shows an example of a comparison result series obtained by the process described in FIG. 44.
FIG. 45B shows an example of a comparison result series obtained by the process described in FIG. 44.

FIG. 45 shows an example of a comparison result series obtained by the process described in FIG. 44. As shown in FIG. 45A, the measurement apparatus 10 alternately inverts the expected value (expected logic value) for each bit time interval and compares the resulting expected value to the logic value of the signal under measurement. For example, the measurement apparatus 10 inverts the expected values one by one.

Therefore, as shown in FIG. 45B, a comparison result series identical to the data sequence shown in the left figure of FIG. 42C can be obtained. In the present embodiment, the comparison result obtained when the logic value of the signal under measurement corresponds to the expected value is indicated by logic value 1, and the comparison result obtained when the logic value of the signal under measurement does not correspond to the expected value is indicated by logic value −1.

The measurement apparatus 10 may calculate the comparison result series by fixing the expected value to the logic value H, instead of by inverting the expected value. At this time, the comparison result series is equivalent to the data sequence shown in the left figure of FIG. 42B. As described above, the measurement apparatus 10 may calculate the spectrum of the signal under measurement by shifting by T the frequency of the spectrum obtained by performing the Fourier transform on the comparison result series. Additionally, the measurement apparatus 10 may calculate jitter in the signal under measurement based on the frequency component around any peak of the spectrum obtained by performing the Fourier transform on the comparison result series.

In a similar way, the measurement apparatus 10 may alternately invert the logic values of the sampled signal under measurement for each bit time interval. In other words, the measurement apparatus 10 may invert the logic values of the sampled signal under measurement one by one.

Figure 46:
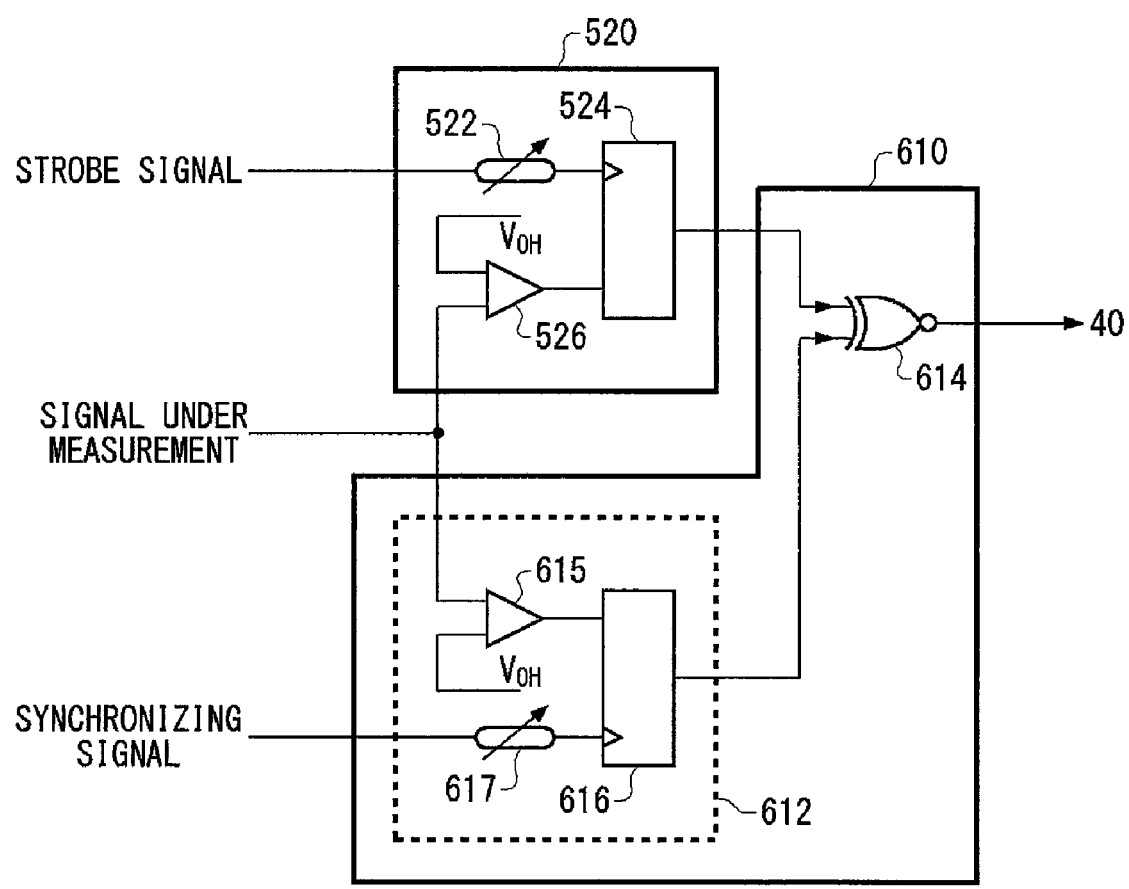
FIG. 46 shows another exemplary configuration of the level comparing section 520 and the code control section 610.
Figure 47:
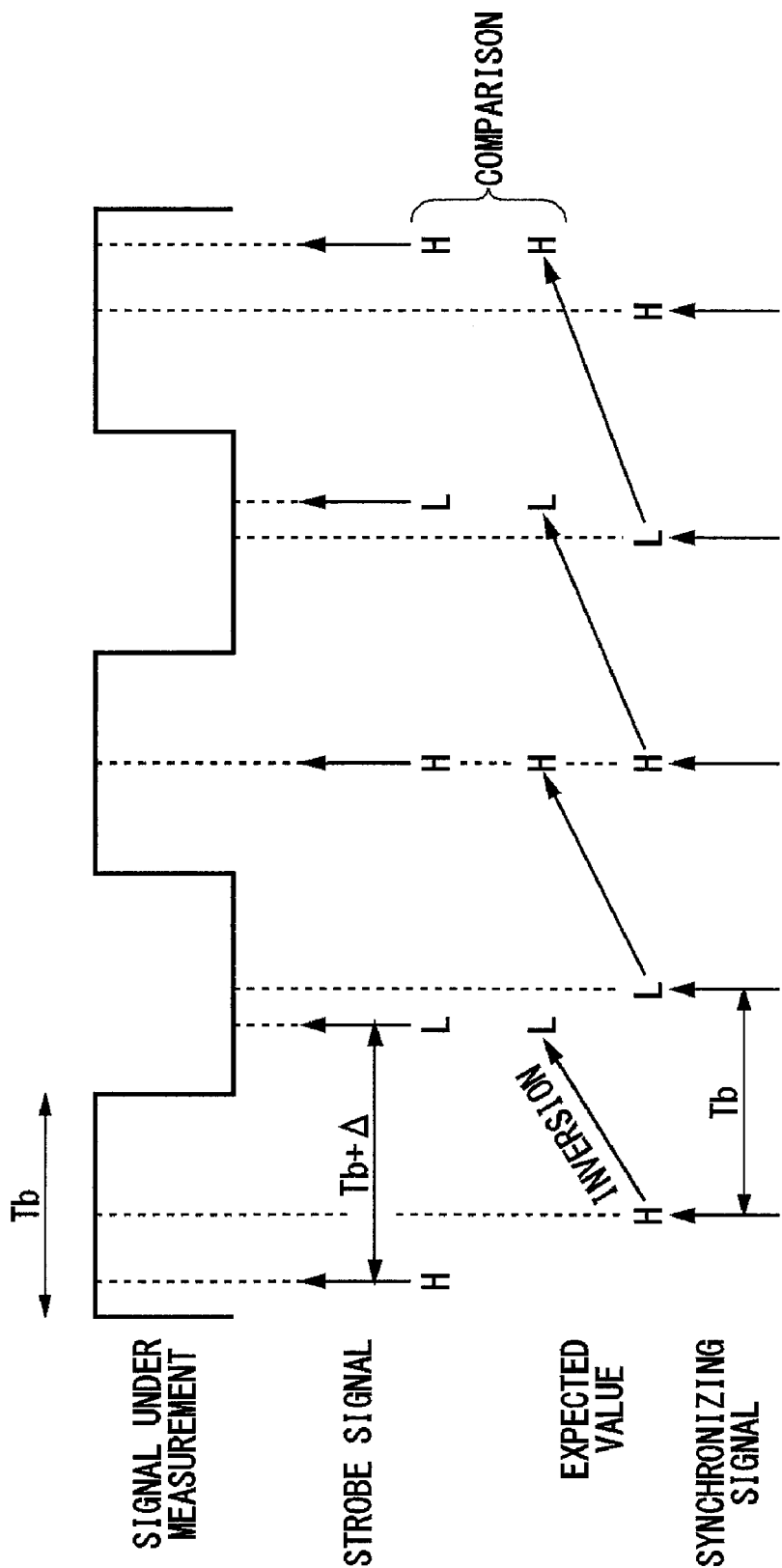
FIG. 47 is a timing chart showing an exemplary operation of the level comparing section 520 and the code control section 610 shown in FIG. 46.

FIG. 46 shows another exemplary configuration of the level comparing section 520 and the code control section 610. FIG. 47 is a timing chart showing an exemplary operation of the level comparing section 520 and the code control section 610 shown in FIG. 46. The expected value generating section 612 of the code control section 610 according to the present embodiment generates an expected value based on the signal under measurement.

As shown in FIG. 46, the level comparing section 520 includes a variable delay circuit 522, a flip flop 524 and a comparator 526. The comparator 526 outputs a result by comparing the signal under measurement with a preset threshold value VOH. For example, the comparator 526 may output logic value H when the level of the signal under measurement is higher than the threshold value VOH, and output logic value L when the level of the signal under measurement is lower than the threshold value VOH.

The variable delay circuit 522 adjusts the phase of the strobes output by the strobe timing generator 30. The variable delay circuit 522 may generate a constant delay during measuring. The flip flop 524 samples the logic values output by the comparator 526 in response to the strobes output by the variable delay circuit 522. In this way, the logic value of the signal under measurement can be sampled in accordance with the strobe.

Since the period of the strobe is larger than the period of the signal under measurement Tb by Δ, the flip flop 524 equivalently samples the signal under measurement at the sampling period Δ as shown in FIG. 47. As shown in FIG. 46, the expected value generating section 612 includes a variable delay circuit 617, a flip flop 616 and a comparator 615. The comparator 615 outputs a result by comparing the signal under measurement with the preset threshold value VOH. The threshold value set to the comparator 615 and the threshold value set to the comparator 526 may be the same as each other.

The flip flop 616 samples the output of the comparator 615 in accordance with the synchronizing signal provided through the variable delay circuit 617. The synchronizing signal has a period substantially the same as that of the signal under measurement.

The measurement apparatus 10 may have a circuit that generates a synchronizing signal. For example, the measurement apparatus 10 may have a circuit that generates the synchronizing signal using an oscillator circuit. Additionally, the measurement apparatus 10 may have a circuit that generates the synchronizing signal based on the signal under measurement. For example, the measurement apparatus 10 may have a clock recovering circuit that reproduces a clock synchronized with the signal under measurement using a PLL circuit or the like.

Additionally, as shown in FIG. 47, the variable delay circuit 617 delays the synchronizing signal such that the phase for each edge of the synchronizing signal is placed at the substantial center of each bit time interval of the signal under measurement. That is, the flip flop 616 samples the logic value of the signal under measurement at the substantial center of the eye opening of the signal under measurement.

The logic comparing section 614 judges whether the logic value of the signal under measurement detected by the level comparing section 520 corresponds to the logic value obtained by inverting the logic value of the signal under measurement detected by the expected value generating section 612 in the preceding cycle. That is, the logic comparing section 614 samples the state of the signal under measurement, i.e. a state indicating whether the logic value corresponds to the expected value, using the logic value of the signal under measurement detected by the expected value generating section 612 in the preceding cycle as the expected value.

As described above, the expected value generating section 612 samples the logic value of the signal under measurement at substantially the center of the eye opening of the signal under measurement. Therefore, even if relatively large jitter is injected into the signal under measurement, an appropriate logic value of the signal under measurement in the cycle can be accurately detected. Since the signal under measurement is a clock signal in which the logic values are inverted for each cycle, the expected value generating section 612 inverts the logic value detected in the cycle, so that the inverted value can be used as the expected value for the next cycle as shown in FIG. 41.

The logic comparing section 614 may invert the input from the expected value generating section 612 and receives the thus inverted input. As shown in FIG. 46, the exclusive OR of the output by the expected value generating section 612 and the output by the level comparing section 520 may be inverted and output. In this way, the state of the signal under measurement can be measured with a simple configuration.

FIG. 48 shows an example of the spectrum of the signal under measurement measured using the measurement apparatus 10 including the code control section 610 shown in FIG. 43. FIG. 48 shows spectrums measured when changing the period difference Δ between the signal under measurement and the strobe to be 1, 2, 4, and 8 times its original value. The horizontal axis of FIG. 48 indicates an offset frequency from the carrier frequency. That is, the spectrum of FIG. 48 indicates the spectrum of the jitter component.

Using the measurement apparatus 10 for measuring the bit error rate also enables jitter in the signal under measurement to be measured as shown in FIG. 48. As described with reference to FIGS. 31 and 32, if the period difference between the signal under measurement and the strobe is increased, the measurement resolution is increased, so that the measurement error is increased. If the period difference is 8 times its original value, no jitter component is detected in the present embodiment. Therefore, it is preferred that the period difference be further reduced.

FIG. 49 shows another exemplary operation of the test apparatus 100 when the measurement apparatus 10 including the code control section 610 shown in FIG. 43 is used. The strobe timing generator 30 according to the present embodiment generates a strobe at a period 2T+Δ in relation to the bit time interval T of the signal under measurement. For example, when the signal under measurement is a clock signal, the period of the signal under measurement is 2T. At this time, the strobe timing generator 30 generates the strobe at the period obtained by adding the predetermined period resolution Δ to the period of the signal under measurement.

Figure 49A:
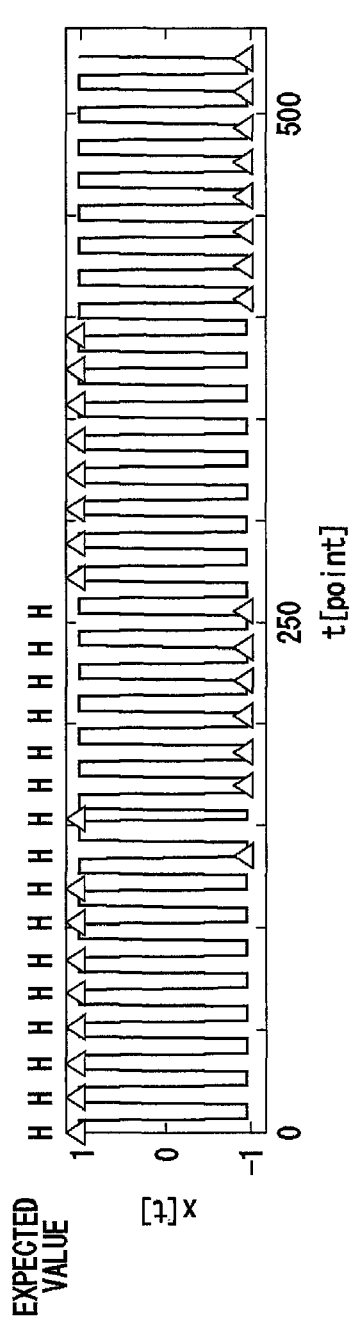
FIG. 49A shows the expected value obtained with another exemplary operation of the test apparatus 100 when the measurement apparatus 10 including the code control section 610 shown in FIG. 43 is used.
Figure 49B:
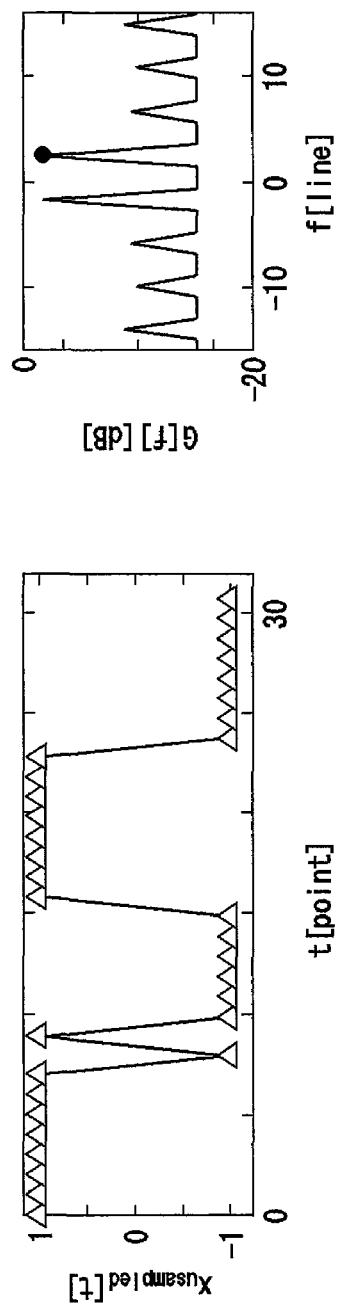
FIG. 49B shows the comparison result series obtained with another exemplary operation of the test apparatus 100 when the measurement apparatus 10 including the code control section 610 shown in FIG. 43 is used.

The expected value generating section 612 of the present embodiment may generate an expected value fixed at a predetermined logic value. As shown in FIG. 49A, the expected value generating section 612 may generate the expected value fixed at the logic value H, for example. By such a process, the comparison result series can be obtained as shown in FIG. 49B.

Here, the above described period (2T+Δ) is twice as large as the bit time interval (T+Δ) described with reference to FIG. 45. In this case, the process to invert the expected values for each bit time interval, i.e. inverting the values one by one, is performed twice for the period (2T+Δ). Therefore, in the case that the signal under measurement is sampled at the period (2T+Δ) as shown in FIG. 49, the process that does not invert the expected values is equivalent to the process to invert the expected values described with reference to FIG. 45.

That is, when the signal under measurement is sampled at period ((2m−1)T+Δ), the above-described inverting is performed an odd number of times, i.e. (2m−1) times, for each piece of sampling data, so that the process to invert the expected values one by one is equivalent to the process to invert the expected values described with reference to FIG. 45, where m is an integer greater than or equal to 1. Additionally, when the signal under measurement is sampled at the period (2mT+Δ), the above-described inverting is performed an even number of times, so that the process that does not invert the expected values is equivalent to the process to invert the expected value described with reference to FIG. 45.

The process to invert the data values or the logic values of the sampled signal under measurement for each bit time interval described with reference to FIG. 41 has the same characteristics as the process described above. That is, when the signal under measurement is sampled at the period ((2m−1)T+Δ), the above described inverting is performed on each piece of sampling data an odd number of times, so that the process to invert the data values or the logic values one by one is equivalent to the process to invert the data values or the logic values described with reference to FIG. 41, where m is integer greater than or equal to 1. Additionally, when the signal under measurement is sampled at the period (2mT+Δ), the above-described inverting is performed for each piece of sampling data an even number of times, so that the process that does not invert the data values or the logic values is equivalent to the process to invert the data values or the logic values described with reference to FIG. 41.

Figure 50:
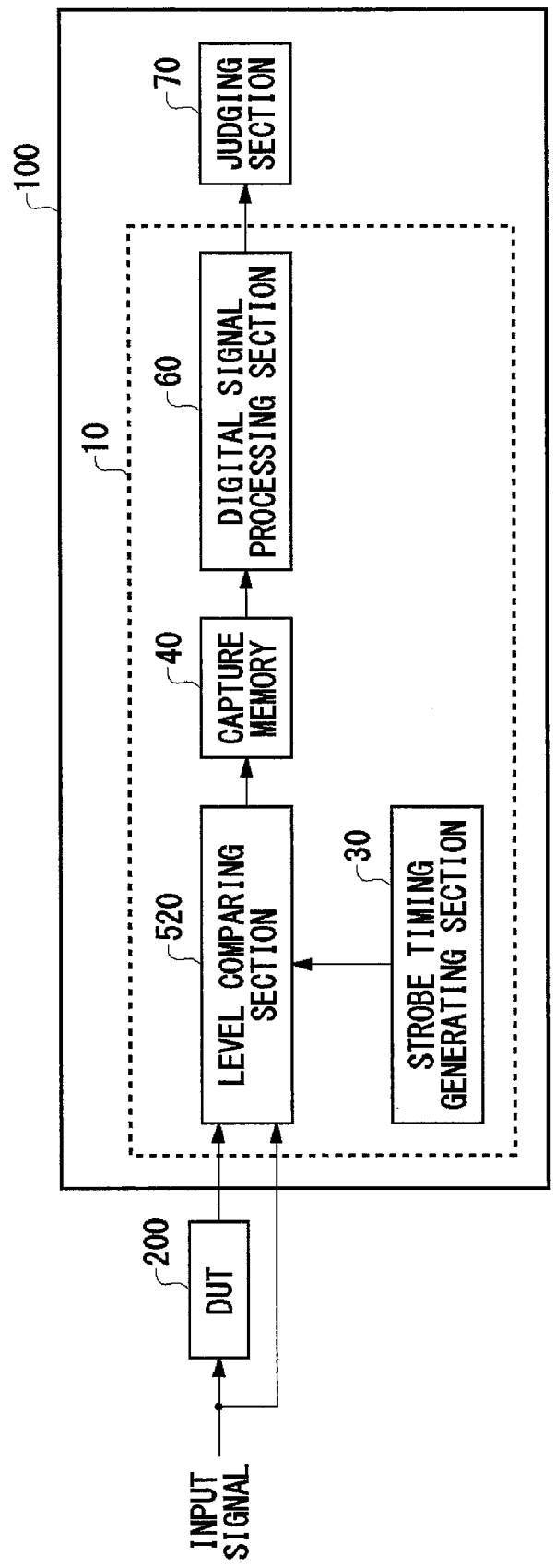
FIG. 50 shows another exemplary measurement apparatus 10.

FIG. 50 shows another exemplary measurement apparatus 10. The measurement apparatus 10 according to the present embodiment further includes a function to measure the gain of the jitter transfer function between the input and the output of the device under test 200, in addition to the components of the measurement apparatus 10 described with reference to FIGS. 39-49.

The level comparing section 520 according to the present embodiment measures a signal input to the device under test 200 and a signal corresponding to the input signal output from the device under test 200. The level comparing section 520 may measure the input signal and the output signal at substantially the same time.

The strobe timing generator 30, the capture memory 40, and the digital signal processing section 60 may have the function and the configuration identical to the components having the same reference numerals in FIGS. 39 to 39. Here, the capture memory 40 according to the present embodiment stores therein the data sequence of the input signal and the data sequence of the output signal.

Additionally, the digital signal processing section 60 calculates the jitter for each of the input signal and the output signal based on their respective data sequences. The gain of the jitter transfer function between the input signal and the output signal of the device under test 200 can be calculated based on the ratio between the jitter value of the input signal and the jitter value of the output signal.

The digital signal processing section 60 may be further provided with a gain calculating section and a BER calculating section. When the gain calculating section is provided, the jitter calculating section calculates the jitter for the data sequences in both the output signal and the input signal of the device under test 200.

The gain calculating section calculates the jitter gain of the device under test 200 based on the jitter in the input signal and jitter in the output signal calculated by the jitter calculating section. For example, the gain calculating section may calculate the jitter gain of the device under test 200 based on the jitter ratio between the input signal and the output signal. Additionally, the gain calculating section may calculate the jitter gain for each frequency component of sine wave jitter.

The BER calculating section calculates the bit error rate of the device under test 200 based on the jitter gain calculated by the gain calculating section. The magnitude of the jitter appearing in the output signal when a predetermined input signal is input to the device under test 200 is derived from the gain of the jitter transfer function, so that the bit error rate can be estimated. For example, the probability density function of the jitter amplitude of the input signal, and also jitter amplitude allowed by the receiving side of the output signal, may be provided to the BER calculating section. The BER calculating section may derive the probability density function of jitter in the output signal from the probability density function and the jitter gain of jitter in the input signal. Then, the BFR calculating section can calculate the bit error rate of the output signal by calculating the probability that jitter amplitude which is not allowed by the receiving side is contained in the output signal.

Figure 51:
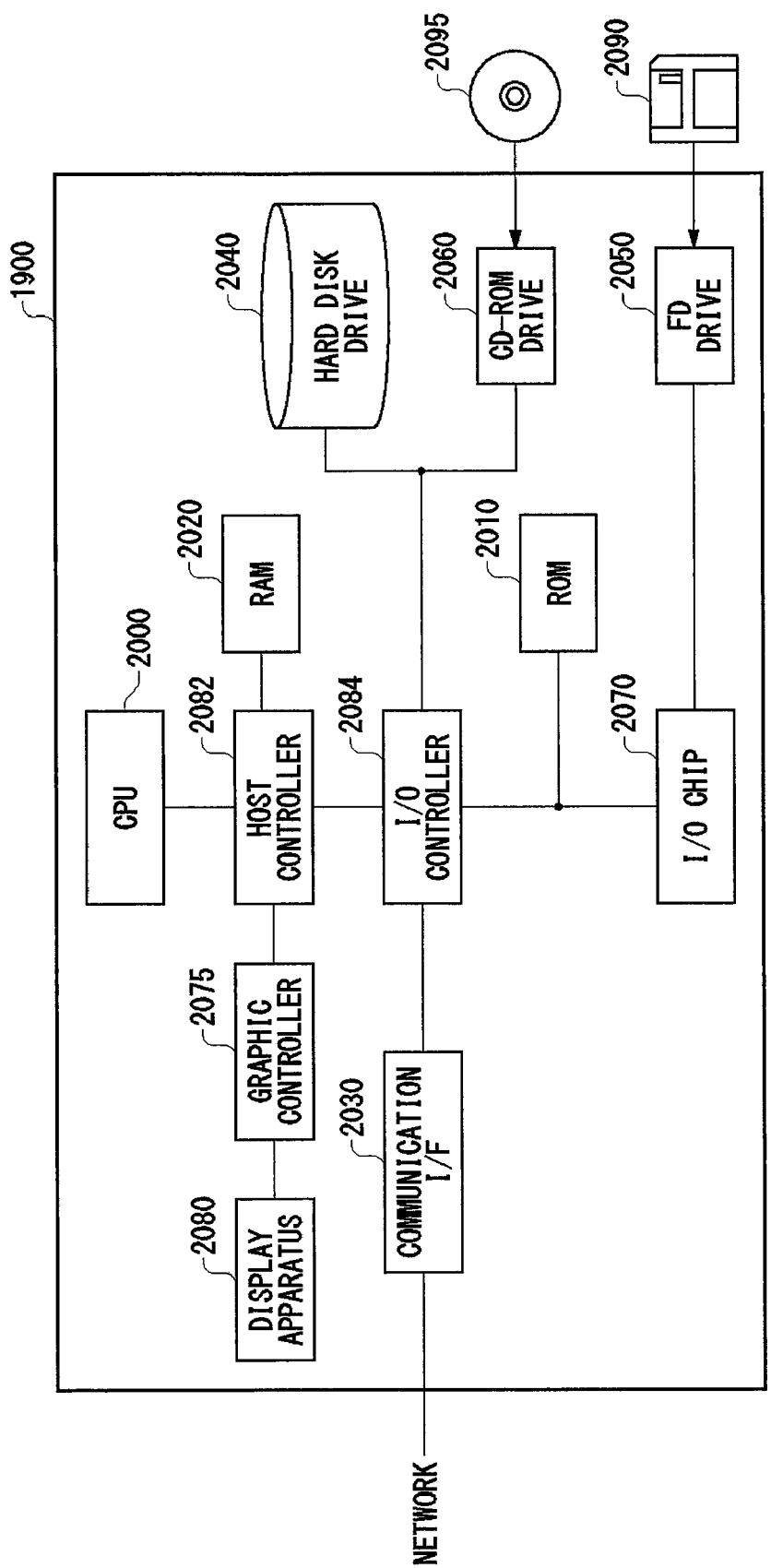
FIG. 51 shows an example of a hardware configuration of a computing apparatus 1900 according to the present embodiment.

FIG. 51 shows an example of a hardware configuration of a computing apparatus 1900 according to the present embodiment. The computing apparatus 1900 may be a computer or an electronic calculating device. The computing apparatus 1900 functions as an element of at least a portion of the measurement apparatus 10 described in FIGS. 1 to 50, based on the programs supplied thereto. For example, the computing apparatus 1900 functions as the digital signal converting section 50 and the digital signal processing section 60 described in FIGS. 1 to 50. The computing apparatus 1900 may further function as the capture memory 40, the judging section 70, or the code control section 610.

The computing apparatus 1900 according to the present embodiment is provided with a CPU peripheral including a CPU 2000, a RAM 2020, a graphic controller 2075, and a display apparatus 2080, all of which are connected to each other by a host controller 2082; an input/output section including a communication interface 2030, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the display apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, the hard disk drive 2040, and the CD-ROM drive 2060 to the host controller 2082. The communication interface 2030 communicates with other apparatuses via a network. The hard disk drive 2040 stores the programs and data used by the CPU 2000 housed in the computing apparatus 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computing apparatus 1900 starts up, a program relying on the hardware of the computing apparatus 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to each of the input/output apparatuses via, for example, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computing apparatus 1900 via the RAM 2020, and performed by the CPU 2000.

The programs installed in the computing apparatus 1900. These programs are executed by the CPU 2000 to cause the computing apparatus 1900 to function as the digital signal converting section 50, the digital signal processing section 60, the capture memory 40, the judging section 70, the code control section 610, and the like.

For example, the programs cause the CPU 2000 to digital signal converting section 50 and the digital signal processing section 60. For example, the programs include instruction groups that cause the CPU 2000 to perform the data processing to be carried out by the digital signal converting section 50 and the digital signal processing section 60 described in FIGS. 1 to 50.

The programs may cause the RAM 2020 to function as the capture memory 40. For example, the programs acquire data from the measurement apparatus 10 via the communication interface 2030 and store the data in the RAM 2020. The programs may include an instruction group causing the computing apparatus 1900 to perform the operations, and the CPU 2000 may control the computing apparatus 1900 according to the instruction group to cause the RAM 2020 to function as the capture memory 40.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computing apparatus 1900 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention. The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

For example, in the embodiment in which the strobe timing generator 30 sequentially generates the strobes at equivalent time intervals greater than the bit time intervals, the strobe timing generator 30 may instead sequentially generate strobes at equivalent time intervals less than the bit time intervals. In this case, a data sequence made up of data with equivalent intervals greater than the bit time intervals can be generated by thinning the sampled data or comparison results between the data and the expected values in the digital signal processing section 60. In this way, a process can be performed that is the same as the process described in the embodiment.

As made clear from the above, by using an embodiment of the present invention, jitter of a signal under measurement, which is measured by non-coherent sampling, can be measured at a low cost. Furthermore, during coherent sampling, a reference signal is usually supplied to the device under test, which then outputs a logic sequence coherent with the reference signal. Therefore, the waveform quality of the logic sequence or signal output by the device under test is limited to the waveform quality with which the test apparatus can generate the reference signal, so that the performance limits of the device under test cannot be tested. But since the measurement apparatus 10 described above performs non-coherent sampling, the reference signal can be supplied to the device under test from an external oscillator. Accordingly, a reference signal with a high-quality waveform can be used, so that the functional limit of the device under test can be tested.

Since the timing noise is measured separately from the amplitude noise, the timing noise can be accurately measured. This also enables measurement of jitter in data or a clock signal having a frequency higher than a maximum frequency of the strobe generated by the strobe timing generator.

In particular, the most suitable period for the strobe, i.e. the most suitable period resolution, can be determined from a value equal to double the standard deviation of the jitter of the signal under measurement. Therefore, the jitter of the signal under measurement can be accurately measured without using a signal with a period matching the period of the signal under measurement to a degree of error less than $\frac{1}{1000}$.

The jitter can be measured without limiting the type of edge used to measure the jitter. The jitter can be tested using available hardware configurations for the test apparatus. That is, the jitter can be measured by comparing sampled values to an expected value, without performing pattern matching.

Furthermore, the jitter of the signal under measurement can be accurately measured without performing a calibration to conform the measurement value to the jitter. The jitter of the signal under measurement can also be accurately measured without adjusting the offset time of the sampling timing.

What is claimed is:

1. A measurement apparatus that measures a signal under measurement, comprising:
    a strobe timing generator that sequentially generates strobes arranged at substantially even time intervals;
    a level comparing section that detects a signal level of the signal under measurement at a timing of each sequentially provided strobe;
    a capture memory that stores therein a data sequence of the signal levels sequentially detected by the level comparing section;
    a frequency domain converting section that converts the data sequence into a spectrum in the frequency domain; and
    a jitter calculating section that calculates jitter of the signal under measurement based on a value obtained by integrating a level of a frequency component in a predetermined frequency range of the spectrum.

2. The measurement apparatus according to claim 1, wherein
    the jitter calculating section integrates the spectrum after dividing a level of the spectrum by a level of a carrier frequency of the signal under measurement.

3. The measurement apparatus according to claim 1, wherein
    the jitter calculating section integrates the spectrum after smoothing a waveform of the spectrum.

4. The measurement apparatus according to claim 1, further comprising a code control section that alternately inverts data values of the data sequence stored in the capture memory, in relation to an intermediate level of the signal under measurement, wherein the frequency domain converting section converts the data sequence having the data values alternately inverted by the code control section into the spectrum in the frequency domain.

5. The measurement apparatus according to claim 1, wherein, the level comparing section detects a logic value of the signal under measurement as the signal level of the signal under measurement, the measurement apparatus further comprises a code control section that alternately inverts logic values of the data sequence stored in the capture memory, and the frequency domain converting section converts the data sequence having the logic values alternately inverted by the code control section into the spectrum in the frequency domain.

6. The measurement apparatus according to claim 1, wherein the strobe timing generator sequentially outputs the strobes at substantially equal time intervals, such that a difference between a period of each strobe and a period of the signal under measurement is equal to a value corresponding to a standard deviation of a probability density distribution of the jitter included in the signal under measurement.

7. A test apparatus that tests a device under test, comprising:

the measurement apparatus according to claim 1 that measures a signal under measurement output by the device under test; and a judging section that judges pass/fail of the device under test based on a measurement result of the measurement apparatus.

8. An electronic device that outputs a signal under measurement, comprising:

an electronic device that generates the signal under measurement; and the measurement apparatus according to claim 1 that measures the signal under measurement.

9. A measurement apparatus that measures a signal under measurement, comprising:

a strobe timing generator that sequentially generates strobes arranged at substantially even time intervals;

a level comparing section that detects a signal level of the signal under measurement at a timing of each sequentially provided strobe;

a logic comparing section that outputs a data sequence of comparison results indicating whether each signal level detected by the level comparing section matches an expected value;

a capture memory that stores therein the data sequence output by the logic comparing section;

a frequency domain converting section that converts the data sequence into a spectrum in the frequency domain; and a jitter calculating section that calculates jitter of the signal under measurement based on a value obtained by integrating a level of a frequency component in a predetermined frequency range of the spectrum.

10. The measurement apparatus according to claim 9, wherein the logic comparing section compares the signal level detected by the level comparing section in accordance with the timing of each strobe to the expected value that is alternately inverted in accordance with the timing of each strobe.

11. A test apparatus that tests a device under test, comprising:

the measurement apparatus according to claim 9 that measures a signal under measurement output by the device under test; and a judging section that judges pass/fail of the device under test based on a measurement result of the measurement apparatus.

12. An electronic device that outputs a signal under measurement, comprising:

an electronic device that generates the signal under measurement; and the measurement apparatus according to claim 9 that measures the signal under measurement.

13. A measurement apparatus that measures a signal under measurement, comprising:

a strobe timing generator that sequentially generates strobes arranged at substantially even time intervals;

a level comparing section that detects a signal level of the signal under measurement at a timing at which each strobe is sequentially provided;

a capture memory that sequentially stores therein the signal levels sequentially detected by the level comparing section;

a logic comparing section that outputs a data sequence of comparison results indicating whether each signal level stored in the capture memory matches an expected value;

a frequency domain converting section that converts the data sequence into a spectrum in the frequency domain; and a jitter calculating section that calculates jitter of the signal under measurement based on a value obtained by integrating a level of a frequency component in a predetermined frequency range of the spectrum.

14. A test apparatus that tests a device under test, comprising:

the measurement apparatus according to claim 13 that measures a signal under measurement output by the device under test; and a judging section that judges pass/fail of the device under test based on a measurement result of the measurement apparatus.

15. An electronic device that outputs a signal under measurement, comprising:

an electronic device that generates the signal under measurement; and the measurement apparatus according to claim 13 that measures the signal under measurement.

16. A non-transitory recording medium storing thereon a program for enabling a computer executing the program to function as a measurement apparatus comprising:

a strobe timing generator that sequentially generates strobes arranged at substantially even time intervals;

a level comparing section that detects a signal level of a signal under measurement at a timing of each sequentially provided strobe;

a capture memory that stores therein a data sequence of the signal levels sequentially detected by the level comparing section;

a frequency domain converting section that converts the data sequence into a spectrum in the frequency domain; and a jitter calculating section that calculates jitter of the signal under measurement based on a value obtained by integrating a level of a frequency component in a predetermined frequency range of the spectrum.

17. A non-transitory recording medium storing thereon a program for enabling a computer executing the program to function as a measurement apparatus comprising:

a strobe timing generator that sequentially generates strobes arranged at substantially even time intervals;

a level comparing section that detects a signal level of a signal under measurement at a timing of each sequentially provided strobe;

a logic comparing section that outputs a data sequence of comparison results indicating whether each signal level detected by the level comparing section matches an expected value;

a capture memory that stores therein the data sequence output by the logic comparing section;

a frequency domain converting section that converts the data sequence into a spectrum in the frequency domain; and a jitter calculating section that calculates jitter of the signal under measurement based on a value obtained by integrating a level of a frequency component in a predetermined frequency range of the spectrum.

18. A non-transitory recording medium storing thereon a program for enabling a computer executing the program to function as a measurement apparatus comprising:

a strobe timing generator that sequentially generates strobes arranged at substantially even time intervals;

a level comparing section that detects a signal level of a signal under measurement at a timing at which each strobe is sequentially provided;

a capture memory that sequentially stores therein the signal levels sequentially detected by the level comparing section;

a logic comparing section that outputs a data sequence of comparison results indicating whether each signal level stored in the capture memory matches an expected value;

a frequency domain converting section that converts the data sequence into a spectrum in the frequency domain; and a jitter calculating section that calculates jitter of the signal under measurement based on a value obtained by integrating a level of a frequency component in a predetermined frequency range of the spectrum.

* * * * *